United States Patent
Yamazaki et al.

(10) Patent No.: US 8,242,496 B2
(45) Date of Patent: Aug. 14, 2012

(54) SEMICONDUCTOR DEVICE AND METHOD FOR MANUFACTURING THE SAME

(75) Inventors: Shunpei Yamazaki, Setagaya (JP); Junichiro Sakata, Atsugi (JP); Hiroyuki Miyake, Atsugi (JP); Hideaki Kuwabara, Isehara (JP); Ikuko Kawamata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 178 days.

(21) Appl. No.: 12/835,117

(22) Filed: Jul. 13, 2010

(65) Prior Publication Data

US 2011/0012105 A1  Jan. 20, 2011

(30) Foreign Application Priority Data

Jul. 17, 2009  (JP) .................................. 2009-169594

(51) Int. Cl.
 *H01L 29/786* (2006.01)
(52) U.S. Cl. ..................... 257/43; 257/59; 257/E29.296; 257/E21.476; 438/104
(58) Field of Classification Search ............... 257/43, 257/59, E29.296, E21.476; 438/104
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |

(Continued)

FOREIGN PATENT DOCUMENTS

EP  1737044 A  12/2006

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Trung Q Dang
(74) *Attorney, Agent, or Firm* — Eric J. Robinson; Robinson Intellectual Property Law Office, P.C.

(57) ABSTRACT

An object is to increase an aperture ratio of a semiconductor device. The semiconductor device includes a driver circuit portion and a display portion (also referred to as a pixel portion) over one substrate. The driver circuit portion includes a channel-etched thin film transistor for a driver circuit, in which a source electrode and a drain electrode are formed using metal and a channel layer is formed of an oxide semiconductor, and a driver circuit wiring formed using metal. The display portion includes a channel protection thin film transistor for a pixel, in which a source electrode layer and a drain electrode layer are formed using an oxide conductor and a semiconductor layer is formed of an oxide semiconductor, and a display portion wiring formed using an oxide conductor.

44 Claims, 40 Drawing Sheets

U.S. PATENT DOCUMENTS

| | | | |
|---|---|---|---|
| 7,297,977 | B2 | 11/2007 | Hoffman et al. |
| 7,298,084 | B2 | 11/2007 | Baude et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,719,185 | B2 | 5/2010 | Jin et al. |
| 7,732,819 | B2 | 6/2010 | Akimoto et al. |
| 7,745,798 | B2 | 6/2010 | Takahashi |
| 7,791,082 | B2 * | 9/2010 | Iwasaki ............... 257/79 |
| 7,910,932 | B2 * | 3/2011 | Marks et al. ........... 257/72 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0057261 | A1 | 3/2007 | Jeong et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0291350 | A1 | 11/2008 | Hayashi et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0189155 | A1 | 7/2009 | Akimoto |
| 2009/0189156 | A1 | 7/2009 | Akimoto |
| 2009/0212291 | A1 * | 8/2009 | Ikeda ............................ 257/59 |
| 2009/0278122 | A1 | 11/2009 | Hosono et al. |
| 2009/0280600 | A1 | 11/2009 | Hosono et al. |
| 2009/0283762 | A1 | 11/2009 | Kimura |
| 2010/0044701 | A1 | 2/2010 | Sano et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0003429 | A1 * | 1/2011 | Oikawa et al. ............. 438/104 |
| 2011/0006302 | A1 * | 1/2011 | Yamazaki et al. ............. 257/43 |
| 2011/0254009 | A1 * | 10/2011 | Ohtani et al. ................ 257/59 |

FOREIGN PATENT DOCUMENTS

| | | |
|---|---|---|
| EP | 1995787 | 11/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2008-235871 | 10/2008 |
| JP | 2009-049143 | 3/2009 |
| JP | 2009-265271 | 11/2009 |
| JP | 2010-098280 | 4/2010 |
| WO | WO 2004/114391 | 12/2004 |
| WO | WO-2008/105347 | 9/2008 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-823.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Li et al., "Modulated Structures of Homologous Compounds $InMo_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada et al., "Development of Driver-Integrated Panel using Amorphous In—Ga—Zn—Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In—Ga—Zn—Oxide TFTs," IDW '09: Proceedings of the $16^{th}$ International Display Workshops, 2009, pp. 689-692.

International Search Report (Application No. PCT/JP2010/061222) Dated Aug. 10, 2010.

Written Opinion (Application No. PCT/JP2010/061222) Dated Aug. 10, 2010.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Transparent Circuit, Nikkei Electronics, Aug. 27, 2007, No. 959, pp. 39-52.

* cited by examiner

FIG. 1A1
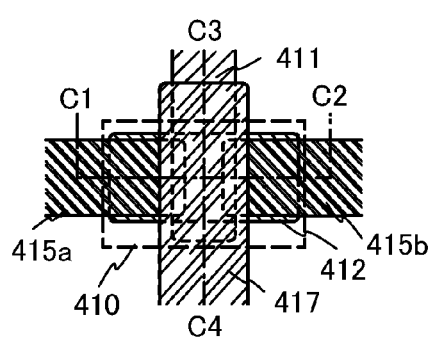
FIG. 1A2
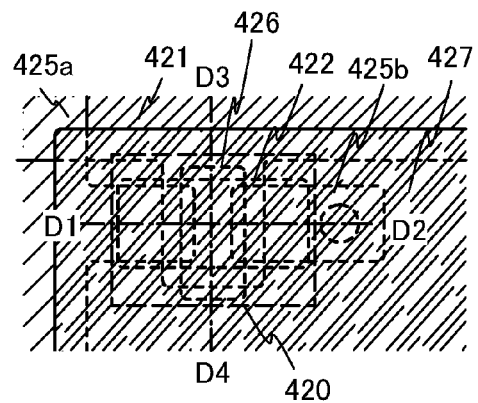
FIG. 1B
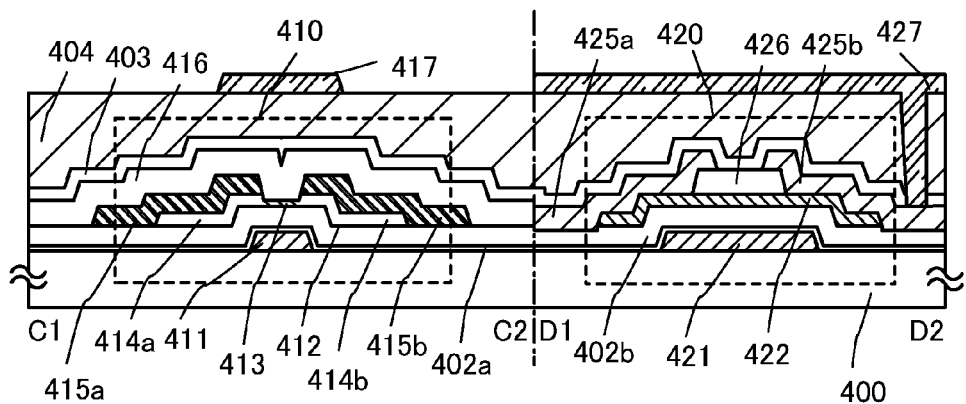
FIG. 1C
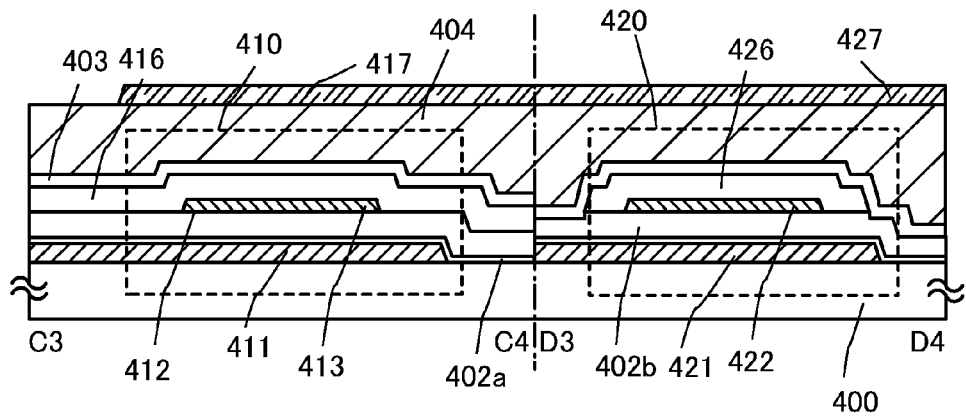

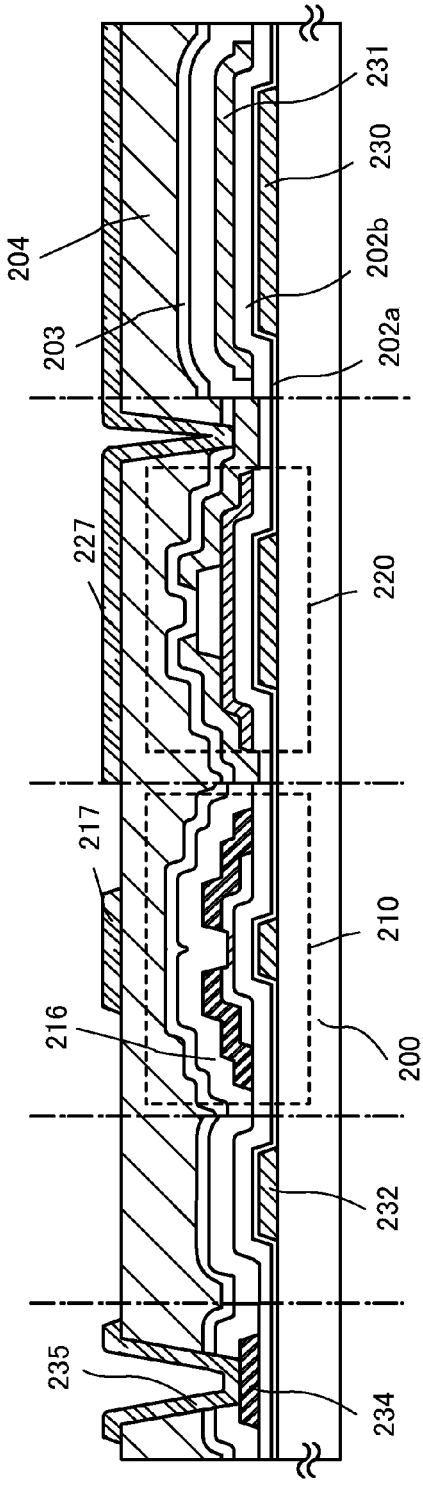

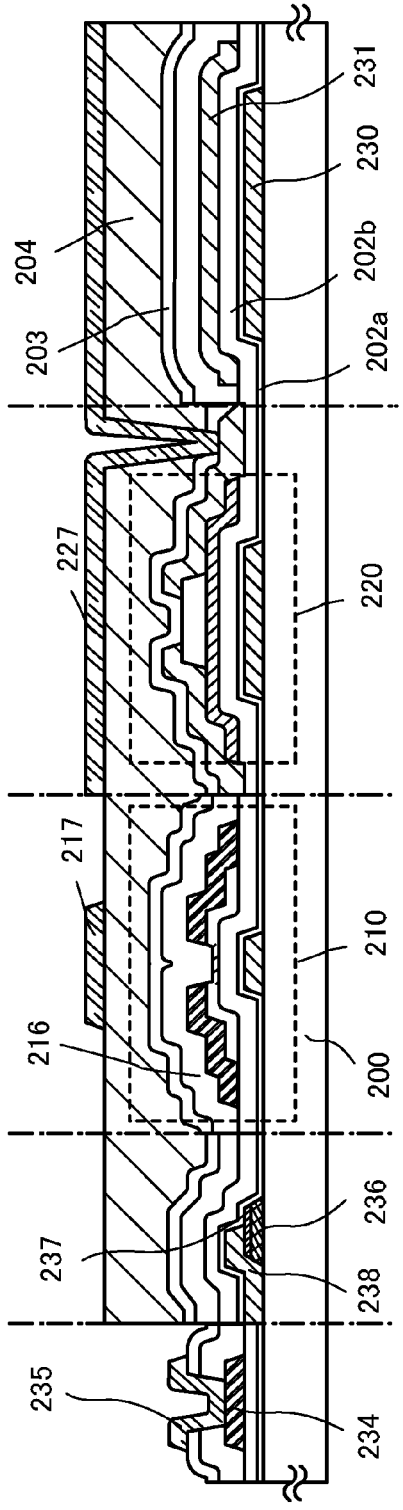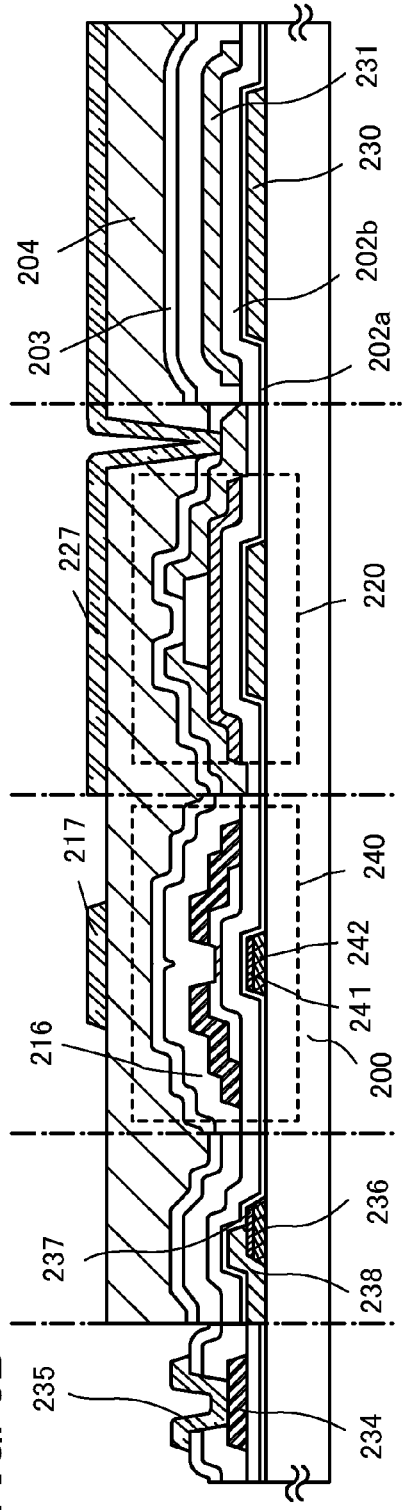

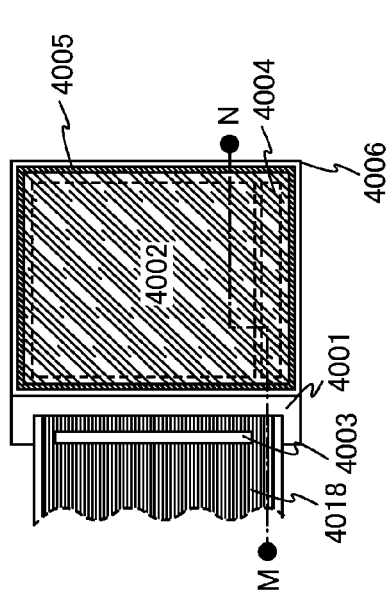
FIG. 10A1
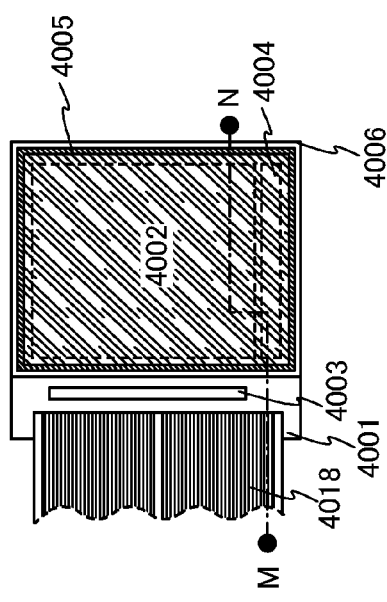
FIG. 10A2
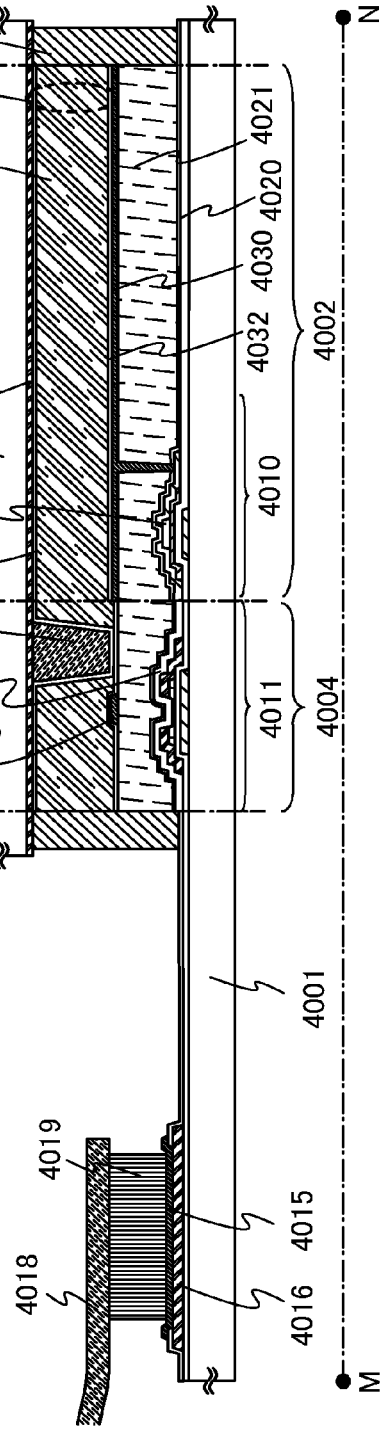
FIG. 10B

SEMICONDUCTOR DEVICE AND METHOD FOR MANUFACTURING THE SAME

TECHNICAL FIELD

The present invention relates to a semiconductor device including an oxide semiconductor and a method for manufacturing the same.

Note that in this specification, a semiconductor device refers to all devices that can function by utilizing semiconductor properties, and electro-optic devices such as display devices, semiconductor circuits, and electronic devices are all semiconductor devices.

BACKGROUND ART

A light-transmitting metal oxide is used in a semiconductor device. For example, a conductive metal oxide (hereinafter referred to as an oxide conductor) such as indium tin oxide (ITO) is used as a transparent electrode material needed in a display device such as a liquid crystal display.

In addition, light-transmitting metal oxide has been attracting attention as a material having semiconductor properties. For example, an In—Ga—Zn—O-based oxide and the like are expected to be used as a semiconductor material needed in a display device such as a liquid crystal display. In particular, they are expected to be used for a channel layer of a thin film transistor (hereinafter also referred to as a TFT).

A TFT which includes a metal oxide having semiconductor properties (hereinafter referred to as an oxide semiconductor) can be formed through a low-temperature process. Thus, expectations for the oxide semiconductor as a material which replace or surpass amorphous silicon used in a display device and the like have been increased.

Further, both the oxide conductor and the oxide semiconductor have light-transmitting properties. Thus, when a TFT is manufactured using the oxide conductor and the oxide semiconductor, the TFT can have light-transmitting properties (for example, see Non-Patent Document 1).

Further, the TFT in which the oxide semiconductor is used has high field effect mobility. Thus, a driver circuit in a display device or the like can be formed using the TFT (for example, see Non-Patent Document 2).

[Reference]

Non-Patent Document 1: T. Nozawa. "Transparent Circuitry", *Nikkei Electronics* No. 959, Aug. 27, 2007, pp. 39-52.

Non-Patent Document 2: T. Osada et al., "Development of Driver-Integrated Panel using Amorphous In—Ga—Zn—Oxide TFT", *Proc. SID '09 Digest,* 2009, pp. 184-187.

DISCLOSURE OF INVENTION

An object of one embodiment of the present invention is to reduce manufacturing costs of a semiconductor device.

An object of one embodiment of the present invention is to increase an aperture ratio of a semiconductor device.

An object of one embodiment of the present invention is to increase the resolution of an image displayed on a display portion of a semiconductor device.

An object of one embodiment of the present invention is to provide a semiconductor device capable of high-speed operation.

One embodiment of the present invention is a semiconductor device including a driver circuit portion and a display portion (also referred to as a pixel portion) over one substrate. The driver circuit portion includes a driver circuit thin film transistor and a driver circuit wiring. A source electrode (also referred to as a source electrode layer) and a drain electrode (also referred to as a drain electrode layer) of the driver circuit thin film transistor are formed using metal, and a channel layer of the driver circuit thin film transistor is formed using an oxide semiconductor. The driver circuit wiring is formed using metal. The display portion includes a pixel thin film transistor and a display portion wiring. A source electrode layer and a drain electrode layer of the pixel thin film transistor are formed using an oxide conductor, and a semiconductor layer of the pixel thin film transistor is formed using an oxide semiconductor. The display portion wiring is formed using an oxide conductor.

An inverted staggered thin film transistor having a bottom-gate structure is used as each of the pixel thin film transistor and the driver circuit thin film transistor. The pixel thin film transistor is a channel protection (channel stop) thin film transistor in which a channel protection layer is formed over a channel formation region in the semiconductor layer. In contrast, the driver circuit thin film transistor is a channel-etched thin film transistor in which an oxide insulating film which is in contact with part of a semiconductor layer, which is exposed between a source electrode layer and a drain electrode layer.

Note that a specific manufacturing process of a TFT, a specific structure of another element (e.g., capacitor) included in a semiconductor device, and the like are not disclosed in Non-Patent Document 1. In addition, there is no description on manufacture in which a driver circuit and a light-transmitting TFT are formed over one substrate.

In a semiconductor device according to one embodiment of the present invention, a driver circuit portion including a driver circuit TFT and a display portion including a pixel TFT are formed over one substrate. Thus, the manufacturing costs of the semiconductor device can be reduced.

In a semiconductor device according to one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. In other words, in the semiconductor device, a region where the pixel TFT and the display portion wiring are formed can be an opening. Thus, the aperture ratio of the semiconductor device can be increased.

In a semiconductor device according to one embodiment of the present invention, a display portion includes a pixel TFT and a display portion wiring. A source electrode and a drain electrode of the pixel TFT are formed using an oxide conductor, and a semiconductor layer of the pixel TFT is formed using an oxide semiconductor. The display portion wiring is formed using an oxide conductor. In other words, in the semiconductor device, the pixel size can be determined without limitation by the size of the pixel TFT. Thus, the resolution of an image displayed on the display portion of the semiconductor device can be increased.

In a semiconductor device according to one embodiment of the present invention, a driver circuit portion includes a driver circuit TFT and a driver circuit wiring. A source electrode and a drain electrode of the driver circuit TFT are formed using metal, and a channel layer of the driver circuit TFT is formed using an oxide semiconductor. The driver circuit wiring is formed using metal. In other words, in the semiconductor device, a driver circuit includes the TFT having high field effect mobility and the wiring having low resistance. Thus, the semiconductor device is capable of high-speed operation.

As an oxide semiconductor used in this specification, a thin film of a material expressed by In/MO$_3$(ZnO)$_m$ (m>0) is formed, and a thin film transistor including the thin film as an oxide semiconductor layer is manufactured. Note that M denotes one or more metal elements selected from Ga, Fe, Ni, Mn, and Co. For example, M might be Ga or might be Ga and the above metal element other than Ga, for example, M might be Ga and Ni or Ga and Fe. Further, in the oxide semiconductor, in some cases, a transition metal element such as Fe or Ni or an oxide of the transition metal is contained as an impurity element in addition to the metal element contained as M. In this specification, among oxide semiconductor layers whose composition formulae are expressed by InMO$_3$(ZnO)m (m>0), an oxide semiconductor which contains Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides can be used in addition to the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be contained in the oxide semiconductor layer formed using the above metal oxide.

In the case where heat treatment is performed in an atmosphere of an inert gas such as nitrogen or a rare gas (e.g., argon or helium) or under reduced pressure, an oxide semiconductor layer is changed into an oxygen-deficient oxide semiconductor layer by the heat treatment to be a low-resistance oxide semiconductor layer, i.e., an n-type (e.g., n$^-$-type) oxide semiconductor layer. Then, the oxide semiconductor layer is made to be in an oxygen excess state by the formation of an oxide insulating film which is to be in contact with the oxide semiconductor layer. Accordingly, part of the oxide semiconductor layer is changed into a high-resistance oxide semiconductor layer, i.e., an i-type oxide semiconductor layer. Thus, it is possible to manufacture and provide a semiconductor device including a highly reliable thin film transistor with favorable electrical characteristics.

For dehydration or dehydrogenation, heat treatment is performed at a temperature which is higher than or equal to 350° C., preferably higher than or equal to 400° C. and lower than the strain point of a substrate in an atmosphere of an inert gas such as nitrogen or a rare gas (e.g., argon or helium) or under reduced pressure, whereby impurities such as water contained in the oxide semiconductor layer can be reduced.

The oxide semiconductor layer is subjected to dehydration or dehydrogenation under such a heat treatment condition that two peaks of water or at least one peak of water at around 300° C. is not detected even if TDS (thermal desorption spectroscopy) is performed at up to 450° C. on the oxide semiconductor layer subjected to the dehydration or dehydrogenation. Thus, even if TDS is performed at up to 450° C. on a thin film transistor including an oxide semiconductor layer subjected to the dehydration or dehydrogenation, at least the peak of water at around 300° C. is not detected.

In addition, it is important, when the temperature is lowered from the heating temperature T at which dehydration or dehydrogenation are performed on the oxide semiconductor layer, to prevent water and hydrogen from being mixed into the oxide semiconductor layer in one furnace, with the oxide semiconductor layer not exposed to the air. When a thin film transistor is formed using an oxide semiconductor layer obtained by changing an oxide semiconductor layer into a low-resistance oxide semiconductor layer, i.e., an n-type (e.g., n$^-$-type) oxide semiconductor layer by dehydration or dehydrogenation and then by changing the low-resistance oxide semiconductor layer into a high-resistance oxide semiconductor layer to be an i-type semiconductor layer, the threshold voltage of the thin film transistor can be a positive voltage, whereby a so-called normally-off switching element can be realized. It is preferable that a channel in a semiconductor device (a display device) be formed with a positive threshold voltage which is as close to 0 V as possible in a thin film transistor. Note that if the threshold voltage of the thin film transistor is negative, the thin film transistor tends to be normally on; in other words, current flows between a source electrode and a drain electrode even when the gate voltage is 0 V. In an active matrix display device, the electrical characteristics of a thin film transistor included in a circuit are important and influence the performance of the display device. Among the electrical characteristics of the thin film transistor, the threshold voltage ($V_{th}$) is particularly important. When the threshold voltage is high or negative even when the field effect mobility is high, it is difficult to control the circuit. In the case where a thin film transistor has a high threshold voltage and a large absolute value of its threshold voltage, the thin film transistor cannot perform a switching function as the TFT and might be a load when the TFT is driven at a low voltage. In the case of an n-channel thin film transistor, it is preferable that a channel be formed and drain current flow only after a positive voltage is applied as a gate voltage. A transistor in which a channel is not formed unless driving voltage is raised and a transistor in which a channel is formed and drain current flows even when a negative voltage is applied are unsuitable as a thin film transistor used in a circuit.

In addition, the gas atmosphere in which the temperature is lowered from the heating temperature T may be switched to a gas atmosphere which is different from the gas atmosphere in which the temperature is raised to the heating temperature T. For example, after dehydration or dehydrogenation are performed in a furnace, cooling is performed with the furnace filled with a high-purity oxygen gas, a high-purity N$_2$O gas, or ultra-dry air (having a dew point of −40° C. or lower, preferably −60° C. or lower), with the oxide semiconductor layer not exposed to the air.

The electrical characteristics of a thin film transistor are improved using an oxide semiconductor film cooled slowly (or cooled) in an atmosphere which does not contain moisture (having a dew point of −40° C. or lower, preferably −60° C. or lower) after water contained in the film is reduced by heat treatment for dehydration or dehydrogenation, and high-performance thin film transistors which can be mass-produced are realized.

In this specification, heat treatment performed in an atmosphere of an inert gas such as nitrogen or a rare gas (e.g., argon or helium) or under reduced pressure is referred to as "heat treatment for dehydration or dehydrogenation". In this specification, "dehydrogenation" does not indicate elimination of only H$_2$ by this heat treatment. For convenience, elimination of H, OH, and the like is referred to as "dehydration or dehydrogenation".

In the case where heat treatment is performed in an atmosphere of an inert gas such as nitrogen or a rare gas (e.g., argon or helium) or under reduced pressure, an oxide semiconductor layer is changed into an oxygen-deficient oxide semiconductor layer by the heat treatment to be a low-resistance oxide semiconductor layer, i.e., an n-type (e.g., n$^-$-type) oxide semiconductor layer. After that, a region overlapping with a drain electrode layer is formed as a high-resistance drain region (also referred to as an HRD region) which is an oxygen-deficient region.

Specifically, the carrier concentration of the high-resistance drain region is higher than or equal to $1\times10^{17}/cm^3$ and is at least higher than the carrier concentration of a channel formation region (lower than $1\times10^{17}/cm^3$). Note that the carrier concentration in this specification is carrier concentration obtained by Hall effect measurement at room temperature.

Then, at least part of the oxide semiconductor layer subjected to dehydration or dehydrogenation is made to be in an oxygen-excess state so as to be a high-resistance oxide semiconductor layer, i.e., an i-type oxide semiconductor layer, whereby a channel formation region is formed. Note that as the treatment for making the part of the oxide semiconductor layer subjected to dehydration or dehydrogenation in an oxygen-excess state, deposition of an oxide insulating film which is to be in contact with the oxide semiconductor layer subjected to dehydration or dehydrogenation by a sputtering method; heat treatment after the deposition of the oxide insulating film; heat treatment in an oxygen atmosphere; or cooling treatment in an oxygen atmosphere or in ultra-dry air (having a dew point of −40° C. or lower, preferably −60° C. or lower) after heat treatment in an inert gas atmosphere; or the like is performed.

Further, in order to make at least part of the oxide semiconductor layer subjected to dehydration or dehydrogenation (a portion overlapping with a gate electrode layer) serve as the channel formation region, the oxide semiconductor layer is selectively made to be in an oxygen-excess state so as to be a high-resistance oxide semiconductor layer, i.e., an i-type oxide semiconductor layer. The channel formation region can be formed in such a manner that a source electrode layer and a drain electrode layer formed using metal electrodes of Ti or the like are formed on and in contact with the oxide semiconductor layer subjected to dehydration or dehydrogenation and an exposed region which does not overlap with the source electrode layer and the drain electrode layer is selectively made to be in an oxygen-excess state. In the case where the exposed region is selectively made to be in an oxygen-excess state, a first high-resistance drain region overlapping with the source electrode layer and a second high-resistance drain region overlapping with the drain electrode layer are formed, and the channel formation region is formed between the first high-resistance drain region and the second high-resistance drain region. In other words, the channel formation region is formed between the source electrode layer and the drain electrode layer in a self-aligned manner.

Thus, it is possible to manufacture and provide a semiconductor device including a highly reliable thin film transistor with favorable electrical characteristics.

Note that by the formation of the high-resistance drain region in part of the oxide semiconductor layer, which overlaps with the drain electrode layer (and the source electrode layer), reliability at the time when a driver circuit is formed can be improved. Specifically, by the formation of the high-resistance drain region, a structure can be obtained in which conductivity can be varied from the drain electrode layer to the channel formation region via the high-resistant drain region. Thus, in the case where operation is performed with the drain electrode layer connected to a wiring for supplying a high power supply potential VDD, the high-resistance drain region serves as a buffer, and thus a high electric field is not applied locally even if the high electric field is applied between the gate electrode layer and the drain electrode layer, which leads to an increase in the withstand voltage of the transistor.

In addition, by the formation of the high-resistance drain region in part of the oxide semiconductor layer, which overlaps with the drain electrode layer (and the source electrode layer), the amount of leakage current in the channel formation region at the time when the driver circuit is formed can be reduced. Specifically, by the formation of the high-resistance drain region, the leakage current of the transistor, which flows between the drain electrode layer and the source electrode layer, flows from the drain electrode layer through the high-resistance drain region on the drain electrode layer side, the channel formation region, and the high-resistance drain region on the source electrode layer side to the source electrode layer. In this case, in the channel formation region, leakage current flowing from a low-resistance N-type region on the drain electrode layer side to the channel formation region can be concentrated in the vicinity of an interface between the channel formation region and a gate insulating layer which has high resistance when the transistor is off. Thus, the amount of leakage current in a back channel portion (part of a surface of the channel formation region, which is apart from the gate electrode layer) can be reduced.

Further, the first high-resistance drain region overlapping with the source electrode layer and the second high-resistance drain region overlapping with the drain electrode layer overlap with part of the gate electrode layer with the gate insulating layer therebetween depending on the width of the gate electrode layer, and the intensity of an electric field in the vicinity of an edge portion of the drain electrode layer can be reduced more effectively.

One embodiment of the present invention disclosed in this specification is a semiconductor device including, over one substrate, a pixel portion including a first thin film transistor and a driver circuit including a second thin film transistor. The first thin film transistor includes a gate electrode layer over a substrate, a gate insulating layer over the gate electrode layer, an oxide semiconductor layer over the gate insulating layer, a first oxide insulating layer which is in contact with part of the oxide semiconductor layer, a source electrode layer and a drain electrode layer over the first oxide insulating layer and the oxide semiconductor layer, and a pixel electrode layer over the first oxide insulating layer. The gate electrode layer, the gate insulating layer, the oxide semiconductor layer, the source electrode layer, the drain electrode layer, the first oxide insulating layer, and the pixel electrode layer of the first thin film transistor have light-transmitting properties. A source electrode layer and a drain electrode layer of the second thin film transistor are covered with a second oxide insulating layer, are formed using a material which is different from that of the source electrode layer and the drain electrode layer of the first thin film transistor, and are conductive materials having lower resistance than the source electrode layer and the drain electrode layer of the first thin film transistor.

One embodiment of the present invention disclosed in this specification is a method for manufacturing a semiconductor device. The method includes the steps of: forming a first gate electrode layer and a second gate electrode layer; forming a gate insulating layer over the first gate electrode layer and the second gate electrode layer; forming, over the gate insulating layer, a first oxide semiconductor layer to overlap with the first gate electrode layer and a second oxide semiconductor layer to overlap with the second gate electrode layer; preventing water and hydrogen from being mixed into the first oxide semiconductor layer and the second oxide semiconductor layer with the first oxide semiconductor layer and the second oxide semiconductor layer not exposed to the air after dehydration or dehydrogenation; forming a second source electrode layer and a second drain electrode layer over the second oxide semiconductor layer; forming a second oxide insulating layer to be in contact with part of the second oxide semiconductor layer and a first oxide insulating layer over a region of the first oxide semiconductor layer, which overlaps with the first gate electrode layer; forming a first source electrode layer and a first drain electrode layer over the first oxide semiconductor layer and the first oxide insulating layer; forming a protection insulating layer over the first oxide insulating layer, the first source electrode layer, the first drain electrode layer, and the second oxide insulating layer; and forming, over the protection insulating layer, a pixel electrode layer to be electrically connected to the first drain electrode layer or the first source electrode layer and a conductive layer to overlap with the second oxide semiconductor layer.

In the above structure, the oxide semiconductor layer of the second thin film transistor may include a region the thickness of which is smaller than that of a region overlapping with the source electrode layer or the drain electrode layer. A structure may be employed in which the oxide semiconductor layer of the second thin film transistor includes a channel formation region the thickness of which is smaller than that of a region overlapping with the source electrode layer or the drain electrode layer and a conductive layer is provided over the channel formation region with the second oxide insulating layer therebetween.

Since the first oxide insulating layer and the second oxide insulating layer can be formed in the same step, they can be formed using the same light-transmitting insulating material.

The source electrode layer and the drain electrode layer of the second thin film transistor are preferably formed using a metal conductive film such as a film containing an element selected from Al, Cr, Cu, Ta, Ti, Mo, and W as its main component or a stacked film formed by an alloy containing the above elements.

In contrast, the source electrode layer, the drain electrode layer, and the pixel electrode layer of the first thin film transistor are preferably formed using a light-transmitting conductive film of indium oxide, an alloy of indium oxide and tin oxide, an alloy of indium oxide and zinc oxide, or zinc oxide.

In the above structure, a capacitor portion may further be provided over the same substrate. The capacitor portion may include a capacitor wiring and a capacitor electrode overlapping with the capacitor wiring. The capacitor wiring and the capacitor electrode may have light-transmitting properties.

A high-resistance drain region in the oxide semiconductor layer of the second thin film transistor, which overlaps with the source electrode layer or the drain electrode layer may be included.

Note that the ordinal numbers such as "first" and "second" in this specification are used for convenience and do not denote the order of steps and the stacking order of layers. In addition, the ordinal numbers in this specification do not denote particular names which specify the present invention.

As a display device including a driver circuit, a light-emitting display device in which a light-emitting element is used and a display device in which an electrophoretic display element is used, which is also referred to as "electronic paper", are given in addition to a liquid crystal display device.

In a light-emitting display device in which a light-emitting element is used, a pixel portion includes a plurality of thin film transistors. The pixel portion includes a region where a gate electrode of one thin film transistor is connected to a source wiring (also referred to as a source wiring layer) or a drain wiring (also referred to as a drain wiring layer) of another thin film transistor. In addition, in a driver circuit of the light-emitting display device in which a light-emitting element is used, there is a region where a gate electrode of a thin film transistor is connected to a source wiring or a drain wiring of the thin film transistor.

A thin film transistor having stable electrical characteristics can be manufactured and provided. Thus, a semiconductor device which includes highly reliable thin film transistors with favorable electrical characteristics can be provided.

BRIEF DESCRIPTION OF DRAWINGS

In the accompanying drawings:

FIGS. 1A1, 1A2, 1B, and 1C are views illustrating a semiconductor device;

FIGS. 7A and 7B are views each illustrating a semiconductor device;

FIGS. 8A and 8B are views each illustrating a semiconductor device;

FIGS. 10A1, 10A2, and 10B are views each illustrating a semiconductor device;

BEST MODE FOR CARRYING OUT THE INVENTION

Figure 2A:
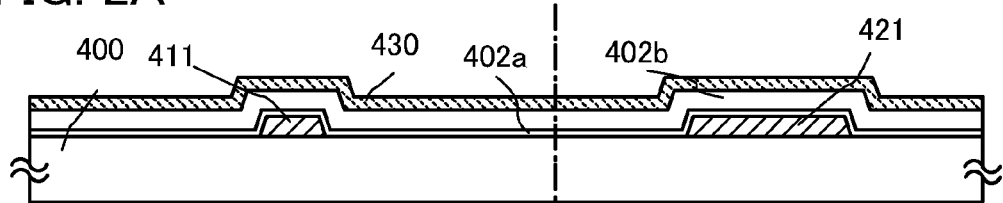
FIGS. 2A to 2E are views illustrating a method for manufacturing a semiconductor device.
Figure 2B:
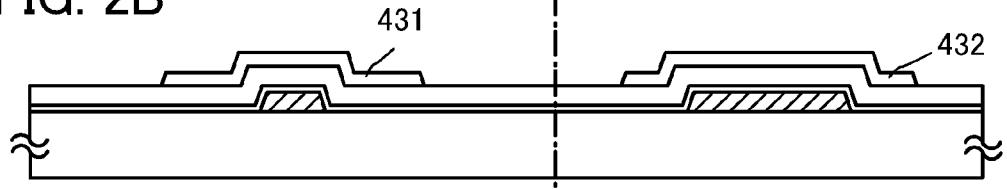

Embodiments will be described in detail with reference to the accompanying drawings. Note that the present invention is not limited to the following description, and it can be easily understood by those skilled in the art that the mode and the detail can be changed variously without departing from the spirit and scope of the present invention. Therefore, the present invention is not construed as being limited to the description of the following embodiments. In the structures to be given below, the same portions or portions having similar functions are denoted by the same reference numerals in different drawings, and explanation thereof will not be repeated.
(Embodiment 1)

One embodiment of a semiconductor device and a method of manufacturing a semiconductor device will be described with reference to FIGS. 1A1 to 1C, FIGS. 2A to 2E, and FIGS. 3A to 3E.

FIGS. 1A1 to 1C illustrate examples of cross-sectional structures of two transistors with different structures formed over one substrate. In FIGS. 1A to 1C, a thin film transistor 410 has a kind of bottom-gate structure called a channel-etched type, and a thin film transistor 420 has a kind of bottom-gate structure called a channel protection type (also referred to as a channel stop type). The thin film transistors 410 and 420 are also referred to as inverted staggered thin film transistors.

FIG. 1A1 is a plan view of the channel-etched thin film transistor 410 arranged in a driver circuit. FIG. 1B is a cross-sectional view taken along line C1-C2 in FIG. 1A1. FIG. 1C is a cross-sectional view taken along line C3-C4 in FIG. 1A1.

The thin film transistor 410 arranged in the driver circuit is a channel-etched thin film transistor and includes a gate electrode layer 411; a first gate insulating layer 402a; a second gate insulating layer 402b; an oxide semiconductor layer 412 including at least a channel formation region 413, a first high-resistance drain region 414a, and a second high-resistance drain region 414b; a source electrode layer 415a; and a drain electrode layer 415b over a substrate 400 having an insulating surface. Moreover, an oxide insulating layer 416 which covers the thin film transistor 410 and is in contact with the channel formation region 413 is provided.

The first high-resistance drain region 414a is formed in contact with a bottom surface of the source electrode layer 415a in a self-aligned manner. The second high-resistance drain region 414b is formed in contact with a bottom surface of the drain electrode layer 415b in a self-aligned manner. The channel formation region 413 is in contact with the oxide insulating layer 416, has a small thickness, and is a region (i.e., an i-type region) with higher resistance than the first high-resistance drain region 414a and the second high-resistance drain region 414b.

In order to make the resistance of a wiring lower in the thin film transistor 410, a metal material is preferably used for the source electrode layer 415a and the drain electrode layer 415b.

When a pixel portion and a driver circuit are formed over one substrate in a liquid crystal display device, in the driver circuit, only one of positive voltage or negative voltage is applied between a source electrode and a drain electrode of a thin film transistor included in a logic gate such as an inverter circuit, a NAND circuit, a NOR circuit, or a latch circuit and a thin film transistor included in an analog circuit such as a sense amplifier, a constant voltage generation circuit, or a VCO. Thus, the width of the second high-resistance drain region 414b which needs high withstand voltage, may be designed to be larger than the width of the first high-resistance drain region 414a. Moreover, the width of the first high-resistance drain region 414a and the second high-resistance drain region 414b that overlap with the gate electrode layer may be increased.

The thin film transistor 410 arranged in the driver circuit is described using a single-gate thin film transistor; a multi-gate thin film transistor including a plurality of channel formation regions can be formed when needed.

Furthermore, a conductive layer 417 is provided above the channel formation region 413 so as to overlap with the channel formation region 413. The conductive layer 417 is electrically connected to the gate electrode layer 411 so that the conductive layer 417 and the gate electrode layer 411 have the same electric potential, whereby a gate voltage can be applied from above and below the oxide semiconductor layer placed between the gate electrode layer 411 and the conductive layer 417. Alternatively, when the gate electrode layer 411 and the conductive layer 417 are made to have different electric potentials, for example, when the conductive layer 417 has a fixed potential, GND, or 0 V, the electrical characteristics of the TFT, such as the threshold voltage, can be controlled. In other words, the gate electrode layer 411 functions as a first gate electrode layer and the conductive layer 417 functions as a second gate electrode layer, whereby the thin film transistor 410 can be used as a thin film transistor having four terminals.

Further, a protection insulating layer 403 and a planarization insulating layer 404 are stacked between the conductive layer 417 and the oxide insulating layer 416.

The protection insulating layer 403 is preferably in contact with the first gate insulating layer 402a provided below the protection insulating layer 403 or an insulating film serving as a base, and blocks entry of impurities such as water, a hydrogen ion, and OH⁻ from a side surface of the substrate. It is particularly effective to use a silicon nitride film as the first gate insulating layer 402a or the insulating film serving as a base, which is in contact with the protection insulating layer 403.

FIG. 1A2 is a plan view of the channel protection thin film transistor 420 arranged in a pixel portion. FIG. 1B is a cross-sectional view taken along line D1-D2 in FIG. 1A2. FIG. 1C is a cross-sectional view taken along line D3-D4 in FIG. 1A2.

The thin film transistor 420 arranged in the pixel is a channel protection thin film transistor and includes a gate electrode layer 421; the first gate insulating layer 402a; the second gate insulating layer 402b; an oxide semiconductor layer 422 including a channel formation region; an oxide insulating layer 426 functioning as a channel protection layer; a source electrode layer 425a; and a drain electrode layer 425b over the substrate 400 having an insulating surface. Moreover, the protection insulating layer 453 is provided so as to cover the thin film transistor 420 and to be in contact with the oxide insulating layer 426, the source electrode layer 425a, and the drain electrode layer, and the planarization insulating layer 404 is stacked over the protection insulating layer 453. A pixel electrode layer 427 is provided over the planarization insulating layer 404 to be in contact with the drain electrode layer 425b, and thus is electrically connected to the thin film transistor 420.

Heat treatment for reducing impurities such as water (heat treatment for dehydration or dehydrogenation) is performed after an oxide semiconductor film is deposited. Reduction of the carrier concentration of the oxide semiconductor layer, for example, by formation of an oxide insulating layer in contact with the oxide semiconductor layer after the heat treatment for dehydration or dehydrogenation and gradual cooling leads to improvement in the electrical characteristics and reliability of the thin film transistor 420.

The channel formation region of the thin film transistor 420 arranged in the pixel is a region of the oxide semiconductor layer 422, which is in contact with the oxide insulating layer 426 which is a channel protection layer and overlaps with the gate electrode layer 421. Since the thin film transistor 420 is protected by the oxide insulating layer 426, the oxide semiconductor layer 422 can be prevented from being etched in an etching step for forming the source electrode layer 425a and the drain electrode layer 425b.

For realizing a display device with a high aperture ratio, the source electrode layer 425a and the drain electrode layer 425b are formed using a light-transmitting conductive film so that the thin film transistor can serve as a light-transmitting thin film transistor.

Moreover, a light-transmitting conductive film is also used for the gate electrode layer 421 in the thin film transistor 420.

In the pixel in which the thin film transistor 420 is arranged, a conductive film that transmits visible light is used for the pixel electrode layer 427 or another electrode layer (e.g., a capacitor electrode layer) or another wiring layer (e.g., a capacitor wiring layer), which realizes a display device with a high aperture ratio. Needless to say, it is preferable to use a conductive film that transmits visible light for the first gate insulating layer 402a, the second gate insulating layer 402b, and the oxide insulating layer 426.

In this specification, a film that transmits visible light refers to a film having a visible light transmittance of 75% to 100%; when the film has conductivity, it is also referred to as a transparent conductive film. Further, a conductive film that is semi-transparent to visible light may be used for a metal oxide applied to the gate electrode layer, the source electrode layer, the drain electrode layer, the pixel electrode layer, or another electrode layer or another wiring layer. Semi-transparency to visible light means that the visible light transmittance is 50% to 75%.

Steps for manufacturing the thin film transistors 410 and 420 over one substrate are described below with reference to FIGS. 2A to 2E and FIGS. 3A to 3E.

First, a light-transmitting conductive film is formed over the substrate 400 having an insulating surface, and then the gate electrode layers 411 and 421 are formed in a first photolithography step. Moreover, a capacitor wiring layer is formed in a pixel portion from the same light-transmitting material as the gate electrode layers 411 and 421 in the first photolithography step. Furthermore, when a capacitor is necessary in a driver circuit in addition to in the pixel portion, the capacitor wiring layer is also formed in the driver circuit. Note that a resist mask may be formed by an inkjet method. A photomask is not used when the resist mask is formed by an inkjet method, which results in a reduction in manufacturing costs.

Although there is no particular limitation on a substrate which can be used as the substrate 400 having an insulating surface, the substrate needs to have heat resistance high enough to withstand at least heat treatment to be performed later. As the substrate 400 having an insulating surface, a glass substrate of barium borosilicate glass, aluminoborosilicate glass, or the like can be used.

When the temperature of the heat treatment to be performed later is high, a substrate having a strain point of 730° C. or higher is preferably used as the substrate 400. As a material of the glass substrate, for example, a glass material such as aluminosilicate glass, aluminoborosilicate glass, or barium borosilicate glass is used. Note that a glass substrate can be more practical heat-resistant glass by containing a larger amount of barium oxide (BaO) than boron trioxide. Therefore, a glass substrate containing a larger amount of BaO than $B_2O_3$ is preferably used.

Note that a substrate formed of an insulator, such as a ceramic substrate, a quartz substrate, or a sapphire substrate, may be used instead of the glass substrate. Alternatively, crystallized glass or the like may be used.

An insulating film serving as a base film may be provided between the substrate 400 and the gate electrode layers 411 and 421. The base film has a function of preventing diffusion of an impurity element from the substrate 450, and can be formed as a single-layer structure or a layered structure using one or more of a silicon nitride film, a silicon oxide film, a silicon nitride oxide film, and a silicon oxynitride film.

As a material for the gate electrode layers 411 and 421, a conductive material that transmits visible light, for example, any of the following metal oxides can be used: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thicknesses of the gate electrode layers 411 and 421 are set within the range of 50 nm to 300 nm as appropriate. The metal oxide used for the gate electrode layers 411 and 421 is deposited by a sputtering method, a vacuum evaporation method (e.g., an electron beam evaporation method), an arc discharge ion plating method, or a spray method. When a sputtering method is employed, it is preferable that deposition be performed using a target containing $SiO_2$ of 2 to 10 percent by weight and $SiO_x$ (x>0) which inhibits crystallization be contained in the light-transmitting conductive film so as to prevent crystallization at the time of heat treatment for dehydration or dehydrogenation in a later step.

Next, a gate insulating layer is formed over the gate electrode layers 411 and 421.

The gate insulating layer can be formed as a single layer or a stack of a silicon oxide layer, a silicon nitride layer, a silicon oxynitride layer, and/or a silicon nitride oxide layer by a plasma CVD method, a sputtering method, or the like. For example, a silicon oxynitride layer may be formed using $SiH_4$, oxygen, and nitrogen as deposition gases by a plasma CVD method.

In this embodiment, the gate insulating layer is a stack of the first gate insulating layer 402a with a thickness of 50 nm to 200 nm inclusive and the second gate insulating layer 402b with a thickness of 50 nm to 300 nm inclusive. As the first gate insulating layer 402a, a 100-nm-thick silicon nitride film or silicon nitride oxide film is used. As the second gate insulating layer 402b, a 100-nm-thick silicon oxide film is used.

An oxide semiconductor film 430 with a thickness of 2 nm to 200 nm inclusive is formed over the second gate insulating layer 402b. The oxide semiconductor film 430 preferably has a thickness of 50 nm or less so as to remain in an amorphous state even when heat treatment for dehydration or dehydrogenation is performed after the oxide semiconductor film 430 is formed. The small thickness of the oxide semiconductor film makes it possible to prevent the oxide semiconductor film from being crystallized when heat treatment is performed after the formation of the oxide semiconductor film.

Note that before the oxide semiconductor film 430 is formed by a sputtering method, dust attached to a surface of the second gate insulating layer 402b is preferably removed by reverse sputtering in which plasma is generated by introduction of an argon gas. The reverse sputtering refers to a method in which, without application of voltage to a target side, an RF power source is used for application of voltage to the substrate side in an argon atmosphere so that plasma is generated around the substrate to modify a surface. Note that instead of an argon atmosphere, nitrogen, helium, oxygen, or the like may be used.

As the oxide semiconductor film 430, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film 430 is formed by a sputtering method with the use of an In—Ga—Zn—O-based oxide semiconductor target. Alternatively, the oxide semiconductor film 430 can be formed by a sputtering method in a rare gas (typically argon) atmosphere, an oxygen atmosphere, or an atmosphere containing a rare gas (typically argon) and oxygen. When a sputtering method is employed, it is preferable that deposition be performed using a target containing $SiO_2$ of 2 to 10 percent by weight and $SiO_x$ (x>0) which inhibits crystallization be contained in the oxide semiconductor film 430 so as to prevent crystallization at the time of the heat treatment for dehydration or dehydrogenation in a later step.

The oxide semiconductor film preferably contains In, more preferably contains In and Ga. Dehydration or dehydrogenation are effective in obtaining an i-type (intrinsic) oxide semiconductor film.

Then, the oxide semiconductor film 430 is processed into island-shaped oxide semiconductor layers in a second photolithography step. The resist mask for forming the island-shaped semiconductor layers may be formed by an ink-jet method. Formation of the resist mask by an ink-jet method does not need a photomask, which results in a reduction in manufacturing costs.

Then, the oxide semiconductor layer is subjected to dehydration or dehydrogenation. The temperature of first heat treatment for dehydration or dehydrogenation is 350° C. or higher and lower than the strain point of the substrate, preferably 400° C. or higher. Here, the substrate is put in an electric furnace which is a kind of heat treatment apparatus and heat treatment is performed on the oxide semiconductor layer in a nitrogen atmosphere, and then water and hydrogen are prevented from being mixed into the oxide semiconductor layer with the oxide semiconductor layer not exposed to the air; thus, oxide semiconductor layers 431 and 432 are obtained (see FIG. 2B). In this embodiment, slow cooling is performed in one furnace in a nitrogen atmosphere from the heating temperature T at which dehydration or dehydrogenation are performed on the oxide semiconductor layer to a temperature low enough to prevent entry of water; specifically, the slow cooling is performed until the temperature drops by 100° C. or more from the heating temperature T. The atmosphere of the dehydration or dehydrogenation is not limited to a nitrogen atmosphere, and the dehydration or dehydrogenation may be alternatively performed in a rare gas atmosphere (e.g., helium, neon, or argon) or under reduced pressure.

Note that in the first heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

In some cases, the oxide semiconductor layer is crystallized to be a microcrystalline film or a polycrystalline film depending on the conditions of the first heat treatment or the material of the oxide semiconductor film.

The first heat treatment of the oxide semiconductor layer may be performed on the oxide semiconductor film 430 before processing of the oxide semiconductor film into the island-shaped oxide semiconductor layers. In that case, after the first heat treatment, the substrate is taken out of a heating apparatus, and then a photolithography step is performed.

Before the deposition of the oxide semiconductor film 430, impurities such as hydrogen and water contained in the gate insulating layer may be removed by performing heat treatment (at higher than or equal to 400° C. and lower than the strain point of the substrate) in an inert gas atmosphere (e.g., nitrogen, helium, neon, or argon) or an oxygen atmosphere or under reduced pressure.

Figure 2C:
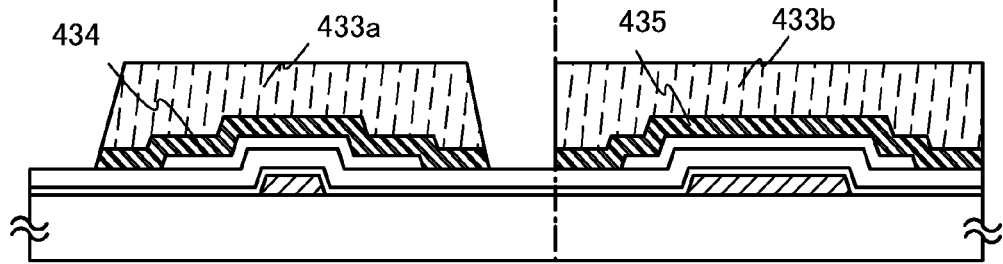

Next, a metal conductive film is formed over the second gate insulating layer 402b and the oxide semiconductor layers 431 and 432, and then resist masks 433a and 433b are formed in a third photolithography step and the metal conductive film is selectively etched to form metal electrode layers 434 and 435 (see FIG. 2C). Examples of the material for the metal conductive film include an element selected from Al, Cr, Cu, Ta, Ti, Mo, and W; an alloy containing any of these elements as a component; and an alloy containing these elements in combination.

The metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Needless to say, the metal conductive film may have a single-layer structure, a two-layer structure, or a layered structure of four layers or more.

The resist masks for forming the metal electrode layers 434 and 435 may be formed by an ink-jet method. Formation of the resist masks by an ink-jet method does not need a photomask, which results in a reduction in manufacturing costs.

Figure 2D:
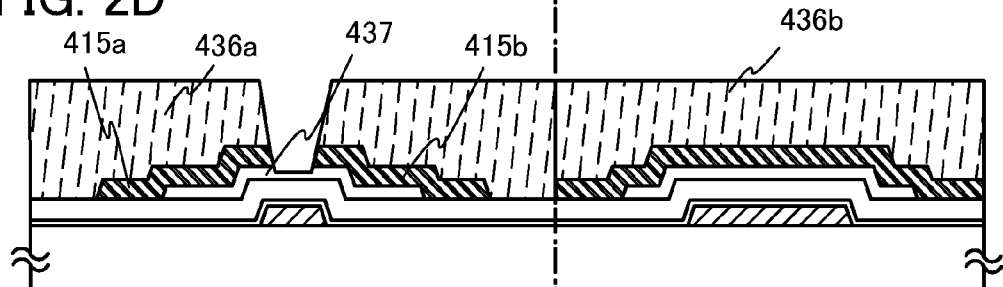

Then, the resist masks 433a and 433b are removed, resist masks 436a and 436b are formed in a fourth photolithography step, and the metal electrode layer 434 is selectively etched to form a source electrode layer 415a and a drain electrode layer 415b (see FIG. 2D). Note that in the fourth photolithography step, only part of the oxide semiconductor layer 431 is etched, whereby an oxide semiconductor layer 437 having a groove (a depressed portion) is formed. The resist masks 436a and 436b for forming the groove (the depressed portion) in the oxide semiconductor layer 431 may be formed by an ink-jet method. Formation of the resist masks by an ink-jet method does not need a photomask, which results in a reduction in manufacturing costs.

Figure 2E:
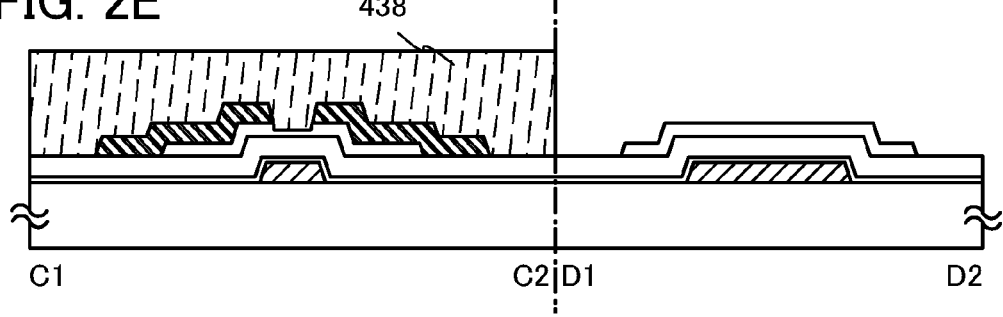

Then, the resist masks 436a and 436b are removed, a resist mask 438 for covering the oxide semiconductor layer 437 is formed in a fifth photolithography step, and the metal electrode layer 435 over the oxide semiconductor layer 432 is removed (see FIG. 2E).

Note that in order to remove the metal electrode layer 435 overlapping with the oxide semiconductor layer 432 in the fifth photolithography step, the materials of the oxide semiconductor layer 432 and the metal electrode layer 435 and the etching conditions are adjusted as appropriate so that the oxide semiconductor layer 432 is not removed in etching of the metal electrode layer 435.

An oxide insulating film 439 serving as a protection insulating film is formed in contact with the top surface and side surfaces of the oxide semiconductor layer 432 and the groove (the depressed portion) in the oxide semiconductor layer 437.

The oxide insulating film 439 has a thickness of at least 1 nm and can be formed by a method by which impurities such as water and hydrogen are not mixed into the oxide insulating film 439, such as a sputtering method, as appropriate. In this embodiment, a 300-nm-thick silicon oxide film is formed as the oxide insulating film 492 by a sputtering method. The substrate temperature at the film deposition is in the range of room temperature to 300° C., and is 100° C. in this embodiment. The silicon oxide film can be deposited by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed using a silicon target in an atmosphere containing oxygen and nitrogen by a sputtering method. The oxide insulating film 439 which is formed in contact with the low-resistance oxide semiconductor layer is formed using an inorganic insulating film that does not contain impurities such as water, hydrogen ions, and OH− and blocks entry of such impurities from the outside, typically a silicon oxide film, a silicon nitride oxide film, an aluminum oxide film, or an aluminum oxynitride film.

Figure 3A:
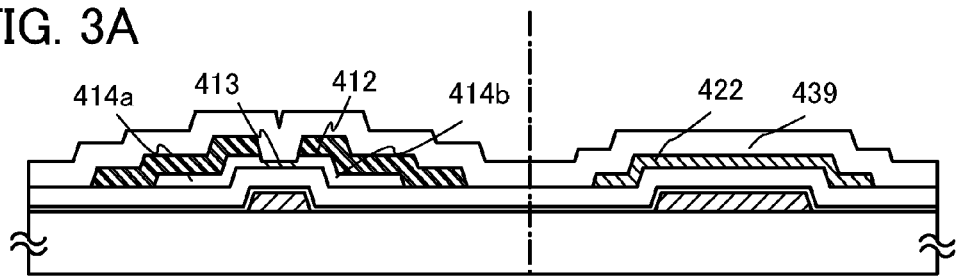
FIGS. 3A to 3E are views illustrating a method for manufacturing a semiconductor device.

Next, second heat treatment (preferably 200° C. to 400° C. inclusive, for example, 250° C. to 350° C. inclusive) is performed in an inert gas atmosphere or an oxygen gas atmosphere (see FIG. 3A). For example, the second heat treatment is performed at 250° C. for one hour in a nitrogen atmosphere. With the second heat treatment, heating is performed with the groove in the oxide semiconductor layer 437 and the top surface and side surfaces of the oxide semiconductor layer 432 in contact with the oxide insulating film 439.

Through the above-described steps, heat treatment for dehydration or dehydrogenation is performed on the oxide semiconductor film after deposition to reduce the resistance, and then part of the oxide semiconductor film is selectively made to be in an oxygen-excess state. As a result, the channel formation region 413 overlapping with the gate electrode layer 411 becomes intrinsic, and the first high-resistance drain region 414a which overlaps with the source electrode layer 415a and the second high-resistance drain region 414b which overlaps with the drain electrode layer 415b are formed in a self-aligned manner. Moreover, the entire oxide semiconductor layer 422 which overlaps with the gate electrode layer 421 becomes intrinsic.

However, when heat treatment is performed in a nitrogen atmosphere or an inert gas atmosphere or under reduced pressure with the high-resistance (i-type) oxide semiconductor layer 422 exposed, the resistance of the high-resistance (i-type) oxide semiconductor layer 422 is reduced. For that reason, the heat treatment performed with the oxide semiconductor layer 422 exposed is performed in an oxygen gas or $N_2O$ gas atmosphere or an ultra-dry air (with a dew point of −40° C. or lower, preferably −60° C. or lower).

The second high-resistance drain region 414b (or the first high-resistance drain region 414a) is formed in the oxide semiconductor layer overlapping with the drain electrode layer 415b (or the source electrode layer 415a), so that the reliability of a driver circuit to be formed can be increased. Specifically, with the formation of the second high-resistance drain region 414b, a structure can be obtained in which conductivity can be varied from the drain electrode layer to the channel formation region via the second high-resistance drain region 414b. Thus, when the transistor operates with the drain electrode layer 415b connected to a wiring that supplies a high power supply potential VDD, the transistor can have increased withstand voltage because the high-resistance drain region serves as a buffer even when a high electric field is applied between the gate electrode layer 411 and the drain electrode layer 415b so that a localized high electric field is not applied to the transistor.

When the second high-resistance drain region 414b (or the first high-resistance drain region 414a) is formed in the oxide semiconductor layer overlapping with the drain electrode layer 415b (or the source electrode layer 415a), leakage current in the channel formation region 463 in a driver circuit to be formed can be reduced.

Figure 3B:
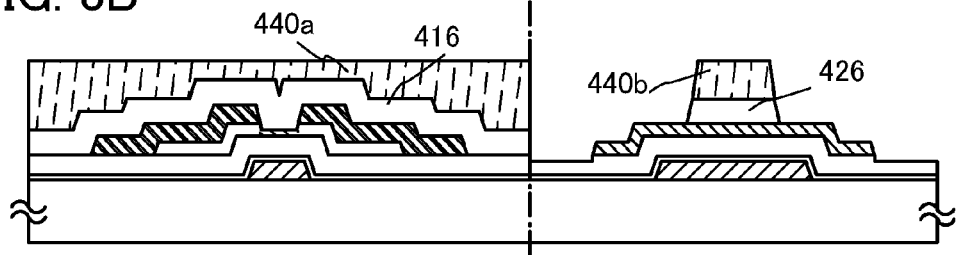

Then, in a sixth photolithography step, resist masks 440a and 440b are formed and the oxide insulating film 439 is selectively etched to form the oxide insulating layers 416 and 426 (see FIG. 3B). The oxide insulating layer 426 is provided over the channel formation region in the oxide semiconductor layer 422 and functions as a channel protection film. Note that when an oxide insulating layer is used as the gate insulating layer 402b as in this embodiment, part of the gate insulating layer 402b is also etched in the etching step of the oxide insulating film 439, whereby the thickness of the gate insulating layer 402b is reduced in some cases. When a nitride insulating film that has lower etching rate compared to the oxide insulating film 439 is used as the gate insulating layer 402b, the gate insulating layer 402b can be prevented from being partly etched.

Figure 3C:
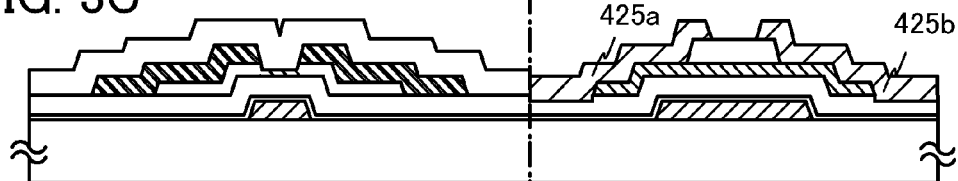

Next, after a light-transmitting conductive film is formed over the oxide semiconductor layer 422 and the oxide insulating layer 426, the source electrode layer 425a and the drain electrode layer 425b are formed in a seventh photolithography step (see FIG. 3C). The light-transmitting conductive film is deposited by a sputtering method, a vacuum evaporation method (e.g., an electron beam evaporation method), an arc discharge ion plating method, or a spray method. As a material for the conductive layer, a conductive material that transmits visible light, for example, any of the following metal oxides can be used: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thickness of the source electrode layer 425a and the drain electrode layer 425b is set within the range of 50 nm to 300 nm as appropriate. When a sputtering method is employed, deposition is preferably performed using a target containing $SiO_2$ of 2 to 10 percent by weight and SiOx (x>0) which inhibits crystallization be contained in the light-transmitting conductive film so as to prevent crystallization at the time of the heat treatment in a later step.

A resist mask for forming the metal electrode layers 425a and 425b may be formed by an ink-jet method. Formation of the resist mask by an ink-jet method does not need a photomask, which results in a reduction in manufacturing costs.

Then, the protection insulating layer 403 is formed over the oxide insulating layers 416 and 426, the source electrode layer 425a, and the drain electrode layer 425b. In this embodiment, a silicon nitride film is formed by an RF sputtering method. Since an RF sputtering method allows high productivity, it is preferably used for depositing the protection insulating layer 403. The protection insulating layer 403 is formed using an inorganic insulating film that does not contain impurities such as water, hydrogen ions, and OH⁻ and blocks entry of such impurities from the outside, typically a silicon nitride film, an aluminum nitride film, a silicon nitride oxide film, or an aluminum oxynitride film. Needless to say, the protection insulating layer 403 is a light-transmitting insulating film.

The protection insulating layer 403 is preferably in contact with the first gate insulating layer 402a provided below the protection insulating layer 403 or an insulating film serving as a base, and blocks entry of impurities such as water, a hydrogen ion, and OH⁻ from the vicinity of a side surface of the substrate. It is particularly effective to use a silicon nitride film as the first gate insulating layer 402a or the insulating film serving as the base, which is in contact with the protection insulating layer 403. In other words, a silicon nitride film is provided so as to surround a bottom surface, a top surface, and a side surface of the oxide semiconductor layer, whereby the reliability of a display device is increased.

Next, the planarization insulating layer 404 is formed over the protection insulating layer 403. The planarization insulating layer 404 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that a plurality of insulating films formed using these materials may be stacked to form the planarization insulating layer 404.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer 404. The planarization insulating layer 404 can be formed, depending on the material, by a method such as a sputtering method, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater, or the like.

Figure 3D:
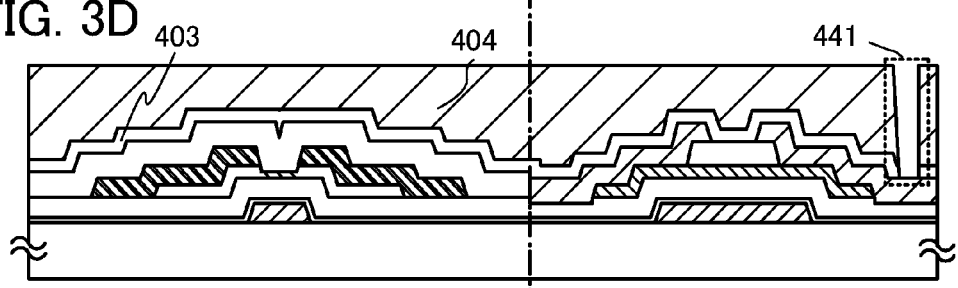

Then, an eighth photolithography step is performed so that a resist mask is formed and a contact hole 441 that reaches the drain electrode layer 425b is formed by etching of the planarization insulating layer 404 and the protection insulating layer 403 (see FIG. 3D). Moreover, contact holes that reach the gate electrode layers 411 and 421 are also formed with that etching. Alternatively, a resist mask for forming the contact hole that reaches the drain electrode layer 425b may be formed by an inkjet method. A photomask is not used when the resist mask is formed by an inkjet method, which results in a reduction in manufacturing costs.

Next, the resist mask is removed and then a light-transmitting conductive film is formed. The light-transmitting conductive film can be formed using indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based non-single-crystal film containing nitrogen (i.e., an Al—Zn—O—N-based non-single-crystal film), a Zn—O-based non-single-crystal film containing nitrogen, or a Sn—Zn—O-based non-single-crystal film containing nitrogen may be used. Note that the percentage (atomic %) of zinc in the Al—Zn—O—N-based non-single-crystal film is 47 atomic % or less and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated particularly in etching ITO, an alloy of indium oxide and zinc oxide ($In_2O_3$—ZnO) may be used to improve etching processability.

Note that the unit of the percentage of components in the light-transmitting conductive film is atomic percent (atomic %), and the percentage of components is evaluated by analysis using an electron probe X-ray microanalyzer (EPMA).

Figure 3E:
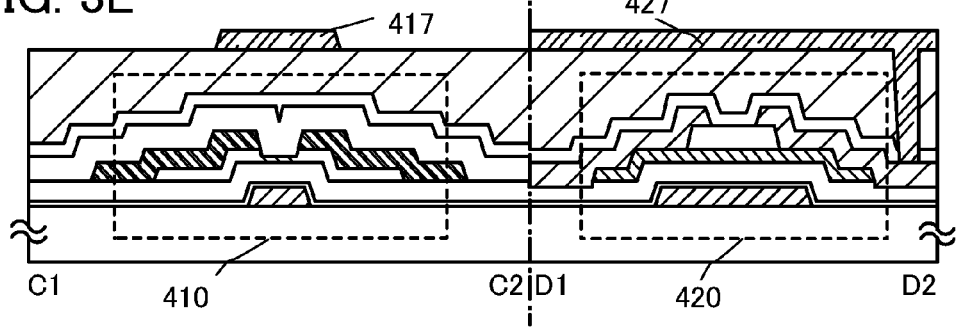

Next, a ninth photolithography step is performed so that a resist mask is formed and unnecessary portions are removed by etching to form the pixel electrode layer 427 and the conductive layer 417 (see FIG. 3E).

Through the above-described steps, with the use of nine masks, the thin film transistor 410 and the thin film transistor 420 can be separately manufactured in the driver circuit and the pixel portion, respectively, over one substrate. The thin film transistor 410 for the driver circuit is the channel-etched thin film transistor including the oxide semiconductor layer 412 including the first high-resistance drain region 414a, the second high-resistance drain region 414b, and the channel formation region 413. The thin film transistor 420 for the pixel is the channel protection thin film transistor in which the entire oxide semiconductor layer 472 is intrinsic.

In addition, a storage capacitor that is constituted by a capacitor wiring layer and a capacitor electrode with the first gate insulating layer 402a and the second gate insulating layer 402b as dielectrics can be formed over the same substrate. The thin film transistors 420 and storage capacitors are arranged in matrix to correspond to individual pixels so that a pixel portion is formed and a driver circuit including the thin film transistor 410 is arranged around the pixel portion, whereby one of the substrates for manufacturing an active matrix display device can be obtained. In this specification, such a substrate is referred to as an active matrix substrate for convenience.

The pixel electrode layer 427 is electrically connected to the capacitor electrode through the contact hole formed in the planarization insulating layer 404 and the protection insulating layer 403. Note that the capacitor electrode can be formed using the same light-transmitting material in the same step as the source electrode layer 425a and the drain electrode layer 425b.

The conductive layer 417 is provided so as to overlap with the channel formation region 413 in the oxide semiconductor layer, whereby in a bias-temperature stress test (referred to as a BT test) for examining the reliability of a thin film transistor, the amount of change in the threshold voltage of the thin film transistor 410 before and after the BT test can be reduced. The electric potential of the conductive layer 417 may be the same or different from that of the gate electrode layer 411. The conductive layer 417 can also function as a second gate electrode layer. Alternatively, the electric potential of the conductive layer 467 may be GND or 0 V, or the conductive layer 467 may be in a floating state.

The resist mask for forming the pixel electrode layer 427 may be formed by an ink-jet method. Formation of the resist mask by an ink-jet method does not need a photomask, which results in a reduction in manufacturing costs.

(Embodiment 2)

In this embodiment, an example in which heat treatment for the thin film transistor for a pixel is different from that in Embodiment 1 is illustrated in FIGS. 4A to 4E. FIGS. 4A to 4E are the same as FIGS. 1A1 to 1C, FIGS. 2A to 2E, and FIGS. 3A to 3E except for part of the steps. Thus, the same parts as in FIGS. 1A1 to 1C, FIGS. 2A to 2E, and FIGS. 3A to 3E are denoted by the same reference numerals and detailed description on the parts is omitted.

Figure 4A:
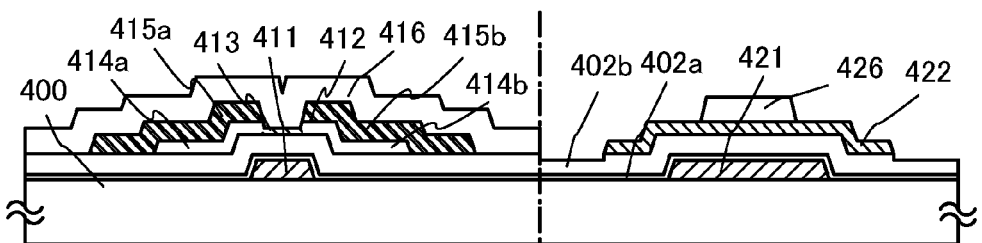
FIGS. 4A to 4E are views illustrating a method for manufacturing a semiconductor device.
Figure 4B:
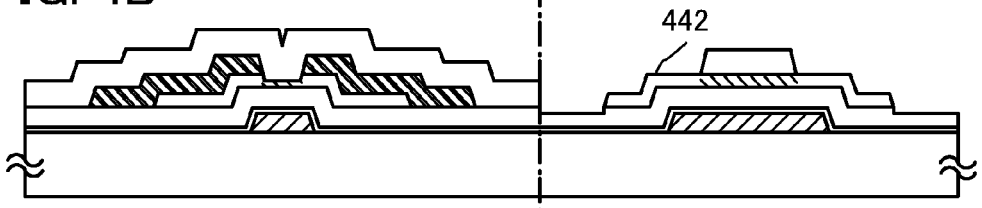

First, the steps up to and including the step in FIG. 3B in Embodiment 1 are performed in accordance with Embodiment 1. FIG. 4A illustrates a state where the resist masks 440a and 440b are removed after the step in FIG. 3B.

The gate electrode layers 411 and 421, the first gate insulating layer 402a, and the second gate electrode layer 402b are formed over the substrate 400 having an insulating surface. In the driver circuit portion, the oxide semiconductor layer 412 including the channel formation region 413, the first high-resistance drain region 414a, and the second high-resistance drain region 414b; the source electrode layer 415a; the drain electrode layer 415b; and the oxide insulating layer 416 are formed. In the pixel portion, the oxide semiconductor layer 422 and the oxide insulating layer 426 are formed (see FIG. 4A). The oxide semiconductor layer 422 is an i-type semiconductor layer with increased resistance.

In this embodiment, heat treatment is performed in a nitrogen or inert gas atmosphere or under reduced pressure with at least part of the oxide semiconductor layer 422 exposed. When heat treatment is performed in a nitrogen or inert gas atmosphere or under reduced pressure in a state where the high-resistance (i-type) oxide semiconductor layer 422 is exposed, the resistance of the high-resistance (i-type) exposed region of the oxide semiconductor layer 472 can be reduced.

Heat treatment for reducing the resistance of the high-resistance (i-type) region of the oxide semiconductor layer 422 is preferably performed at 200° C. to 400° C. inclusive, for example, 250° C. to 350° C. inclusive. For example, heat treatment is performed at 250° C. for one hour in a nitrogen atmosphere.

In this embodiment, the substrate is put in an electric furnace which is a kind of heat treatment apparatus and heat treatment is performed on the oxide semiconductor layer 422 in a nitrogen atmosphere, and then is gradually cooled in a nitrogen atmosphere so that the temperature drops by 100° C. or more from the heat temperature T, with the oxide semiconductor layer 422 not exposed to the air. Moreover, without limitation to a nitrogen atmosphere, dehydration or dehydrogenation may be performed in a rare gas atmosphere (e.g., helium, neon, or argon) or under reduced pressure. Note that in the heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

With the heat treatment for the oxide semiconductor layer 422 in a nitrogen or inert gas atmosphere or under reduced pressure, the resistance of the exposed region of the oxide semiconductor layer 422 is reduced, and an oxide semiconductor layer 442 including regions with different resistances (indicated as a shaded region and a white region in FIG. 4B) is formed.

Figure 4C:
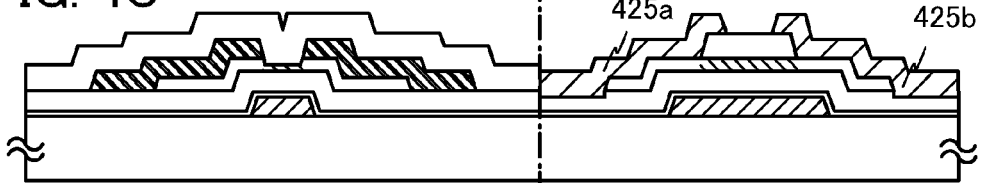

Next, after a light-transmitting conductive film is formed over the oxide semiconductor layer 442 and the oxide insulating layer 426, the source electrode layer 425a and the drain electrode layer 425b are formed in a seventh photolithography step (see FIG. 4C).

Then, the protection insulating layer 403 and the planarization insulating layer 404 are stacked over the oxide insulating layers 416 and 426, the source electrode layer 425a, and the drain electrode layer 425b.

Figure 4D:
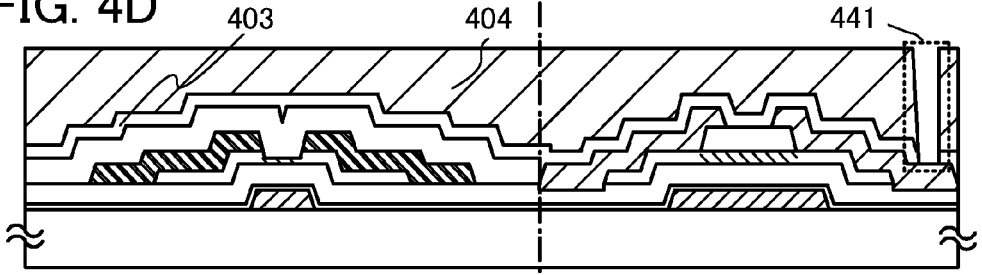

Then, an eighth photolithography step is performed so that a resist mask is formed and the contact hole 441 that reaches the drain electrode layer 425b is formed by etching of the planarization insulating layer 404 and the protection insulating layer 403 (see FIG. 4D).

Next, the resist mask is removed, and then a light-transmitting conductive film is formed.

Figure 4E:
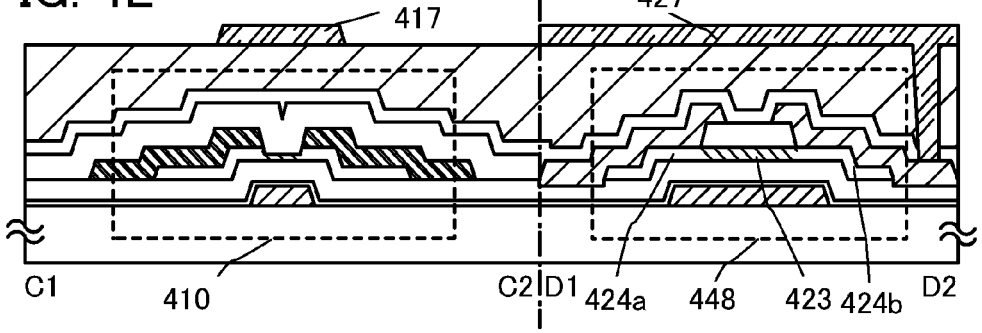

Next, a ninth photolithography step is performed so that a resist mask is formed and unnecessary portions are removed by etching to form the pixel electrode layer 427 and the conductive layer 417 (see FIG. 4E).

Through the above-described steps, with the use of nine masks, the thin film transistor 410 and a thin film transistor 448 can be separately manufactured in the driver circuit and the pixel portion, respectively, over one substrate. The thin film transistor 410 for the driver circuit is the channel-etched thin film transistor including the oxide semiconductor layer 412 including the first high-resistance drain region 414a, the second high-resistance drain region 414b, and the channel formation region 413. The thin film transistor 448 for a pixel is a channel protection thin film transistor including the oxide semiconductor layer 442 including a first high-resistance drain region 424a, a second high-resistance drain region 424b, and a channel formation region 423. Consequently, the thin film transistors 410 and 448 have increased withstand voltage because the high-resistance drain region serves as a buffer so that a localized high electric field is not applied to the thin film transistors 410 and 448 even when a high electric field is applied to the thin film transistors 410 and 448.

In addition, a storage capacitor that is constituted by a capacitor wiring layer and a capacitor electrode with the first gate insulating layer 402a and the second gate insulating layer 402b as dielectrics can be formed over the same substrate. The thin film transistors 448 and storage capacitors are arranged in matrix to correspond to individual pixels so that a pixel portion is formed and a driver circuit including the thin film transistor 410 is arranged around the pixel portion, whereby one of the substrates for manufacturing an active matrix display device can be obtained.

The conductive layer 417 is provided so as to overlap with the channel formation region in the oxide semiconductor layer 412, whereby in a bias-temperature stress test (referred to as a BT test) for examining the reliability of a thin film transistor, the amount of change in the threshold voltage of the thin film transistor 410 before and after the BT test can be reduced. The electric potential of the conductive layer 417 may be the same or different from that of the gate electrode layer 411. The conductive layer 417 can also function as a second gate electrode layer. Alternatively, the electric potential of the conductive layer 467 may be GND, 0 V, or the conductive layer 467 may be in a floating state.

(Embodiment 3)

Figure 5A:
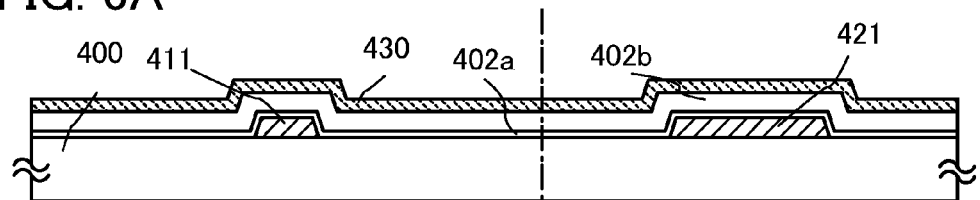
FIGS. 5A to 5C are views illustrating a method for manufacturing a semiconductor device.
Figure 5B:
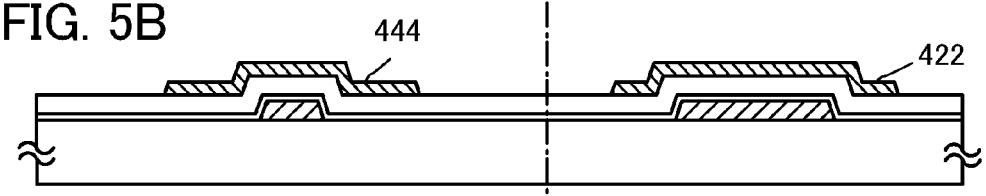
Figure 5C:
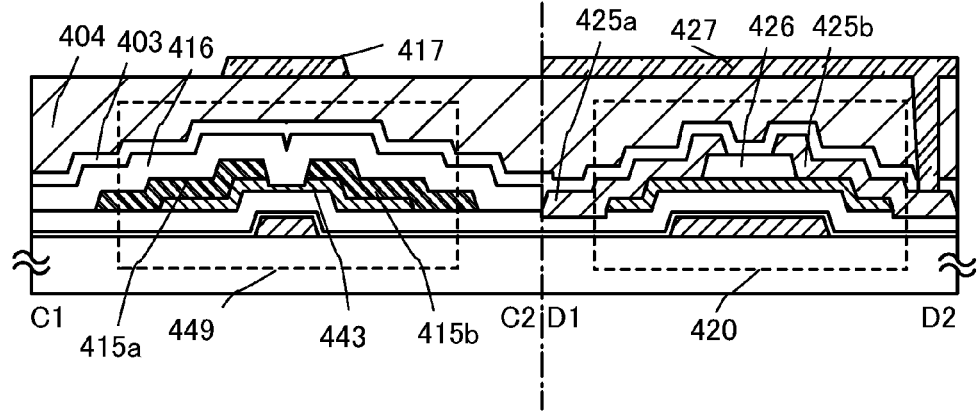

In this embodiment, an example in which first heat treatment is different from that in Embodiment 1 is illustrated in FIGS. 5A to 5C. FIGS. 5A to 5C are the same as FIGS. 1A1 to 1C, FIGS. 2A to 2E, and FIGS. 3A to 3E except for part of the steps. Thus, the same parts as in FIGS. 1A1 to 1C, FIGS. 2A to 2E, and FIGS. 3A to 3E are denoted by the same reference numerals and detailed description on the parts is omitted.

First, in accordance with Embodiment 1, a light-transmitting conductive film is formed over the substrate 400 having an insulating surface, and then the gate electrode layers 411 and 421 are formed in a first photolithography step.

Next, a stack of the first gate insulating layer 402a and the second gate insulating layer 402b is formed over the gate electrode layers 411 and 421 (see FIG. 5A). Note that the step in FIG. 5A is the same as the step in FIG. 2A. Note that the steps up to and including the step in FIG. 5A are the same as those in Embodiment 1.

Then, the oxide semiconductor film 430 is formed to a thickness of 2 nm to 200 nm inclusive over the second gate insulating layer 402b (see FIG. 5A). Note that the steps up to and including the step in FIG. 5A are the same as those in Embodiment 1 and the step in FIG. 5A is the same as the step in FIG. 2A.

Next, the oxide semiconductor film 430 is subjected to dehydration or dehydrogenation in an inert gas atmosphere or under reduced pressure. The temperature of first heat treatment for dehydration or dehydrogenation is 350° C. or higher and lower than the strain point of the substrate, preferably 400° C. or higher. Here, the substrate is put in an electric furnace that is a kind of heat treatment apparatus and heat treatment is performed on the oxide semiconductor film 430 in a nitrogen atmosphere, and then the resistance of the oxide semiconductor film 430 is reduced, that is, the oxide semiconductor film 430 becomes an n-type (e.g., n⁻-type) semiconductor film as an oxygen deficient semiconductor film while water and hydrogen are prevented from being mixed into the oxide semiconductor film 430 with the oxide semiconductor film 430 not exposed to the air. After that, a high-purity oxygen gas, a high-purity $N_2O$ gas, or an ultra-dry air (with a dew point of −40° C. or lower, preferably −60° C. or lower) is introduced into the same furnace and cooling is performed. It is preferable that water, hydrogen, and the like be not contained in an oxygen gas or an $N_2O$ gas. Alternatively, the purity of an oxygen gas or an $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Moreover, after the first heat treatment for dehydration or dehydrogenation, heat treatment may be performed at 200° C. to 400° C. inclusive, preferably 200° C. to 300° C. inclusive, in an oxygen gas or $N_2O$ gas atmosphere.

The entire oxide semiconductor film is made to contain an excess amount of oxygen through the above steps, whereby the oxide semiconductor film has higher resistance, that is, becomes intrinsic.

Consequently, the reliability of a thin film transistor to be manufactured later can be increased.

Next, the oxide semiconductor film is processed into island-shaped semiconductor layers 444 and 422 in a photolithography step (see FIG. 5B). Note that since the oxide semiconductor layer 422 in FIG. 5B is a high-resistance (i-type) oxide semiconductor layer which is the same as the oxide semiconductor layer 422 in FIG. 3A; thus, the same reference numeral is used. Similarly, in this specification, even thin films formed by different methods are sometimes denoted by the same reference numeral when they have equivalent functions or properties (e.g., resistance).

Note that, although the example in which dehydration or dehydrogenation are performed after the formation of the oxide semiconductor film is described in this embodiment, the present invention is not limited thereto. The first heat treatment of the oxide semiconductor film may be performed on the island-shaped oxide semiconductor layers after the processing of the oxide semiconductor film.

Alternatively, the following process may be employed: dehydration or dehydrogenation are performed on the oxide semiconductor film in an inert gas atmosphere or under reduced pressure; cooling is performed in an inert gas atmosphere; the oxide semiconductor film is processed into the oxide semiconductor layers 444 and 422 which are island-shaped oxide semiconductor layers; and then heat treatment is performed in an oxygen gas or an $N_2O$ gas at 200° C. to 400° C. inclusive, preferably 200° C. to 300° C. inclusive.

In addition, before the oxide semiconductor film is formed, heat treatment (at higher than or equal to 400° C. and lower than the strain point of the substrate) may be performed in an inert gas atmosphere (e.g., nitrogen, helium, neon, or argon) or an oxygen atmosphere or under reduced pressure to remove impurities such as hydrogen and water contained in the gate insulating layer.

However, if heat treatment is performed in a nitrogen or inert gas atmosphere or under reduced pressure with the high-resistance (i-type) oxide semiconductor layers 444 and 422 exposed, the resistance of the high-resistance (i-type) oxide semiconductor layers 444 and 422 is reduced. For that reason, the heat treatment performed with the oxide semiconductor layers 444 and 422 exposed is performed in an oxygen gas or $N_2O$ gas atmosphere or an ultra-dry air (with a dew point of −40° C. or lower, preferably −60° C. or lower).

Then, as in FIGS. 2C to 2E and FIGS. 3A to 3E in Embodiment 1, in a peripheral driver circuit portion, only part of the oxide semiconductor layer 444 is etched to form an oxide semiconductor layer 443 having a groove (a depressed portion); the oxide insulating layer 416 is formed in contact with the oxide semiconductor layer 443 and the source electrode layer 415a and the drain electrode layer 415b, each of which is the metal conductive layer; thus, a thin film transistor 449 for a driver circuit is manufactured. In contrast, in a pixel portion, the oxide insulating layer 426 is formed over a channel formation region in the oxide semiconductor layer 422, and the source electrode layer 425a and the drain electrode layer 425b, each of which is a light-transmitting conductive layer, are formed; thus, the thin film transistor 420 for a pixel is manufactured.

Next, second heat treatment (preferably 200° C. to 400° C. inclusive, for example, 250° C. to 350° C. inclusive) is performed in an inert gas atmosphere or an oxygen gas atmosphere. For example, the second heat treatment is performed at 250° C. for one hour in a nitrogen atmosphere.

Then, the protection insulating layer 403 is provided so as to cover the thin film transistors 449 and 420 and to be in contact with the oxide insulating layers 416 and 426, the source electrode layer 425a, and the drain electrode layer 425b, and the planarization insulating layer 404 is stacked over the protection insulating layer 403. A contact hole that reaches the drain electrode layer 425b is formed in the planarization insulating layer 404 and the protection insulating layer 403, and a light-transmitting conductive film is formed in the contact hole and over the planarization insulating layer 404. The light-transmitting conductive film is selectively etched to form the conductive layer 417 and the pixel electrode layer 427 that is electrically connected to the thin film transistor 420.

Through the above-described steps, with the use of nine masks, the thin film transistor 449 and the thin film transistor 420 can be separately manufactured in the driver circuit and the pixel portion, respectively, over one substrate. The thin film transistor 449 for the driver circuit is a channel-etched thin film transistor including the oxide semiconductor layer 443 which is entirely intrinsic. The thin film transistor 420 for the pixel is a channel protection thin film transistor including the oxide semiconductor layer 422 which is entirely intrinsic.

In addition, a storage capacitor that is constituted by a capacitor wiring layer and a capacitor electrode with the first gate insulating layer 402a and the second gate insulating layer 402b as dielectrics can be formed over the same substrate. The thin film transistors 420 and storage capacitors are arranged in matrix so as to correspond to individual pixels so that a pixel portion is formed and a driver circuit including the thin film transistor 449 is arranged around the pixel portion, whereby one of the substrates for manufacturing an active matrix display device can be obtained.

The conductive layer 417 is provided so as to overlap with a channel formation region in the oxide semiconductor layer 443, whereby in a bias-temperature stress test (referred to as a BT test) for examining the reliability of a thin film transistor, the amount of change in the threshold voltage of the thin film transistor 449 before and after the BT test can be reduced. The electric potential of the conductive layer 417 may be the same or different from that of the gate electrode layer. The conductive layer 417 can also function as a second gate electrode layer 411. Alternatively, the electric potential of the conductive layer 417 may be GND or 0 V, or the conductive layer 417 may be in a floating state.

(Embodiment 4)

In this embodiment, an example in which first heat treatment is different from that in Embodiment 1 is illustrated in FIGS. 6A to 6D. FIGS. 6A to 6D are the same as FIGS. 1A1 to 1C, FIGS. 2A to 2E, FIGS. 3A to 3E, FIGS. 4A to 4E, and FIGS. 5A to 5C except for part of the steps. Thus, the same parts as in FIGS. 1A1 to 1C, FIGS. 2A to 2E, FIGS. 3A to 3E, FIGS. 4A to 4E, and FIGS. 5A to 5C are denoted by the same reference numerals and detailed description on the parts is omitted.

Figure 6A:
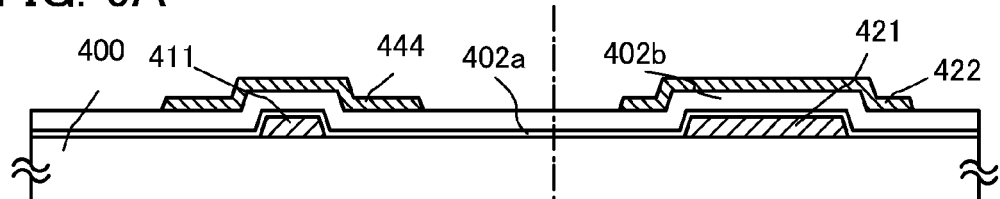
FIGS. 6A to 6D are views illustrating a method for manufacturing a semiconductor device.
Figure 6B:
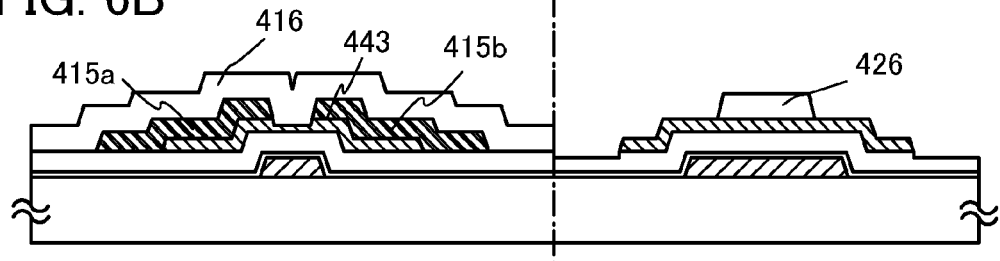
Figure 6C:
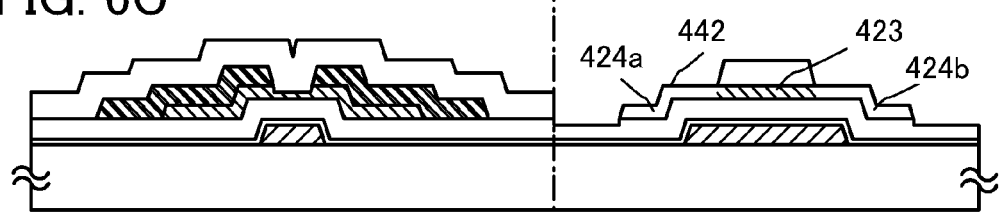
Figure 6D:
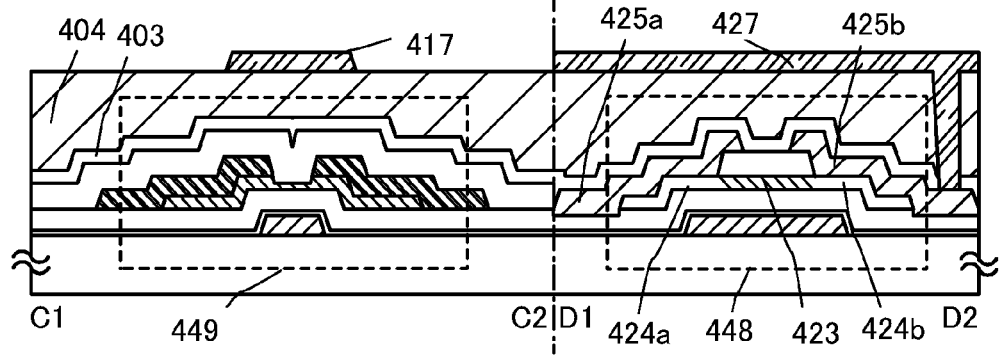

First, the steps up to and including the step in FIG. 5B in Embodiment 3 are performed in accordance with Embodiment 3. FIG. 6A illustrates the same step as FIG. 5B.

The gate electrode layers 411 and 421, the first gate insulating layer 402a, and the second gate electrode layer 402b are formed over the substrate 400 having an insulating surface; the oxide semiconductor layer 444 is formed in a driver circuit portion and the oxide semiconductor layer 422 is formed in a pixel portion (see FIG. 6A). The oxide semiconductor layers 444 and 422 are i-type semiconductor layers with increased resistance.

In a peripheral driver circuit portion, only part of the oxide semiconductor layer 444 is etched to form the oxide semiconductor layer 443 having a groove (a depressed portion); the oxide insulating layer 416 is formed in contact with the oxide semiconductor layer 443 and the source electrode layer 415a and the drain electrode layer 415b, each of which is a metal conductive layer; thus, the thin film transistor 449 for a driver circuit is manufactured. In contrast, in the pixel portion, the oxide insulating layer 426 is formed over a channel formation region in the oxide semiconductor layer 422 (see FIG. 6B).

In this embodiment, as in Embodiment 2, heat treatment is performed in a nitrogen or inert gas atmosphere or under reduced pressure with at least part of the oxide semiconductor layer 422 exposed. When heat treatment is performed in a nitrogen or inert gas atmosphere or under reduced pressure with the high-resistance (i-type) oxide semiconductor layer 422 exposed, the resistance of the high-resistance (i-type) exposed region of the oxide semiconductor layer 422 can be reduced.

Heat treatment for reducing the resistance of the high-resistance (i-type) region in the oxide semiconductor layer 422 is preferably performed at 200° C. to 400° C. inclusive, for example, 250° C. to 350° C. inclusive. For example, heat treatment is performed at 250° C. for one hour in a nitrogen atmosphere.

In this embodiment, the substrate is put in an electric furnace which is a kind of heat treatment apparatus and heat treatment is performed on the oxide semiconductor layer 422 in a nitrogen atmosphere, and then is gradually cooled in a nitrogen atmosphere so that the temperature drops by 100° C. or more from the heat temperature T, with the oxide semiconductor layer 422 not exposed to the air. Moreover, without limitation to a nitrogen atmosphere, dehydration or dehydrogenation may be performed in a rare gas atmosphere (e.g., helium, neon, or argon) or under reduced pressure. Note that in the heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

With the heat treatment for the oxide semiconductor layer 422 in a nitrogen or inert gas atmosphere or under reduced pressure, the resistance of the exposed region of the oxide semiconductor layer 422 is reduced, and the oxide semiconductor layer 442 including regions with different resistances (shown as a shaded region and a white region in FIG. 6C) is formed.

Next, after a light-transmitting conductive film is formed over the oxide semiconductor layer 442 and the oxide insulating layer 426, the source electrode layer 425a and the drain electrode layer 425b are formed in a seventh photolithography step.

Then, the protection insulating layer 403 and the planarization insulating layer 404 are stacked over the oxide insulating layers 416 and 426, the source electrode layer 425a, and the drain electrode layer 425b.

A contact hole that reaches the drain electrode layer 425b is formed in the planarization insulating layer 404 and the protection insulating layer 403, and a light-transmitting conductive film is formed in the contact hole and over the planarization insulating layer 404. The light-transmitting conductive film is selectively etched to form the conductive layer 417 and the pixel electrode layer 427 that is electrically connected to the thin film transistor 448 (see FIG. 6D).

Through the above-described steps, with the use of nine masks, the thin film transistor 449 and the thin film transistor 448 can be separately manufactured in the driver circuit and the pixel portion, respectively, over one substrate. The thin film transistor 449 for the driver circuit is a channel-etched thin film transistor including the oxide semiconductor layer 443 which is entirely intrinsic. The thin film transistor 448 for a pixel is a channel protection thin film transistor including the oxide semiconductor layer 442 including the first high-resistance drain region 424a, the second high-resistance drain region 424b, and the channel formation region 423. Consequently, the thin film transistor 448 has increased withstand voltage because the high-resistance drain region serves as a buffer so that a localized high electric field is not applied to the thin film transistor 448 even when a high electric field is applied to the thin film transistor 448.

In addition, a storage capacitor that is constituted by a capacitor wiring layer and a capacitor electrode with the first gate insulating layer 402a and the second gate insulating layer 402b as dielectrics can be formed over the same substrate. The thin film transistors 448 and storage capacitors are arranged in matrix so as to correspond to individual pixels so that a pixel portion is formed and a driver circuit including the thin film transistor 449 is arranged around the pixel portion, whereby one of the substrates for manufacturing an active matrix display device can be obtained.

The conductive layer 417 is provided so as to overlap with a channel formation region in the oxide semiconductor layer 443, whereby in a bias-temperature stress test (referred to as a BT test) for examining the reliability of a thin film transistor, the amount of change in the threshold voltage of the thin film transistor 449 before and after the BT test can be reduced. The electric potential of the conductive layer 417 may be the same or different from that of the gate electrode layer 411. The conductive layer 417 can also function as a second gate electrode layer. Alternatively, the electric potential of the conductive layer 417 may be GND or 0 V, or the conductive layer 417 may be in a floating state.

(Embodiment 5)

In this embodiment, an example in which an active matrix liquid crystal display device is manufactured with the active matrix substrate described in Embodiment 1 will be described. Note that this embodiment can also be applied to any of the active matrix substrates described in Embodiments 2 to 4.

FIG. 7A illustrates an example of a cross-sectional structure of an active matrix substrate.

The thin film transistor in the driver circuit and the thin film transistor in the pixel portion over one substrate are illustrated in Embodiment 1; in this embodiment, a storage capacitor, a gate wiring, and a terminal portion of a source wiring are illustrated in addition to those thin film transistors for description. The capacitor, the gate wiring, and the terminal portion of the source wiring can be formed in the same manufacturing steps as in Embodiment 1 and can be manufactured without an increase in the number of photomasks and increase in the number of steps. Moreover, in a portion to serve as a display region in a pixel portion, all the gate wiring, the source wiring, and a capacitor wiring layer are formed using a light-transmitting conductive film, resulting in a high aperture ratio. Furthermore, a metal wiring can be used for the source wiring layer in a portion that does not serve as the display region in order to reduce the wiring resistance.

In FIG. 7A, a thin film transistor 210 is a channel-etched thin film transistor provided in a driver circuit, and in this embodiment, has the same structure as the thin film transistor 410 in Embodiment 1. A thin film transistor 220 that is electrically connected to a pixel electrode layer 227 is a channel protection thin film transistor provided in a pixel portion, and in this embodiment, has the same structure as the thin film transistor 410 in Embodiment 1.

A capacitor wiring layer 230 which is formed using the same light-transmitting material in the same step as a gate electrode layer of the thin film transistor 220 overlaps with a capacitor electrode 231, with a first gate insulating layer 202a and a second gate insulating layer 202b serving as dielectrics therebetween; thus, a storage capacitor is formed. The capacitor electrode 231 is formed using the same light-transmitting material in the same step as a source electrode layer or a drain electrode layer of the thin film transistor 220. Since the storage capacitor as well as the thin film transistor 220 has light transmitting properties, the aperture ratio can be increased.

The light-transmitting properties of the storage capacitor are important in increasing the aperture ratio. For small liquid crystal display panels of 10 inches or smaller in particular, a high aperture ratio can be achieved even when the pixel size is reduced in order to realize higher definition of display images by an increase in the number of gate wirings, for example. Moreover, the use of a light-transmitting film for components of the thin film transistor 220 and the storage capacitor makes it possible to achieve a high aperture ratio even when one pixel is divided into a plurality of subpixels in order to realize a wide viewing angle. That is, a high aperture ratio can be maintained even when a group of high-density thin film transistors is arranged, and the display region can have a sufficient area. For example, when one pixel includes two to four subpixels and storage capacitors, the storage capacitors have light-transmitting properties as well as the thin film transistors, so that the aperture ratio can be increased.

Note that the storage capacitor is provided below the pixel electrode layer 227, and the capacitor electrode 231 is electrically connected to the pixel electrode layer 227.

Although the example in which the storage capacitor is constituted by the capacitor electrode 231 and the capacitor wiring layer 230 is described in this embodiment, there is no particular limitation on the structure of the storage capacitor. For example, a storage capacitor may be formed in such a manner that, without providing a capacitor wiring layer, a pixel electrode layer overlaps with a gate wiring in an adjacent pixel, with a planarization insulating layer, a protection insulating layer, a first gate insulating layer, and a second gate insulating layer therebetween.

A plurality of gate wirings, source wirings, and capacitor wiring layers are provided in accordance with the pixel density. In the terminal portion, a plurality of first terminal electrodes having the same electric potential as the gate wiring, a plurality of second terminal electrodes having the same electric potential as the source wiring, a plurality of third terminal electrodes having the same electric potential as the capacitor wiring layer, and the like are arranged. There is no particular limitation on the number of each of the terminal electrodes, and the number of the terminals can be determined by a practitioner as appropriate.

In the terminal portion, the first terminal electrode which has the same electric potential as the gate wiring can be formed using the same light-transmitting material as the pixel electrode layer 227. The first terminal electrode is electrically connected to the gate wiring through a contact hole that reaches the gate wiring. The contact hole that reaches the gate wiring is formed by selective etching of a planarization insulating layer 204, a protection insulating layer 203, an oxide insulating layer 216, the second gate insulating layer 202b, and the first gate insulating layer 202a with the use of a photomask used for forming a contact hole for electrically connecting the drain electrode layer of the thin film transistor 220 and the pixel electrode layer 227.

A gate electrode layer of the thin film transistor 210 in the driver circuit may be electrically connected to a conductive layer 217 provided above an oxide semiconductor layer. In that case, a contact hole is formed by selective etching of the planarization insulating layer 204, the protection insulating layer 203, the oxide insulating layer 216, the second gate insulating layer 202b, and the first gate insulating layer 202a with the use of the photomask used for forming the contact hole for electrically connecting the drain electrode layer of the thin film transistor 220 and the pixel electrode layer 227. The conductive layer 217 and the gate electrode layer of the thin film transistor 210 in the driver circuit are electrically connected to each other through the contact hole.

A second terminal electrode 235 which has the same electric potential as a source wiring 234 in the driver circuit can be formed using the same light-transmitting material as the pixel electrode layer 227. The second terminal electrode 235 is electrically connected to the source wiring 234 through a contact hole that reaches the source wiring 234. The source wiring is a metal wiring, is formed using the same material in the same step as a source electrode layer of the thin film transistor 210, and has the same electric potential as the source electrode layer of the thin film transistor 210.

The third terminal electrode which has the same electric potential as the capacitor wiring layer 230 can be formed using the same light-transmitting material as the pixel electrode layer 227. Moreover, a contact hole that reaches the capacitor wiring layer 230 can be formed in the same step using the same photomask as that for forming a contact hole for electrically connecting the capacitor electrode 231 to the pixel electrode layer 227.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed to each other. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed electric potential such as GND or 0 V. The fourth terminal electrode can be formed using the same light-transmitting material as the pixel electrode layer 227.

There is no particular limitation on the structure where the source electrode layer of the thin film transistor 220 and the source electrode layer of the thin film transistor 210 are electrically connected to each other; for example, a connection electrode for connecting the source electrode layer of the thin film transistor 220 and the source electrode layer of the thin film transistor 210 may be formed in the same step as the pixel electrode layer 227. Furthermore, in the portion that does not serve as the display region, the source electrode layer of the thin film transistor 220 and the source electrode layer of the thin film transistor 210 may be in contact and overlap with each other.

Note that FIG. 7A illustrates a cross-sectional structure of the gate wiring 232 in the driver circuit. Since an example of a small liquid crystal display panel of 10 inches or smaller is described in this embodiment, the gate wiring 232 in the driver circuit is formed using the same light-transmitting material as the gate electrode layer of the thin film transistor 220.

When the same material is used for the gate electrode layer, the source electrode layer, the drain electrode layer, the pixel electrode layer, another electrode layer, and another wiring layer, a common sputtering target and a common manufacturing apparatus can be used, and thus the material costs and costs of an etchant (or an etching gas) used for etching can be reduced. Consequently, manufacturing costs can be reduced.

When a photosensitive resin material is used for the planarization insulating layer 204 in the structure in FIG. 7A, the step for forming a resist mask can be omitted.

FIG. 7B illustrates a cross-sectional structure, part of which is different from the structure in FIG. 7A. FIG. 7B is the same as FIG. 7A except that the planarization insulating layer 204 is not provided; therefore, the same parts are as those in FIG. 7A are denoted by the same reference numerals and detailed description of the parts is omitted. In FIG. 7B, the pixel electrode layer 227, the conductive layer 217, and the second terminal electrode 235 are formed on and in contact with the protection insulating layer 203.

With the structure in FIG. 7B, the step for forming the planarization insulating layer 204 can be omitted.

This embodiment can be freely combined with any of Embodiments 1 to 4.

(Embodiment 6)

In this embodiment, an example will be described in which part of a gate wiring is made from a metal wiring so that the wiring resistance is reduced, because there is a possibility that the resistance of a light-transmitting wiring might become a problem in the case where the size of a liquid crystal display panel exceeds 10 inches and reaches 60 inches and even 120 inches.

Note that in FIG. 8A, the same parts as in FIG. 7A are denoted by the same reference numerals and detailed description of the parts is omitted. Note that this embodiment can also be applied to any of the active matrix substrates described in Embodiments 1 to 4.

FIG. 8A illustrates an example in which part of a gate wiring in a driver circuit is made from a metal wiring and formed in contact with a light-transmitting wiring which is the same as the gate electrode layer of the thin film transistor 210. Note that the number of photomasks in this embodiment is larger than that in Embodiment 1 due to the formation of the metal wiring.

First, a heat-resistant conductive material film (with a thickness of 100 nm to 500 nm inclusive) that can withstand first heat treatment for dehydration or dehydrogenation is formed over a substrate 200.

In this embodiment, a 370-nm-thick tungsten film as a first metal wiring layer and a 50-nm-thick tantalum nitride film as a second metal wiring layer are formed. Although a stack of the tantalum nitride film and the tungsten film is used as the conductive film here, there is no particular limitation and the conductive film may be formed using an element selected from Ta, W, Ti, Mo, Al, and Cu; an alloy containing any of these elements as its component, an alloy containing the above elements in combination, or a nitride containing any of these elements as its component. The heat-resistant conductive material film is not limited to a single layer containing the above-described element and may be a stack of two or more layers.

In a first photolithography step, metal wirings are formed to form a first metal wiring layer 236 and a second metal wiring layer 237 are formed. An ICP (inductively coupled plasma) etching method is preferably used for etching of the tungsten film and the tantalum nitride film. The films can be etched into desired tapered shapes by an ICP etching method with appropriate adjustment of the etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in forming a light-transmitting conductive film thereon can be reduced.

Then, after the light-transmitting conductive film is formed, a gate wiring layer 238, a gate electrode layer of the thin film transistor 210, and a gate electrode layer of the thin film transistor 220 are formed in a second photolithography step. The light-transmitting conductive film is formed using any of the conductive materials that transmit visible light, which are described in Embodiment 1.

Note that for example, if there is an interface between the gate wiring layer 238 and the first metal wiring layer 236 or the second metal wiring layer 237, an oxide film could be formed with later heat treatment or the like and the contact resistance could be increased depending on the material of the light-transmitting conductive film. For that reason, the second metal wiring layer 237 is preferably formed using a metal nitride film that prevents oxidation of the first metal wiring layer 236.

Next, a gate insulating layer, an oxide semiconductor layer, and the like are formed in the same steps as in Embodiment 1. Subsequent steps are performed in accordance with Embodiment 1 to complete the active matrix substrate.

Further, in this embodiment, an example in which after the formation of the planarization insulating layer 204, the planarization insulating layer in a terminal portion is selectively removed using a photomask is described. It is preferable that the planarization insulating layer be not placed in the terminal portion so that the terminal portion can be connected to an FPC in a favorable manner.

In FIG. 8A, the second terminal electrode 235 is formed over the protection insulating layer 203. FIG. 8A illustrates the gate wiring layer 238 which overlaps with part of the second metal wiring layer 237; alternatively, the gate wiring layer 238 may cover all the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, a first terminal electrode that has the same electric potential as the gate wiring is formed over the protection insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring layer and a capacitor wiring layer in a portion that does not serve as a display region.

FIG. 8B illustrates a cross-sectional structure, part of which is different from the structure in FIG. 8A. FIG. 8B is the same as FIG. 8A except for a material of the gate electrode layer in the thin film transistor in the driver circuit; therefore, the same portions are denoted by the same reference numerals and detailed description of the same portions is not repeated.

FIG. 8B illustrates an example in which the gate electrode layer in the thin film transistor in the driver circuit is made from a metal wiring. In the driver circuit, a material of the gate electrode layer is not limited to a light-transmitting material.

In FIG. 8B, a thin film transistor 240 in the driver circuit includes a gate electrode layer in which a second metal wiring layer 241 is stacked over a first metal wiring layer 242. Note that the first metal wiring layer 242 can be formed using the same material in the same step as the first metal wiring layer 236. Moreover, the second metal wiring layer 241 can be formed using the same material in the same step as the second metal wiring layer 237.

In the case where the first metal wiring layer 242 is electrically connected to the conductive layer 217, it is preferable to use a metal nitride film for the second metal wiring layer 241 for preventing oxidation of the first metal wiring layer 242.

In this embodiment, metal wirings are used for some wirings so that the wiring resistance is reduced; high definition of display images can be achieved and a high aperture ratio can be realized even when the size of a liquid crystal display panel exceeds 10 inches and reaches 60 inches and even 120 inches.

(Embodiment 7)

Figure 9A:
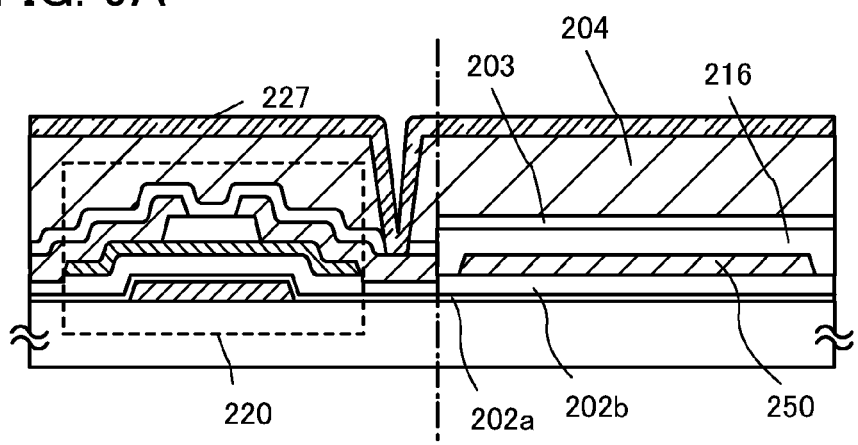
FIGS. 9A and 9B are views each illustrating a semiconductor device.
Figure 9B:
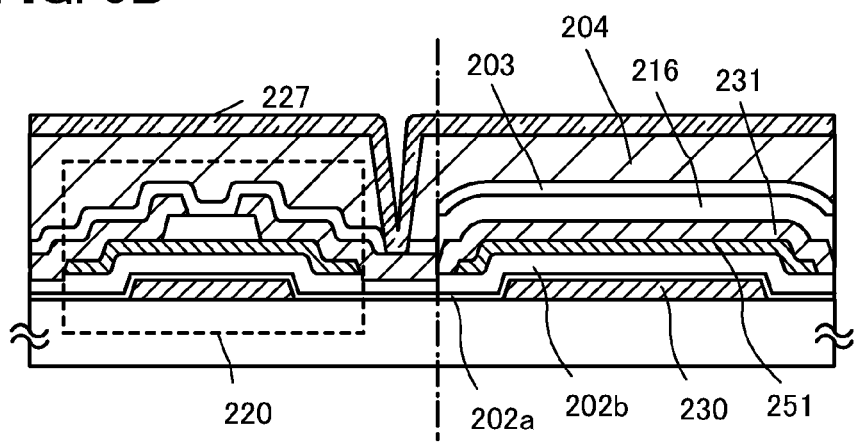

In this embodiment, an example of a structure of a storage capacitor, which is different from that in Embodiment 5, is illustrated in FIGS. 9A and 9B. FIG. 9A is the same as FIG. 7A except for a structure of the storage capacitor; therefore, the same parts as in FIG. 7A are denoted by the same reference numerals and detailed description of the parts is omitted. FIG. 9A illustrates a cross-sectional structure of the thin film transistor 220 in a pixel portion and a storage capacitor.

FIG. 9A illustrates an example in which the storage capacitor is constituted by the pixel electrode layer 227 and a capacitor wiring layer 250 that overlaps with the pixel electrode layer 227 with the oxide insulating layer 216, the protection insulating layer 203, and the planarization insulating layer 204 serving as dielectrics. Since the capacitor wiring layer 250 is formed using the same light-transmitting material in the same step as the source electrode layer of the thin film transistor 220 in the pixel portion, the capacitor wiring layer 250 is arranged so as not to overlap with a source wiring layer of the thin film transistor 220.

In the storage capacitor illustrated in FIG. 9A, a pair of electrodes and the dielectrics have light-transmitting properties, and thus the storage capacitor as a whole has light-transmitting properties.

FIG. 9B illustrates an example of a structure of the storage capacitor, which is different from that in FIG. 9A. FIG. 9B is also the same as FIG. 7A except for a structure of the storage capacitor; therefore, the same parts as in FIG. 7A are denoted by the same reference numerals and detailed description of the parts is omitted.

FIG. 9B illustrates an example in which the storage capacitor is constituted by the storage wiring layer 230 and a stack of an oxide semiconductor layer 251 that overlaps with the storage wiring layer 230 and the capacitor electrode 231 with the first gate insulating layer 202a and the second gate insulating layer 202b serving as dielectrics. The capacitor electrode 231 is stacked on and in contact with the oxide semiconductor layer 251 and functions as one electrode of the storage capacitor. Note that the oxide semiconductor layer 251 is formed using the same light-transmitting material in the same step as the source electrode layer or the drain electrode layer of the thin film transistor 220. Moreover, since the capacitor wiring layer 230 is formed using the same light-transmitting material in the same step as the gate electrode layer of the thin film transistor 220, the capacitor wiring layer 230 is arranged so as not to overlap with a gate wiring layer of the thin film transistor 220.

The capacitor electrode 231 is electrically connected to the pixel electrode layer 227.

Also in the storage capacitor illustrated in FIG. 9B, a pair of electrodes and the dielectrics have light-transmitting properties, and thus the storage capacitor as a whole has light-transmitting properties.

Each of the storage capacitors illustrated in FIGS. 9A and 9B has light-transmitting properties; thus, sufficient capacitance can be obtained and a high aperture ratio can be obtained even when the pixel size is reduced in order to realize higher definition of display images, for example, by an increase in the number of gate wirings.

This embodiment can be freely combined with any of the other embodiments.

(Embodiment 8)

In this embodiment, an example will be described below in which at least some of driver circuits and a thin film transistor placed in a pixel portion are formed over one substrate.

The thin film transistor placed in the pixel portion is formed in accordance with any of Embodiments 1 to 4. Since the thin film transistor described in any of Embodiments 1 to 4 is an n-channel TFT, some of driver circuits that can be constituted by n-channel TFTs among the driver circuits are formed over a substrate over which the thin film transistor in the pixel portion is formed.

Figure 14A:
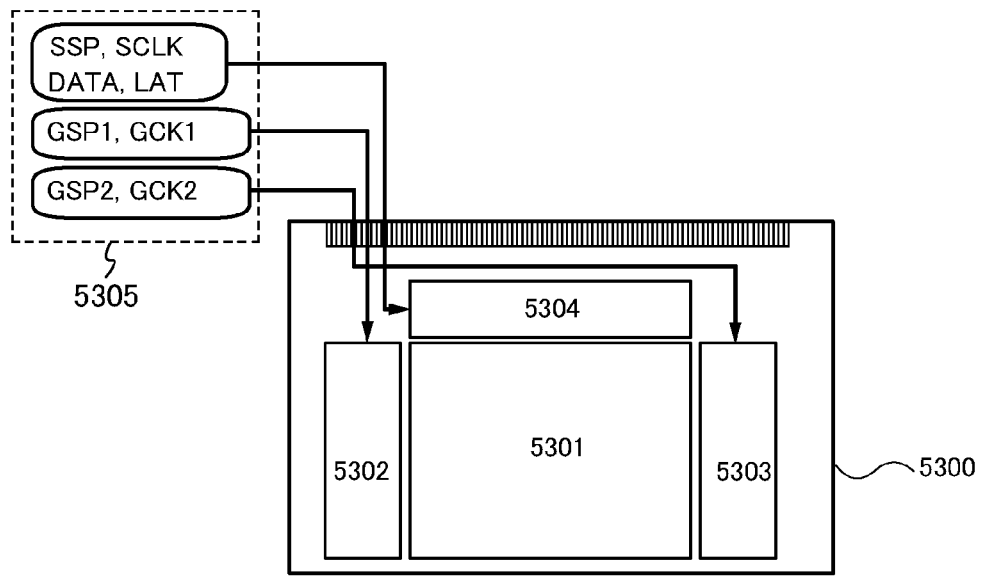
FIGS. 14A and 14B are block diagrams each illustrating a semiconductor device.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as a flexible printed circuit (FPC).

In FIG. 14A, the first scan line driver circuit 5302, the second scan line driver circuit 5303, and the signal line driver circuit 5304 are formed over the substrate 5300 where the pixel portion 5301 is formed. Thus, the number of components of a driver circuit and the like that are externally provided is reduced, which results in a reduction in costs. Moreover, the number of connections in the connection portion in the case where wirings are extended from a driver circuit provided outside the substrate 5300 can be reduced, and the reliability or yield can be improved.

Note that the timing control circuit 5305 supplies, for example, a first scan line driver circuit start signal (GSP1) (also referred to as a start pulse) and a scan line driver circuit clock signal (GCK1) to the first scan line driver circuit 5302. Furthermore, the timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
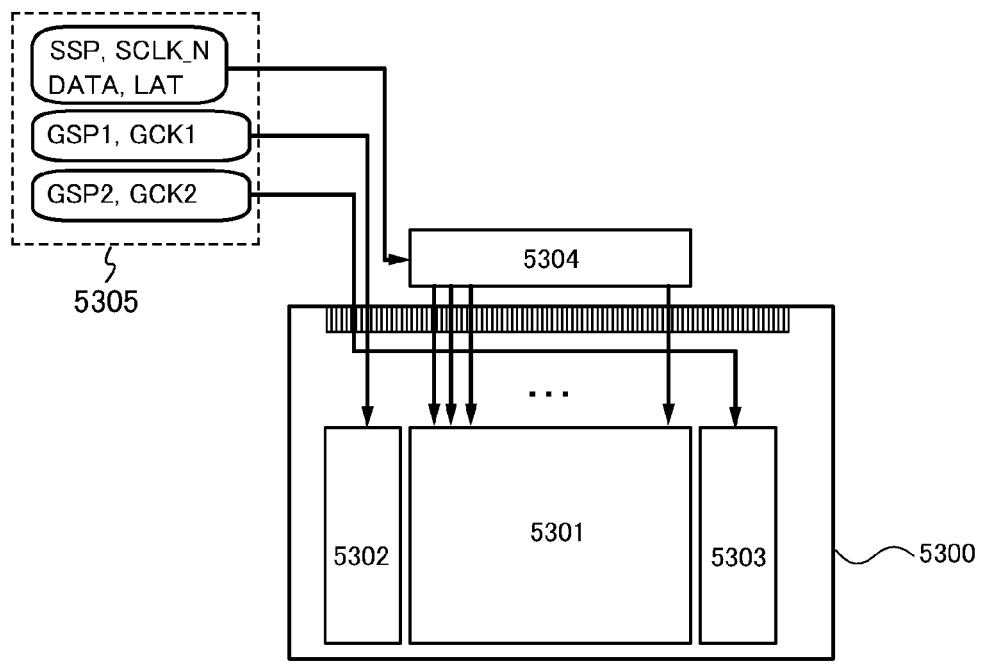

FIG. 14B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed.

Figure 15A:
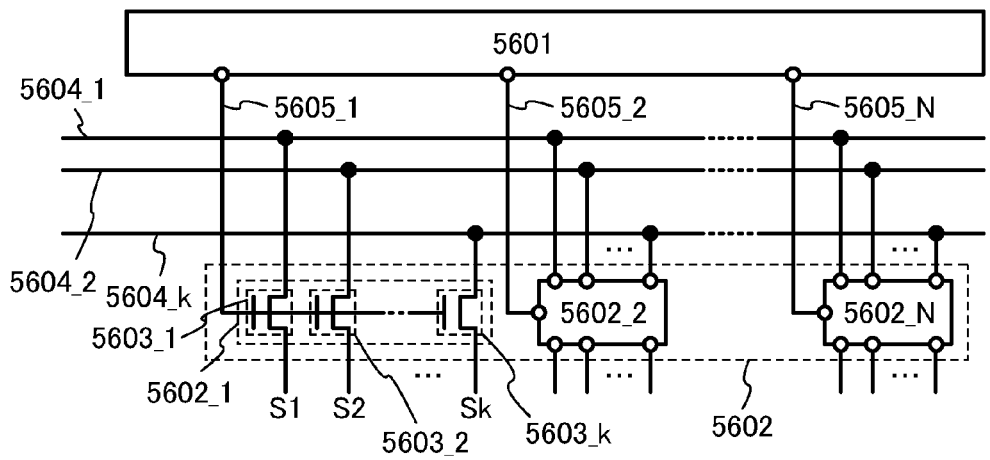
FIGS. 15A and 15B are a circuit diagram and a timing chart of a signal line driver circuit, respectively.
Figure 15B:
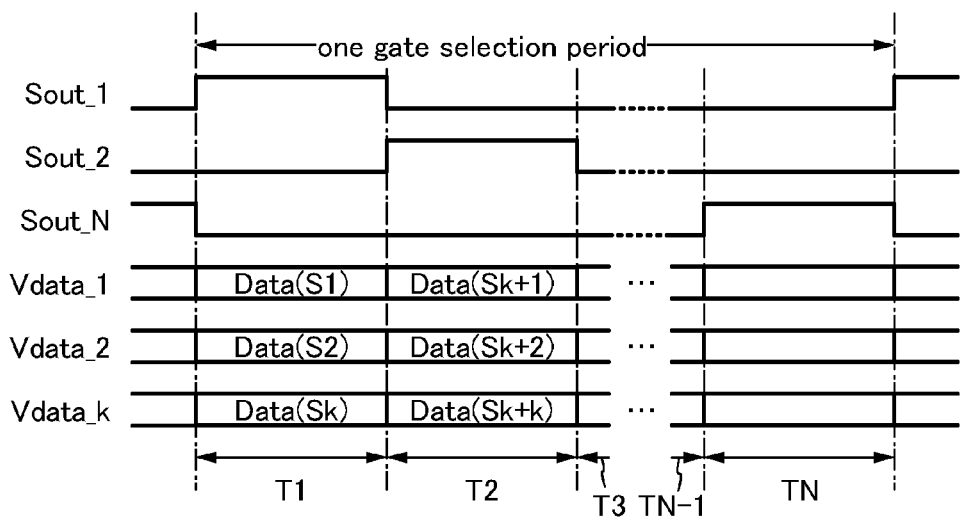

The thin film transistors described in Embodiments 1 to 4 are n-channel TFTs. FIGS. 15A and 15B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). The example in which the thin film transistors 5603_1 to 5603_k are n-channel TFTs is described below.

A connection relation in the signal line driver circuit is described using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling a conduction state between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines Si to Sk. In this manner, the switching circuit 5602_1 functions as a selector. Moreover, the thin film transistors 5603_1 to 5603_k have a function of controlling a conduction state between the wirings 5604_1 to 5604_k and the signal lines Si to Sk, respectively, that is, a function of supplying potentials of the wirings 5604_1 to 5604_k are supplied to the signal lines S1 to Sk, respectively. In this manner, each of the thin film transistors 5603_1 to 5603_k functions as a switch.

The video signal data (DATA) is input to each of the wirings 5604_1 to 5604_k. The video signal data (DATA) is often an analog signal corresponding to an image signal or image data.

Next, the operation of the signal line driver circuit in FIG. 15A will be described with reference to a timing chart of FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawing and the like.

In the periods T1 to TN, the shift register 5601 sequentially outputs an H-level signals to the wirings 5605_1 to 5605_N. For example, in the period T1, the shift register 5601 outputs an H-level signal to the wiring 5605_1. Then, the thin film transistors 5603_1 to 5603_k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in a selected row through the thin film transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors in Embodiments 1 to 4 can be used for the shift register 5601 and the switching circuit 5602.

One embodiment of a shift register which is used for part of the scan line driver circuit and/or the signal line driver circuit will be described with reference to FIGS. 16A to 16D and FIGS. 17A and 17B.

The scan line driver circuit includes a shift register. The scan line driver circuit may additionally include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply a large current is used.

Figure 16A:
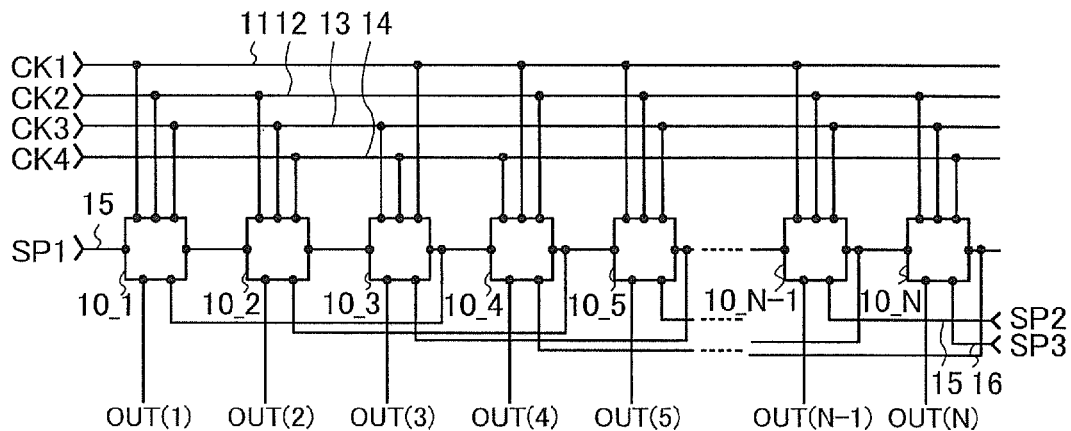
FIGS. 16A to 16D are views each illustrating a configuration of a shift register.

The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n (n is a natural number greater than or equal to 2 and less than or equal to N) in the second or later stage, a signal from the pulse output circuit in the preceding stage (such a signal is referred to as a preceding-stage signal OUT(n−1)) is input. A signal from the third pulse output circuit 10_3 in the stage that is two stages after the first pulse output circuit 10_1 is also input to the first pulse output circuit 10_1. In a similar manner, a signal from the (n+2)th pulse output circuit 10_(n+2) in the stage that is two stages after the nth pulse output circuit 10_n (such a signal is referred to as a later-stage signal OUT(n+2)) is input to the nth pulse output circuit 10_n in the second or later stage. Thus, the pulse output circuits in the respective stages output first output signals (OUT(1)(SR) to OUT (N)(SR)) to be input to the pulse output circuits in the respective subsequent stages and/or the pulse output circuits in the stages that are two stages before the respective pulse output circuits and second output signals (OUT(1) to OUT (N)) to be input to other circuits or the like. Note that as illustrated in FIG. 16A, since the later-stage signal OUT(n+2) is not input to the pulse output circuits in the last two stages of the shift register, for example, a second start pulse SP2 and a third start pulse SP3 may be additionally input to the respective pulse output circuits.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially (i.e., they are 90° out of phase with each other). In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 16B:
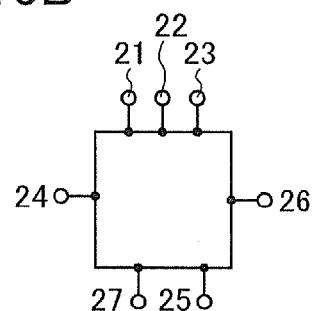
Figure 16C:
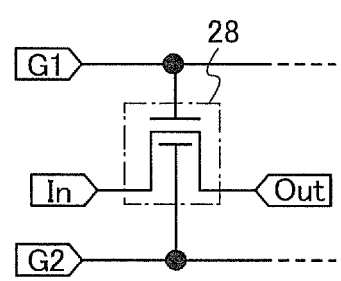

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a later-stage signal OUT(3) is input to the fifth input terminal 25; the first output signal OUT(1)(SR) is output from the first output terminal 26; and the second output signal OUT(1) is output from the second output terminal 27.

In the first to Nth pulse output circuits 10_1 to 10_N, the thin film transistor (TFT) having four terminals described in the above embodiment can be used in addition to a thin film transistor with three terminals. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of a thin film transistor with four terminals can be controlled to be a desired value by control of the electric potential of the upper gate electrode and/or the lower gate electrode.

Next, an example of a specific circuit configuration of the pulse output circuit illustrated in FIG. 16B will be described with reference to FIG. 16D.

Figure 16D:
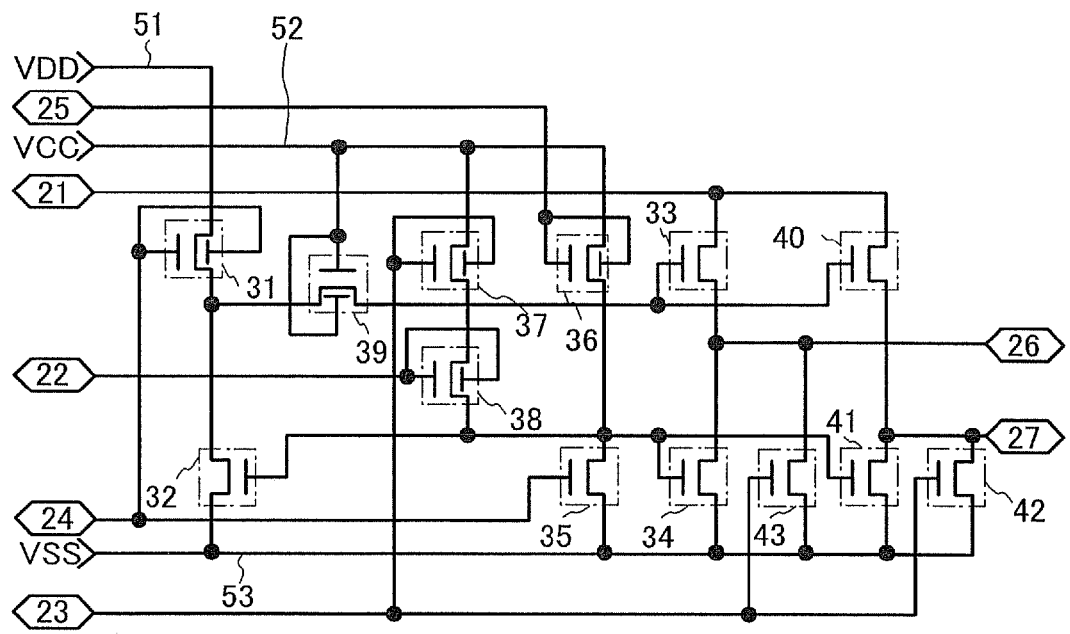

The pulse output circuit illustrated in FIG. 16D includes a first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 16D is as follows: the first power supply potential VDD is higher than or equal to the second power supply potential VCC, and the second power supply potential VCC is higher than the third power supply potential VSS. Note that the first to fourth clock signals (CK1) to (CK4) alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in the threshold voltage of the transistor can be reduced, and degradation of the transistor can be suppressed without an adverse effect on the operation of the transistor. A thin film transistor with four terminals is preferably used as the first transistor 31 and the sixth to ninth transistors 36 to 39 among the first to thirteenth transistors 31 to 43. The first transistor 31 and the sixth to ninth transistors 36 to 39 need to operate so that a potential of a node to which one electrode serving as a source or a drain is connected is switched with a control signal of the gate electrode, and can further reduce a malfunction of the pulse output circuit because response to the control signal input to the gate electrode is fast (the rise of on-state current is steep). Thus, with the use of the thin film transistor with four terminals, the threshold voltage can be controlled, and a malfunction of the pulse output circuit can be further prevented.

In FIG. 16D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16D, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 17A).

Figure 17A:
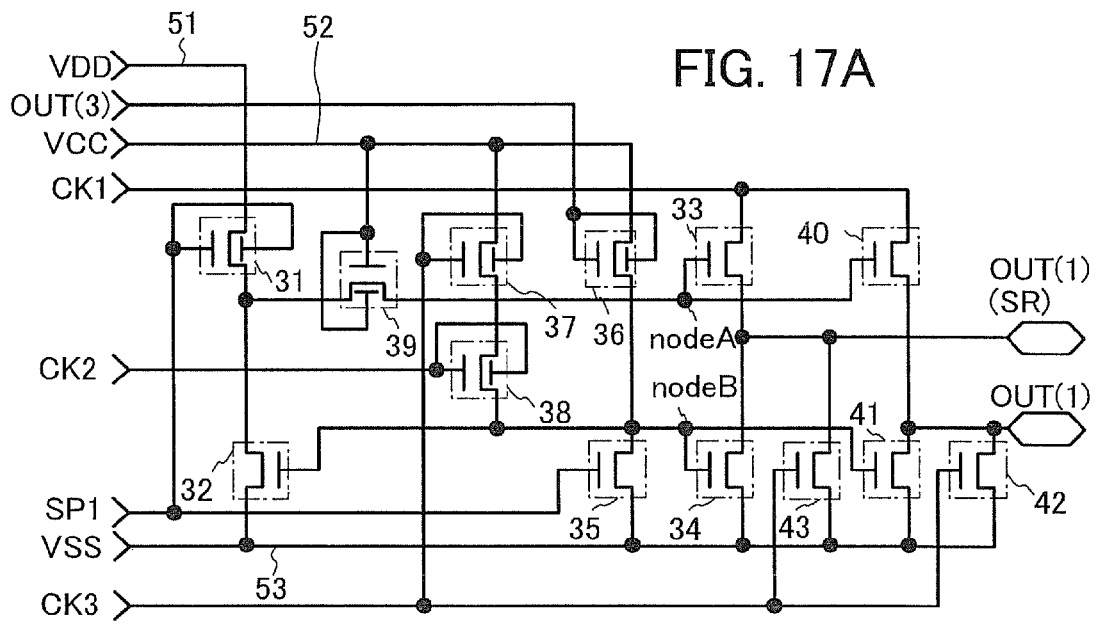
FIGS. 17A and 17B are a circuit diagram and a timing chart of a shift register, respectively.

FIG. 17A illustrates signals that are input to or output from the first to fifth input terminals 21 to 25 and the first and second output terminals 26 and 27 in the case where the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the later-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal, respectively.

Note that in FIG. 16D and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
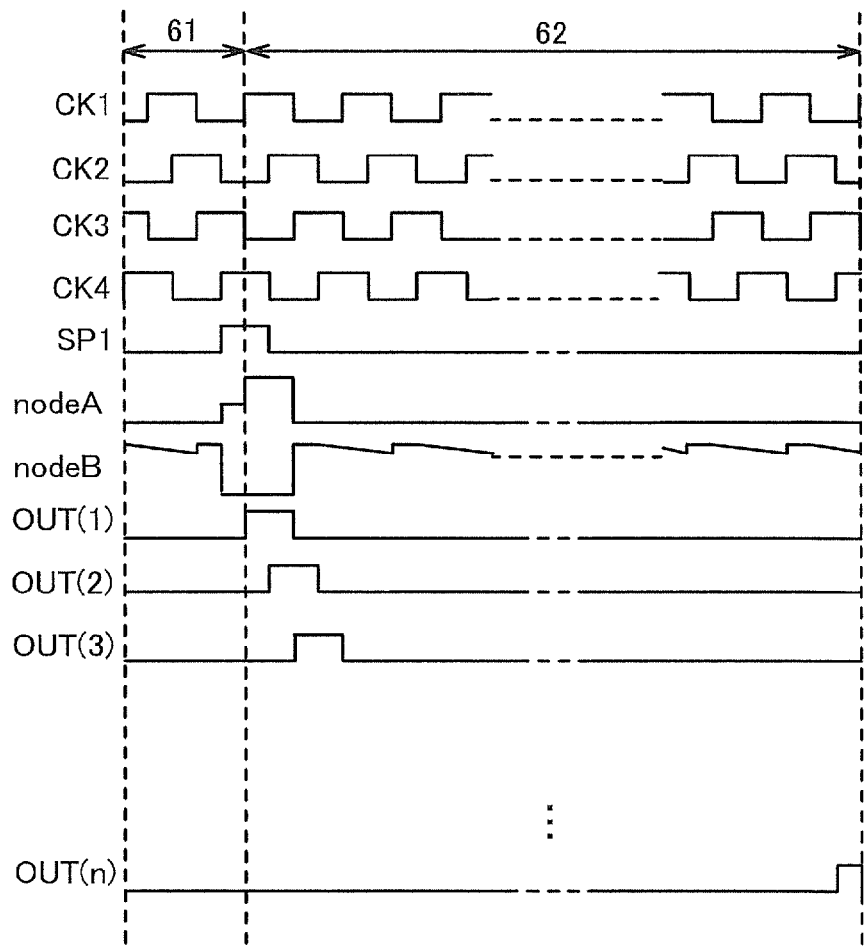

FIG. 17B is a timing chart of a shift register including a plurality of pulse output circuits illustrated in FIG. 17A. Note that when the shift register is included in a scan line driver circuit, a period 61 in FIG. 17B corresponds to a vertical retrace period and a period 62 corresponds to a gate selection period.

Note that the placement of the ninth transistor 39 in which the second power supply potential VCC is applied to the gate electrode as illustrated in FIG. 17A has the following advantages before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, a high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, the placement of the ninth transistor 39 makes it possible to lower the level of the negative bias voltage applied between the gate and the source of the first transistor 31. Thus, the circuit configuration in this embodiment allows a negative bias voltage applied between the gate and the source of the first transistor 31 to be reduced, whereby deterioration of the first transistor 31 due to stress can be prevented.

Note that the ninth transistor 39 can be provided anywhere as long as the first terminal and the second terminal of the ninth transistor 39 are connected between the second terminal of the first transistor 31 and the gate of the third transistor 33. Note that in the case where the shift register including a plurality of pulse output circuits in this embodiment is included in a signal line driver circuit having a larger number of stages than a scan line driver circuit, the ninth transistor 39 can be omitted, which results in a reduction in the number of transistors.

Note that an oxide semiconductor is used for a semiconductor layer in each of the first to thirteenth transistors 31 to 43, and thus the off-state current of the thin film transistors can be reduced, the on-state current and field effect mobility can be increased, and the degree of degradation of the transistors can be reduced. As a result, a malfunction in the circuit can be prevented. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 are supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in the potentials of the second input terminal 22 and the third input terminal 23 is caused twice by fall in the potential of the gate electrode of the seventh transistor 37 and fall in the potential of the gate electrode of the eighth transistor 38. On the other hand, when a state of the seventh transistor 37 and the eighth transistor 38 in the shift register illustrated in FIG. 17A is changed as in the period in FIG. 17B so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 is reduced to one, which is caused by fall in potential of the gate electrode of the eighth transistor 38. Consequently, it is preferable to use connection relation in which the clock signal is supplied to the gate electrodes (the lower gate electrode and the upper gate electrode) of the seventh transistor 37 from the third input terminal 23, and the clock signal is supplied to the gate electrodes (the lower gate electrode and the upper gate electrode) of the eighth transistor 38 from the second input terminal 22, since noise can be reduced by a reduction in fluctuation in potential of the node B.

In such a manner, an H-level signal is regularly supplied to the node B in a period during which the potentials of the first output terminal 26 and the second output terminal 27 are held at L level; thus, a malfunction of the pulse output circuit can be prevented.

(Embodiment 9)

A thin film transistor is manufactured, and a semiconductor device having a display function (also referred to as a display device) can be manufactured using the thin film transistor in a pixel portion and also in a driver circuit. Moreover, part of the driver circuit or the entire driver circuit, which includes a thin film transistor can be formed over a substrate where a pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a unit for supplying current to the display element in each of a plurality of pixels. Specifically, the element substrate may be in a state in which only a pixel electrode of the display element is formed, a state after formation of a conductive film to be a pixel electrode and before etching of the conductive film to form the pixel electrode, or any other states.

Note that a display device in this specification refers to an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 10A1, 10A2, and 10B. FIGS. 10A1 and 10A2 are plan views of panels in which thin film transistors 4010 and 4011 and a liquid crystal element 4013 are sealed between a first substrate 4001 and a second substrate 4006 with a sealant 4005. FIG. 10B is a cross-sectional view taken along line M-N in FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A1 illustrates an example in which the signal line driver circuit 4003 is mounted by a COG method. FIG. 10A2 illustrates an example in which the signal line driver circuit 4003 is mounted by a TAB method.

The pixel portion 4002 and the scan line driver circuit 4004 provided over the first substrate 4001 each include a plurality of thin film transistors. FIG. 10B illustrates, as an example, the thin film transistor 4010 included in the pixel portion 4002 and the thin film transistor 4011 included in the scan line driver circuit 4004. Insulating layers 4041, 4042, 4020, and 4021 are provided over the thin film transistors 4010 and 4011.

Any of the highly reliable thin film transistors including the oxide semiconductor layers which are described in Embodiments 1 to 4 can be used as the thin film transistors 4010 and 4011. The thin film transistor 410 or the thin film transistor 499 described in Embodiments 1 to 4 can be used as the thin film transistor 4011 for the driver circuit. The thin film transistor 420 or the thin film transistor 498 can be used as the thin film transistor 4010 for a pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in the threshold voltage of the thin film transistor 4011 before and after the BT test can be reduced. The electric potential of the conductive layer 4040 may be the same or different from that of a gate electrode layer of the thin film transistor 4011. The conductive layer 4040 can also function as a second gate electrode layer. Alternatively, the electric potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramic, or plastic can be used. As plastics, a fiberglass-reinforced plastic (FRP) plate, a polyvinyl fluoride (PVF) film, a polyester film, or an acrylic resin film can be used.

A columnar spacer denoted by reference numeral 4035 is obtained by selective etching of an insulating film and is provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between the pair of substrates using the common connection portion. Note that the conductive particles are included in the sealant 4005.

Alternatively, liquid crystals exhibiting a blue phase for which an alignment film is unnecessary may be used. The blue phase is one of liquid crystal phases, which appears just before a cholesteric phase changes into an isotropic phase while the temperature of a cholesteric liquid crystal is increased. Since the blue phase only appears within a narrow range of temperature, the liquid crystal layer 4008 is formed using a liquid crystal composition in which a chiral agent is mixed at 5 wt % or more in order to increase the temperature range. The liquid crystal composition including liquid crystals exhibiting a blue phase and a chiral agent has a short response time of 1 msec or less and is optically isotropic; thus, alignment treatment is not needed and viewing angle dependence is small.

Note that this embodiment can be applied to a transflective liquid crystal display device as well as a transmissive liquid crystal display device.

In the example of the liquid crystal display device, a polarizing plate is provided on the outer surface of the substrate (on the viewer side) and a coloring layer (a color filter) and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or the conditions of the manufacturing process. Further, a light-blocking film serving as a black matrix may be provided except in the display portion.

In the thin film transistor 4011, the insulating layer 4041 is formed in contact with the semiconductor layer including the channel formation region, as a protection insulating film. In the thin film transistor 4010, the insulating layer 4042 is formed as a channel protection layer. The insulating layers 4041 and 4042 can be formed using a material and method which are similar to those of the oxide insulating layers 466 and 476 described in Embodiment 1. Moreover, the insulating layer 4021 functioning as a planarization insulating film covers the thin film transistors in order to reduce surface unevenness of the thin film transistors. Here, as the insulating layers 4041 and 4042, a silicon oxide film is formed by a sputtering method according to Embodiment 1.

The insulating layer 4020 is formed over the insulating layers 4041 and 4042. The insulating layer 4020 can be formed using a material and a method which are similar to those of the protection insulating layer 403 described in Embodiment 1. Here, a silicon nitride film is formed by an RF sputtering method as the insulating layer 4020.

The insulating layer 4021 is formed as the planarization insulating film. The insulating layer 4021 can be formed using a material and a method which are similar to those of the planarization insulating layer 454 described in Embodiment 1, and a heat-resistant organic material such as polyimide, acrylic, benzocyclobutene, polyamide, or epoxy can be used. Other than such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

In this embodiment, a plurality of thin film transistors in the pixel portion may be surrounded together by a nitride insulating film. It is possible to use a nitride insulating film as the insulating layer 4020 and the gate insulating layer and to provide a region where the insulating layer 4020 is in contact with the gate insulating layer so as to surround at least the periphery of the pixel portion over the active matrix substrate as illustrated in FIGS. 10A1, 10A2, and 10B. In this manufacturing process, water can be prevented from entering from the outside. Moreover, entry of water from the outside can be prevented in the long term even after a device is completed as a semiconductor device, for example, as a display device; thus, the long-term reliability of the device can be achieved.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be employed depending on the material: a sputtering method, an SOG method, a spin coating method, a dipping method, a spray coating method, or a droplet discharge method (e.g., an ink-jet method, screen printing, or offset printing), a roll coating method, a curtain coating method, a knife coating method, or the like. The baking step of the insulating layer 4021 also serves as annealing of the semiconductor layer, whereby a semiconductor device can be efficiently manufactured.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms or lower per square and a light transmittance of 70% or higher at a wavelength of 550 nm. The sheet resistance is preferably lower. Further, the resistivity of the conductive high molecule included in the conductive composition is preferably 0.1 Ω·cm or lower.

As the conductive high molecule, a so-called π-electron conjugated conductive polymer can be used. As examples, polyaniline and a derivative thereof, polypyrrole and a derivative thereof, polythiophene and a derivative thereof, and a copolymer of two or more kinds of these materials are given.

Further, a variety of signals and electric potentials are supplied from an FPC 4018 to the signal line driver circuit 4003 which is separately formed, the scan line driver circuit 4004, or the pixel portion 4002.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that, although FIGS. 10A1, 10A2, and 10B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
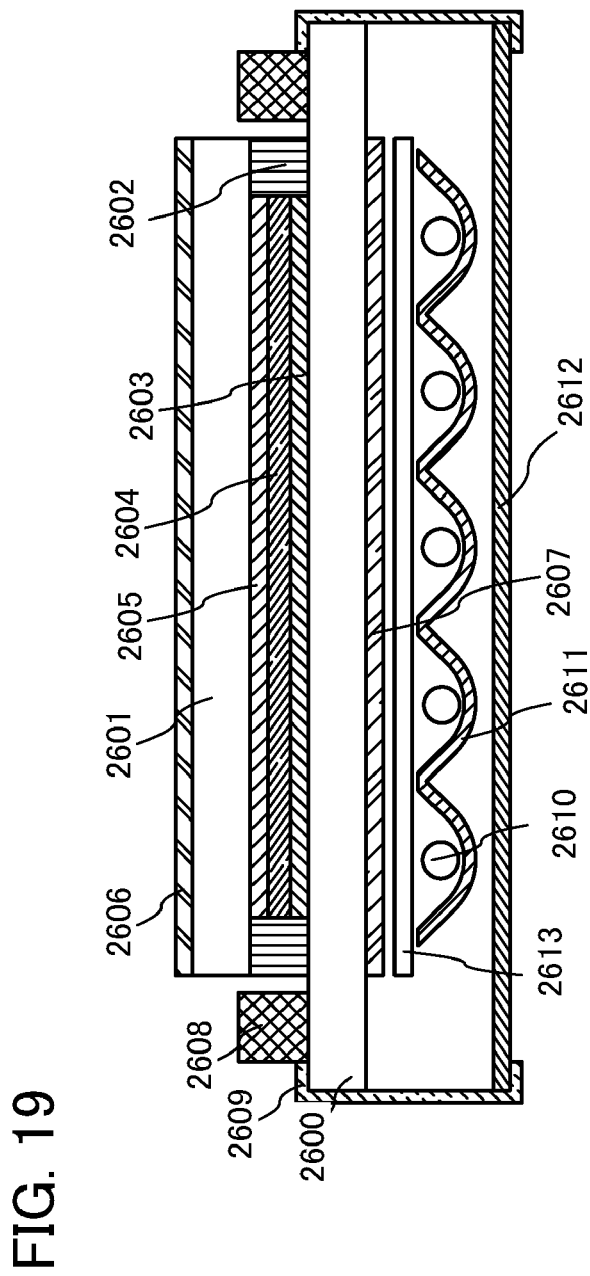
FIG. 19 is a view illustrating a semiconductor device.

FIG. 19 illustrates an example of a liquid crystal display module which is formed as a semiconductor device with the use of a TFT substrate 2600 manufactured according to the manufacturing method disclosed in this specification.

FIG. 19 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflection plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above-described steps, a highly reliable liquid crystal display panel can be manufactured as a semiconductor device.

This embodiment can be implemented in appropriate combination with any of the structures described in the other embodiments.

(Embodiment 10)

In this embodiment, an example of electronic paper will be described as one embodiment of a semiconductor device.

The semiconductor device can be used for electronic paper in which electronic ink is driven by an element electrically connected to a switching element. The electronic paper is also referred to as an electrophoretic display device (an electrophoretic display) and has advantages such as the same level of readability as regular paper, lower power consumption than other display devices, thinness, and lightness in weight.

Electrophoretic displays can have various modes. Electrophoretic displays contain a plurality of microcapsules dispersed in a solvent or a solute, each of which contains first particles that are positively charged and second particles that are negatively charged. By application of an electric field to the microcapsules, the particles in the microcapsules move in opposite directions to each other and only the color of the particles gathering on one side is displayed. Note that the first particles and the second particles each include a pigment and do not move without an electric field. Moreover, the first particles and the second particles have different colors (which may be colorless).

In this way, an electrophoretic display utilizes a so-called dielectrophoretic effect by which a substance having a high dielectric constant moves to a high-electric field region. The electrophoretic display device does not need to use a polarizing plate which is required in a liquid crystal display device.

A solution in which the above-described microcapsules are dispersed in a solvent is referred to as electronic ink. This electronic ink can be printed on a surface of glass, plastic, cloth, paper, or the like. Furthermore, color display is possible with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate formed using the thin film transistor in any of Embodiments 1 to 4 can be used.

Note that the first particles and the second particles in the microcapsules may be formed using one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 18:
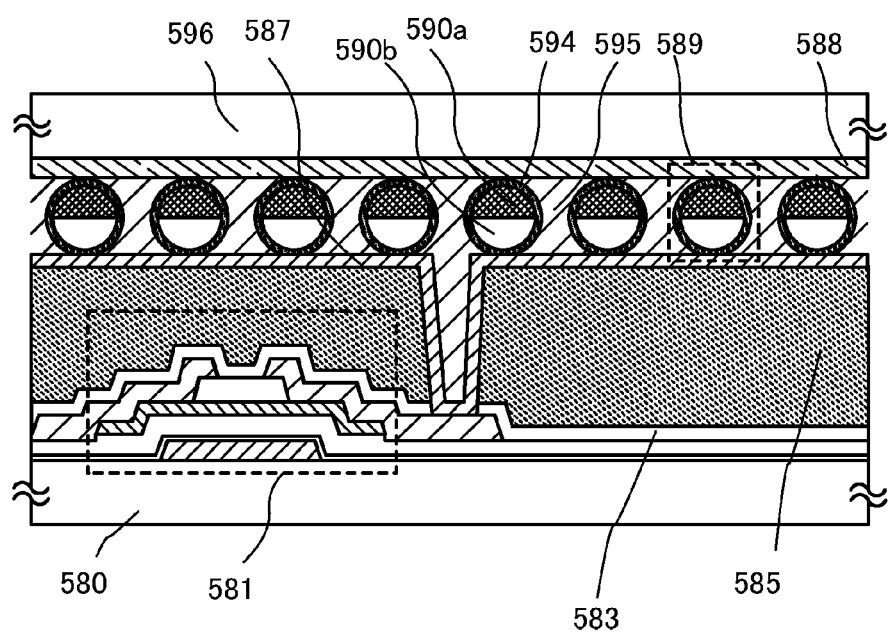
FIG. 18 is a view illustrating a semiconductor device.

FIG. 18 illustrates active matrix electronic paper as an example of a semiconductor device. A thin film transistor 581 used for the semiconductor device can be formed in a manner similar to the thin film transistor described in Embodiment 1 and is a highly reliable thin film transistor including an oxide semiconductor layer. Moreover, any of the thin film transistors described in Embodiments 2 to 4 can also be used as the thin film transistor 581 in this embodiment.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and an electric potential difference is generated between the first electrode layer and the second electrode layer to control the orientation of the spherical particles, whereby display is performed.

The thin film transistor 581 formed over a substrate 580 is a bottom-gate thin film transistor and covered with an insulating film 583 that is in contact with a semiconductor layer. A source electrode layer or a drain electrode layer of the thin film transistor 581 is in contact with a first electrode layer 587 through an opening formed in an insulating layer 583 and an insulating layer 585, whereby the thin film transistor 581 is electrically connected to the first electrode layer 587. Spherical particles 589 are provided between the first electrode layer 587 and a second electrode layer 588 formed on a substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the substrate where the thin film transistor 581 is formed. With the use of a common connection portion, the second electrode layer 588 and the common potential line can be electrically connected to each other through conductive particles provided between the pair of substrates.

Alternatively, it is possible to use an electrophoretic element instead of the twisting ball. A microcapsule having a diameter of approximately 10 μm to 200 μm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, whereby white or black can be displayed. A display element using this principle is an electrophoretic display element, and a device using the electrophoretic display element is generally called electronic paper. The electrophoretic display element has higher reflectance than a liquid crystal display element; thus, an auxiliary light is not needed, power consumption is low, and a display portion can be recognized in a dim place. In addition, even when power is not supplied to the display portion, an image which has been displayed can be maintained. Thus, a displayed image can be stored even if a semiconductor device having a display function (which is referred to simply as a display device or a semiconductor device provided with a display device) is kept away from a source of electric waves.

Through the above-described steps, a highly reliable electronic paper can be manufactured as a semiconductor device.

This embodiment can be implemented in appropriate combination with any of the structures described in the other embodiments.

(Embodiment 11)

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element and the latter is referred to as an inorganic EL element.

In an organic EL element, by application of voltage to the light-emitting element, electrons and holes are separately injected from a pair of electrodes into a layer containing a light-emitting organic compound, and thus current flows. The carriers (electrons and holes) are recombined, and thus the light-emitting organic compound is excited. When the light-emitting organic compound returns to a ground state from the excited state, light is emitted. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 12:
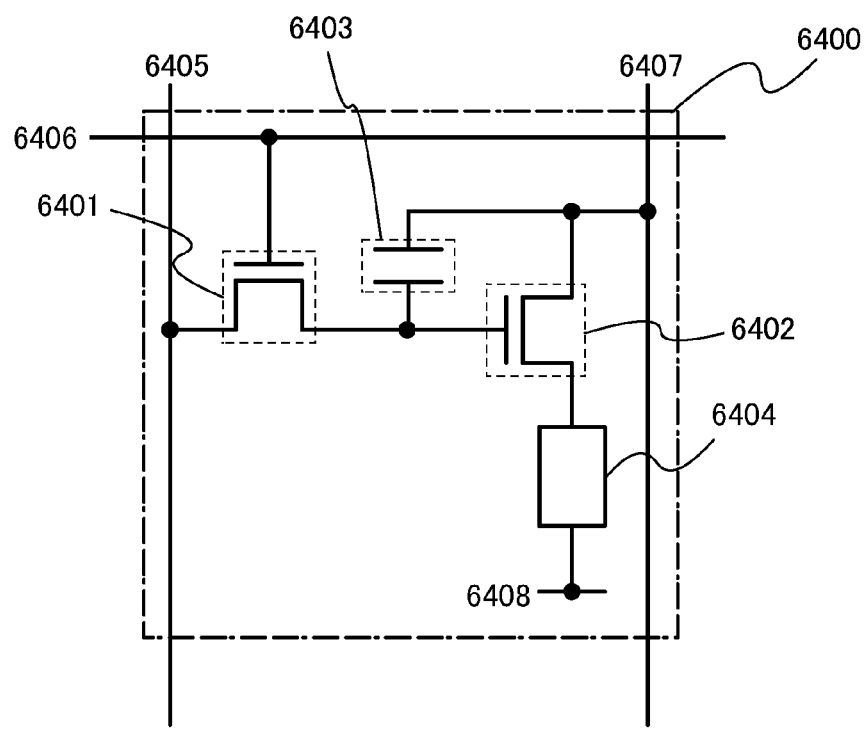
FIG. 12 is a view illustrating an equivalent circuit of a pixel in a semiconductor device.

FIG. 12 illustrates an example of a pixel structure to which digital time grayscale driving can be applied, as an example of a semiconductor device.

A structure and operation of a pixel to which the digital time grayscale driving can be applied are described. Here, one pixel includes two n-channel transistors in each of which an oxide semiconductor layer is used for a channel formation region.

A pixel 6400 includes a switching transistor 6401, a transistor 6402 for driving a light-emitting element (hereinafter referred to as the driving transistor 6402), a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is higher than or equal to the forward threshold voltage of the light-emitting element 6404.

Note that gate capacitance of the driving transistor 6402 may be used as a substitute for the capacitor 6403, in which case the capacitor 6403 can be omitted. The gate capacitance of the driving transistor 6402 may be formed between the channel region and the gate electrode.

In the case of employing a voltage-input voltage-driving method, a video signal is input to the gate of the driving transistor 6402 so that the driving transistor 6402 is in either of two states of being sufficiently turned on or turned off. In other words, the driving transistor 6402 operates in a linear region. Since the driving transistor 6402 operates in the linear region, a voltage higher than the voltage of the power supply line 6407 is applied to the gate of the driving transistor 6402. Note that a voltage higher than or equal to the sum of the power supply line voltage and Vth of the driving transistor 6402 is applied to the signal line 6405.

In the case of employing an analog grayscale method instead of the digital time grayscale method, the same pixel structure as in FIG. 12 can be employed by changing signal input.

In the case of performing analog grayscale driving, a voltage higher than or equal to the sum of the forward voltage of the light-emitting element 6404 and Vth of the driving transistor 6402 is applied to the gate of the driving transistor 6402. The forward voltage of the light-emitting element 6404 refers to a voltage at which a desired luminance is obtained, and refers to at least a forward threshold voltage. The video signal by which the driving transistor 6402 operates in a saturation region is input, so that current can be supplied to the light-emitting element 6404. In order to operate the driving transistor 6402 in the saturation region, the electric potential of the power supply line 6407 is set higher than the gate potential of the driving transistor 6402. When an analog video signal is used, a current corresponding to the video signal is supplied to the light-emitting element 6404, whereby the analog grayscale driving can be performed.

Note that the pixel structure is not limited to that illustrated in FIG. 12. For example, a switch, a resistor, a capacitor, a transistor, a logic circuit, or the like may be added to the pixel illustrated in FIG. 12.

Next, a structure of a light-emitting element will be described with reference to FIGS. 13A to 13C. Here, a cross-sectional structure of a pixel will be described using an n-channel driving TFT as an example. Driving TFTs 7001, 7011, and 7021 used in semiconductor devices illustrated in FIGS. 13A, 13B, and 13C can be formed in a manner similar to that of the thin film transistor described in Embodiment 1 and are highly reliable thin film transistors each including an oxide semiconductor layer. Alternatively, any of the thin film transistors described in Embodiments 2 to 4 can be used as the driving TFTs 7001, 7011, and 7021.

In order to extract light emitted from the light-emitting element, at least one of an anode and a cathode needs to be transparent. A thin film transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having the top emission structure will be described with reference to FIG. 13A.

Figure 13A:
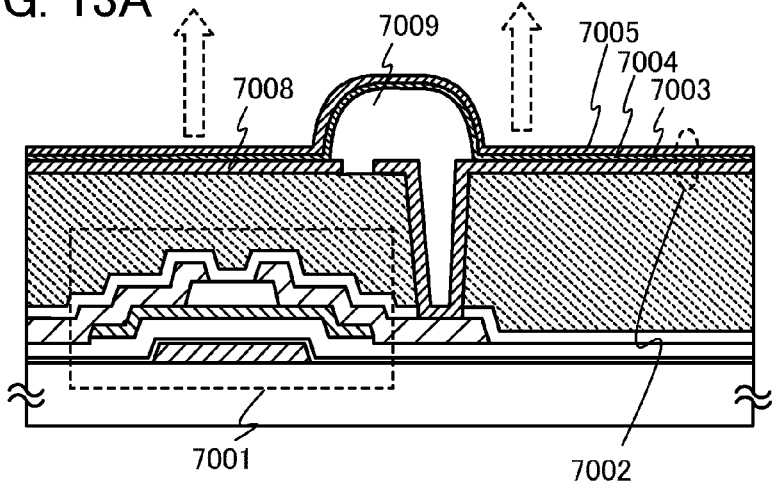
FIGS. 13A to 13C are views each illustrating a semiconductor device.

FIG. 13A is a cross-sectional view of a pixel of the case where the driving TFT 7001 is an n-channel TFT and light emitted from a light-emitting element 7002 passes through an anode 7005. In FIG. 13A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. In the case where the light-emitting layer 7004 is formed using a plurality of layers, an electron injection layer, an electron transport layer, a light-emitting layer, a hole transport layer, and a hole injection layer are stacked in this order over the cathode 7003. Note that it is not necessary to form all of these layers. The anode 7005 is formed using a light-transmitting conductive film, for example, a film of indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Moreover, a partition 7009 is provided between the cathode 7003 and a cathode 7008 in an adjacent pixel so as to cover edge portions of the cathodes 7003 and 7008. The partition 7009 can be formed using an organic resin film of polyimide, acrylic, polyamide, epoxy, or the like; an inorganic insulating film; or organic polysiloxane. It is particularly preferable that the partition 7009 be formed using a photosensitive resin material so that its side surface is an inclined surface with continuous curvature. When a photosensitive resin material is used for the partition 7009, a step of forming a resist mask can be omitted.

A region where the light-emitting layer 7004 is sandwiched between the cathode 7003 and the anode 7005 is the light-emitting element 7002. In the pixel illustrated in FIG. 13A, light is emitted from the light-emitting element 7002 to the anode 7005 side as indicated by arrows.

Next, a light-emitting element having the bottom emission structure will be described with reference to FIG. 13B. FIG. 13B is a cross-sectional view of a pixel in the case where the driving TFT 7011 is an n-channel TFT and light is emitted from a light-emitting element 7012 to the cathode 7013 side. In FIG. 13B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 in the case where the anode 7015 has light-transmitting properties. The cathode 7013 can be formed using a variety of conductive materials as in the case of FIG. 13A as long as they have a low work function. Note that the cathode 7013 is formed to a thickness through which light can be transmitted (preferably approximately 5 nm to 30 nm). For example, a 20-nm-thick aluminum film can be used as the cathode 7013. As in the case of FIG. 13A, the light-emitting layer 7014 may be formed using a single layer or a plurality of layers stacked. The anode 7015 does not need to transmit light, but can be formed using a light-transmitting conductive material as in the case of FIG. 13A. For the light-blocking film 7016, a metal or the like that reflects light can be used, for example; however, the light-blocking film 7016 is not limited to a metal film. For example, a resin or the like to which a black pigment is added can be used.

Moreover, a partition 7019 is provided between the conductive film 7017 and a conductive film 7018 in an adjacent pixel so as to cover edge portions of the conductive films 7017 and 7018. The partition 7019 can be formed using an organic resin film of polyimide, acrylic, polyamide, epoxy, or the like; an inorganic insulating film; or organic polysiloxane. It is particularly preferable that the partition 7019 be formed using a photosensitive resin material so that its side surface is an inclined surface with continuous curvature. When a photosensitive resin material is used for the partition 7019, a step of forming a resist mask can be eliminated.

A region where the light-emitting layer 7014 is sandwiched between the cathode 7013 and the anode 7015 is the light-emitting element 7012. In the pixel illustrated in FIG. 13B, light is emitted from the light-emitting element 7012 to the cathode 7013 side as indicated by arrows.

Next, a light-emitting element having the dual emission structure will be described with reference to FIG. 13C. In FIG. 13C, a cathode 7023 of a light-emitting element 7022 is formed over a light-transmitting conductive film 7027 that is electrically connected to the driving TFT 7021, and a light-emitting layer 7024 and an anode 7025 are stacked in this order over the cathode 7023. As in the case of FIG. 13A, the cathode 7023 can be formed using any of a variety of conductive materials as long as they have a low work function. Note that the cathode 7023 is formed to a thickness through which light can be transmitted. For example, a 20-nm-thick film of Al can be used as the cathode 7023. As in the case of FIG. 13A, the light-emitting layer 7024 may be formed using a single layer or a plurality of layers stacked. The anode 7025 can be formed using a light-transmitting conductive material as in the case of FIG. 13A.

Moreover, a partition 7029 is provided between the conductive film 7027 and a conductive film 7028 in an adjacent pixel so as to cover edge portions of the conductive films 7027 and 7028. The partition 7029 can be formed using an organic resin film of polyimide, acrylic, polyamide, epoxy, or the like; an inorganic insulating film; or organic polysiloxane. It is particularly preferable that the partition 7029 be formed using a photosensitive resin material so that its side surface is an inclined surface with continuous curvature. When a photosensitive resin material is used for the partition 7029, a step of forming a resist mask can be omitted.

A portion where the cathode 7023, the light-emitting layer 7024, and the anode 7025 overlap with one another is the light-emitting element 7022. In the pixel illustrated in FIG. 13C, light is emitted from the light-emitting element 7022 to both the anode 7025 side and the cathode 7023 side as indicated by arrows.

Note that although the organic EL elements are described here as the light-emitting elements, an inorganic EL element can be provided as the light-emitting element.

Note that the example is described in which the thin film transistor (the driving TFT) which controls the driving of a light-emitting element is electrically connected to the light-emitting element; alternatively, a structure may be employed in which a TFT for current control is connected between the driving TFT and the light-emitting element.

Figure 13B:
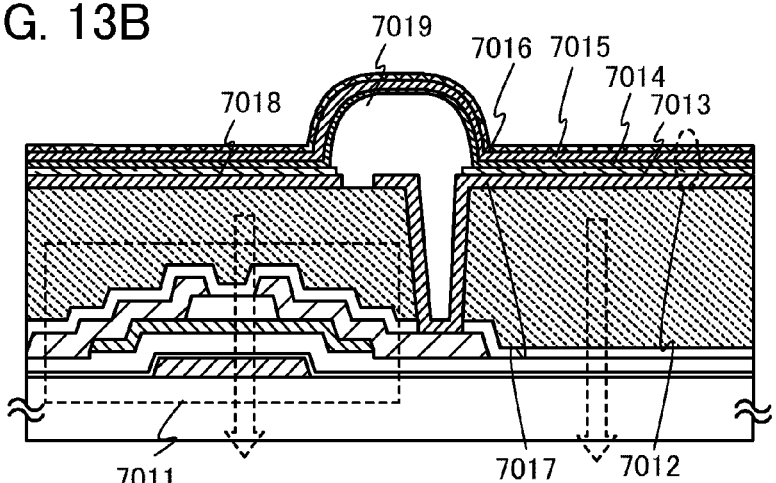
Figure 13C:
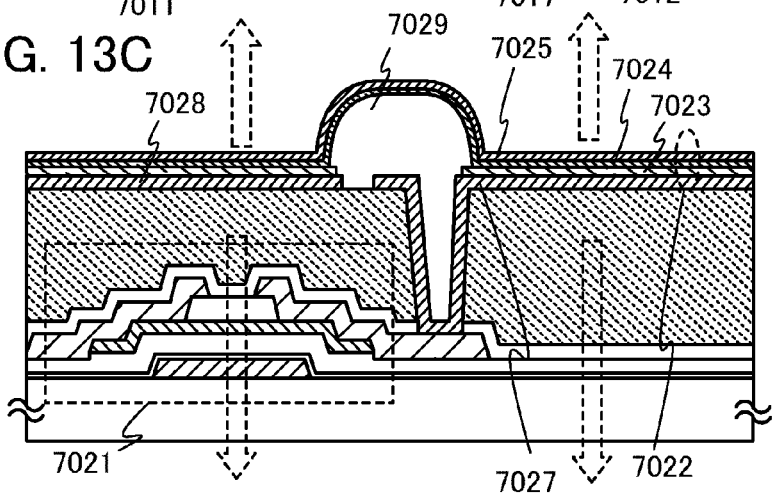

Note that the structure of the semiconductor device is not limited to those illustrated in FIGS. 13A to 13C and can be modified in various ways based on techniques disclosed in this specification.

Figure 11A:
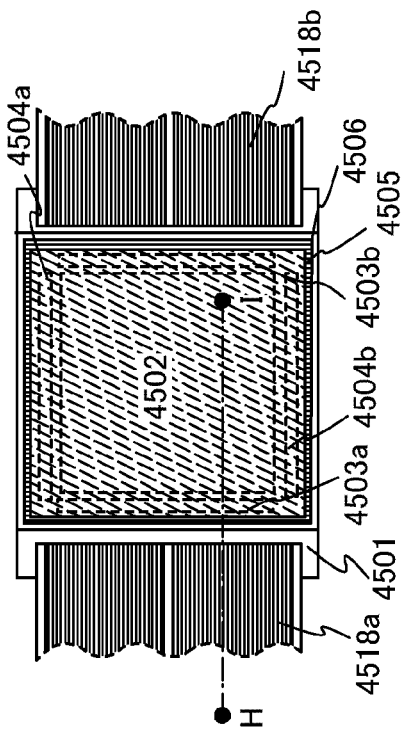
FIGS. 11A and 11B are views each illustrating a semiconductor device.
Figure 11B:
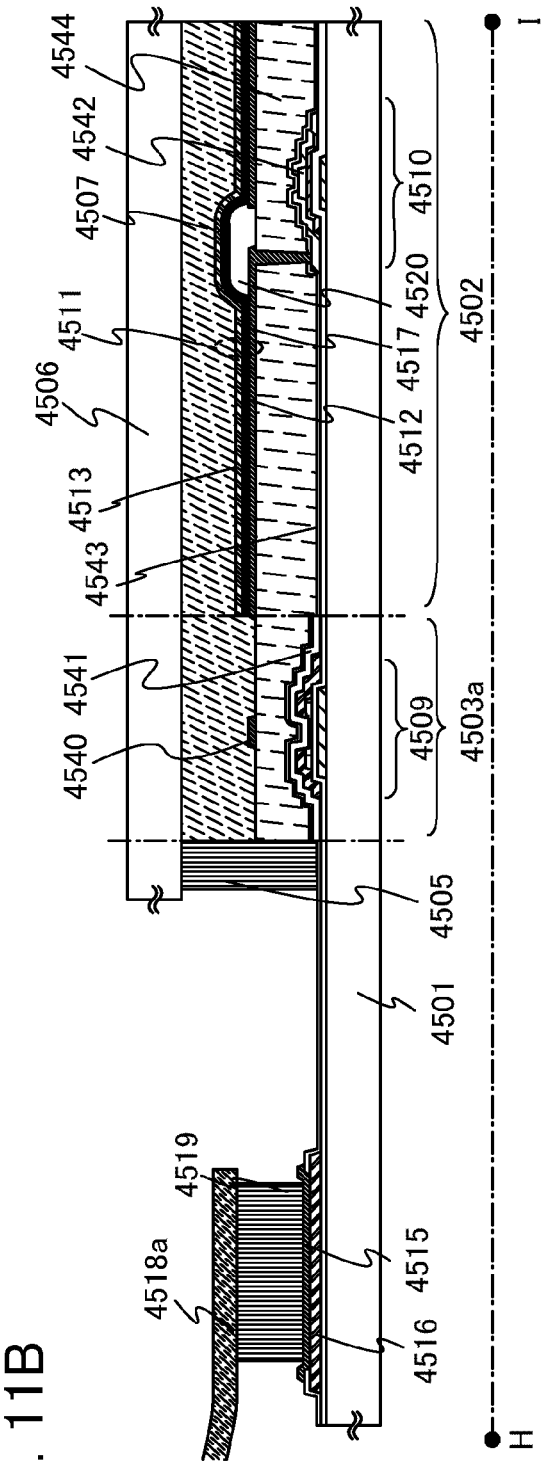

Next, the appearance and a cross section of a light-emitting display panel (also referred to as a light-emitting panel) which is one embodiment of a semiconductor device will be described with reference to FIGS. 11A and 11B. FIG. 11A is a plan view of a panel in which a thin film transistor and a light-emitting element that are formed over a first substrate are sealed between the first substrate and a second substrate with a sealant. FIG. 11B is a cross-sectional view taken along line H-I in FIG. 11A.

A sealant 4505 is provided so as to surround a pixel portion 4502, signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. In this manner, a panel is preferably packaged (sealed) with a protection film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 11B.

Any of the highly reliable thin film transistors including the oxide semiconductor layer described in Embodiments 1 to 4 can be used as the thin film transistors 4509 and 4510. The thin film transistor 410 or the thin film transistor 499 described in Embodiments 1 to 4 can be used as the thin film transistor 4509 for the driver circuit. The thin film transistor 420 or the thin film transistor 498 can be used as the thin film transistor 4010 for a pixel. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in the threshold voltage of the thin film transistor 4509 before and after the BT test can be reduced. The electric potential of the conductive layer 4540 may be the same or different from that of a gate electrode layer in the thin film transistor 4509. The conductive layer 4540 can also function as a second gate electrode layer. Alternatively, the electric potential of the conductive layer 4540 may be GND or 0 V, or the conductive layer 4540 may be in a floating state.

In the thin film transistor 4509, the insulating layer 4541 is formed in contact with the semiconductor layer including the channel formation region, as a protection insulating film. In the thin film transistor 4510, an insulating layer 4542 is formed as a channel protection layer. The insulating layers 4541 and 4542 can be formed using a material and method which are similar to those of the oxide insulating layers 416 and 426 described in Embodiment 1. Moreover, the insulating layer 4544 functioning as a planarization insulating film covers the thin film transistors in order to reduce surface unevenness of the thin film transistors. Here, as the insulating layers 4541 and 4542, a silicon oxide film is formed by a sputtering method in accordance with Embodiment 1.

Furthermore, an insulating layer 4543 is formed over the insulating layers 4541 and 4542. The insulating layer 4543 can be formed using a material and a method which are similar to those of the protection insulating layer 403 described in Embodiment 1. Here, a silicon nitride film is formed by an RF sputtering method as the insulating layer 4543.

The insulating layer 4544 is formed as the planarization insulating film. The insulating layer 4544 can be formed using a material and a method which are similar to those of the planarization insulating layer 404 described in Embodiment 1. Here, acrylic is used for the insulating layer 4544.

In this embodiment, a plurality of thin film transistors in the pixel portion may be surrounded together by a nitride insulating film. It is possible to use a nitride insulating film as the insulating layer 4543 and a gate insulating layer and to provide a region where the insulating layer 4543 is in contact with the gate insulating layer so as to surround at least the periphery of the pixel portion over the active matrix substrate as illustrated in FIGS. 11A and 11B. In this manufacturing process, water can be prevented from entering from the outside. Moreover, entry of water from the outside can be prevented in the long term even after a device is completed as a semiconductor device, for example, as a display device; thus, the long-term reliability of the device can be achieved.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to a layered structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed as a single layer or a plurality of layers stacked.

A protection film may be formed over the second electrode layer 4513 and the partition 4520 in order to prevent entry of oxygen, hydrogen, water, carbon dioxide, or the like into the light-emitting element 4511. As the protection film, a silicon nitride film, a silicon nitride oxide film, a DLC film, or the like can be formed.

In addition, a variety of signals and electric potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate positioned in the direction in which light is extracted from the light-emitting element 4511 needs to have light-transmitting properties. In that case, a light-transmitting material such as a glass plate, a plastic plate, a polyester film, or an acrylic film is used for the second substrate.

As the filler 4507, an ultraviolet curable resin or a thermosetting resin can be used in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Driver circuits formed using a single crystal semiconductor film or a polycrystalline semiconductor film over a substrate separately prepared may be mounted as the signal line driver circuits 4503*a* and 4503*b* and the scan line driver circuits 4504*a* and 4504*b*. Alternatively, only the signal line driver circuits or part thereof, or only the scan line driver circuits or part thereof may be separately formed and mounted. This embodiment is not limited to the structure illustrated in FIGS. 11A and 11B.

Through the above steps, a highly reliable light-emitting display device (display panel) can be manufactured as a semiconductor device.

This embodiment can be implemented in appropriate combination with any of the structures described in the other embodiments.

(Embodiment 12)

Figure 20:
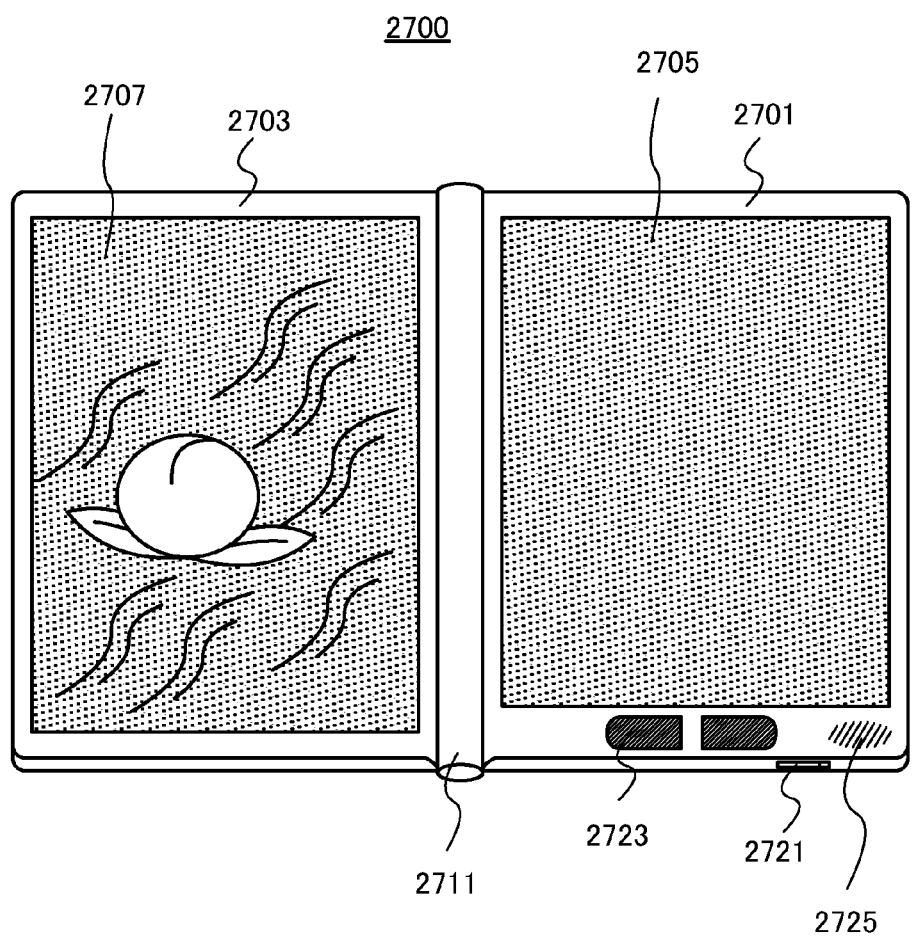
FIG. 20 is an external view illustrating an example of an e-book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 20 illustrates an example of the electronic devices.

FIG. 20 illustrates an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

(Embodiment 13)

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 21A:
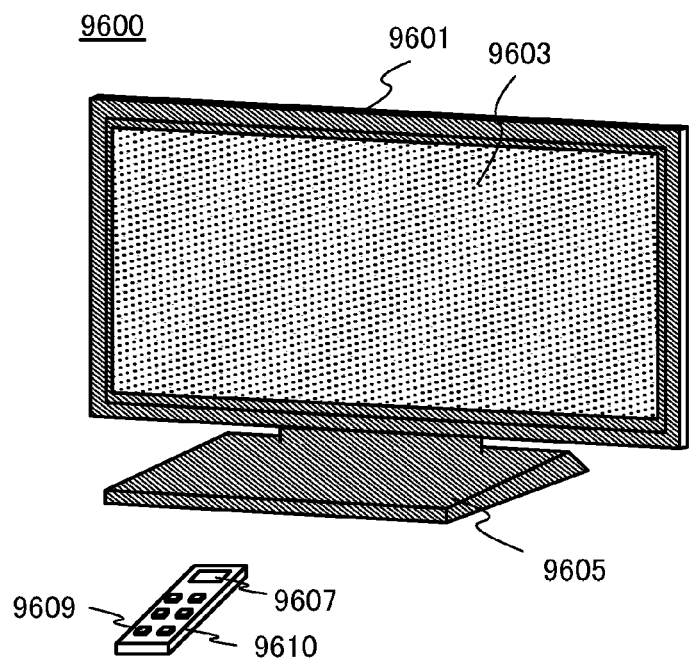
FIGS. 21A and 21B are external views illustrating examples of a television device and a digital photo frame, respectively.

FIG. 21A illustrates a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 21B:
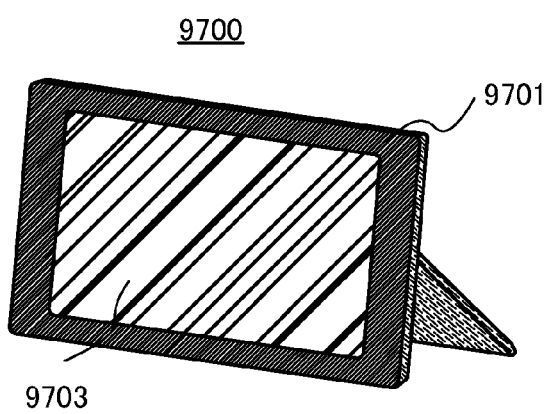

FIG. 21B illustrates a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 22A:
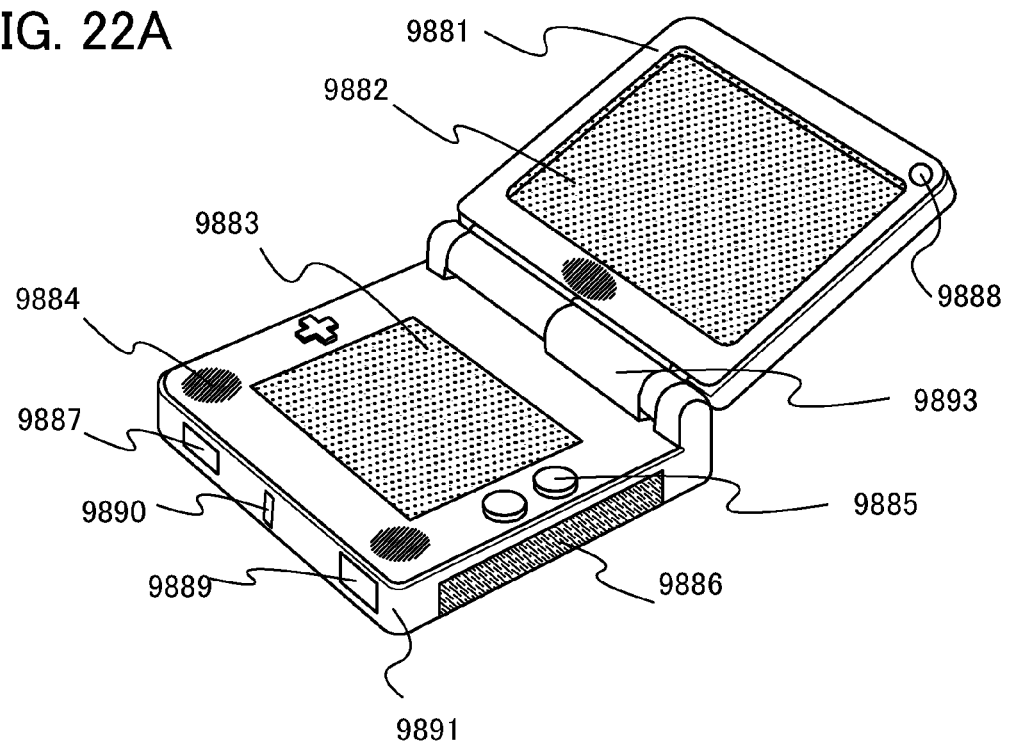
FIGS. 22A and 22B are external views each illustrating an example of an game machine.

FIG. 22A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include an additional accessory as appropriate. The portable game machine illustrated in FIG. 22A has a function of reading a program or data stored in the recording medium to display it on the display portion, and a function of sharing data with another portable game machine by wireless communication. Note that a function of the portable game machine illustrated in FIG. 22A is not limited to those described above, and the portable game machine can have a variety of functions.

Figure 22B:
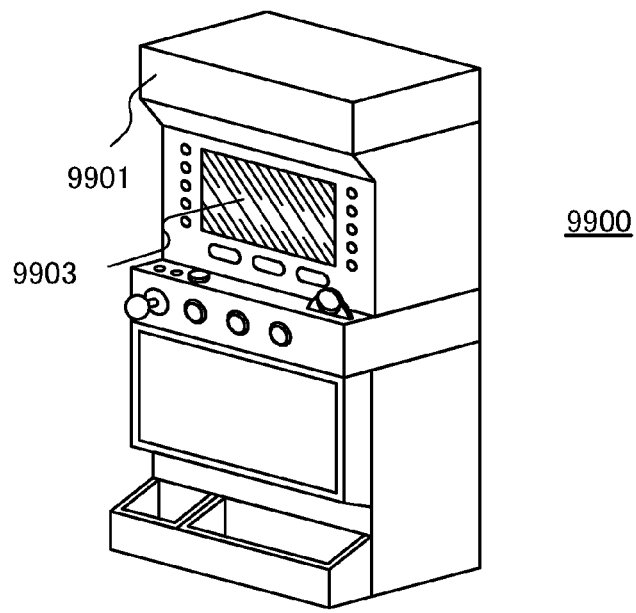

FIG. 22B illustrates a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 23A:
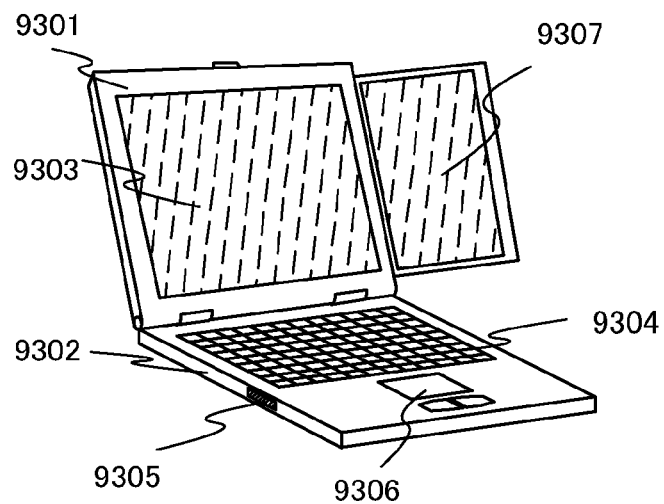
FIGS. 23A and 23B are external views illustrating examples of a portable computer and a mobile phone, respectively.

FIG. 23A is a perspective view illustrating an example of a portable computer.

In the portable computer illustrated in FIG. 23A, a top housing 9301 having a display portion 9303 and a bottom housing 9302 having a keyboard 9304 can overlap with each other by closing a hinge unit which connects the top housing 9301 and the bottom housing 9302. Thus, the portable computer illustrated in FIG. 23A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stowed in the top housing 9301 by being slid therein. With the display portion 9307, a large display screen can be realized. In addition, the user can adjust the angle of a screen of the stowable display portion 9307. If the stowable display portion 9307 is a touch panel, the user can input data by touching part of the display portion 9307.

The display portion 9303 or the stowable display portion 9307 is formed using an image display device such as a liquid crystal display panel or a light-emitting display panel using an organic light-emitting element, an inorganic light-emitting element, or the like.

In addition, the portable computer illustrated in FIG. 23A can be provided with a receiver and the like and can receive a TV broadcast to display an image on the display portion 9303 or the display portion 9307. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 23B:
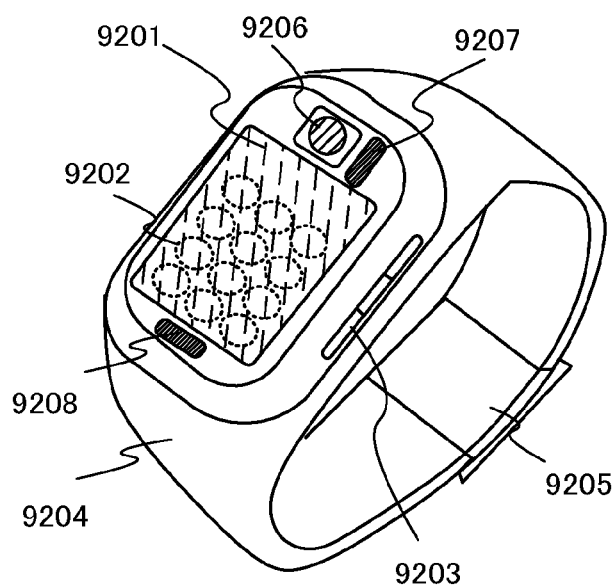

FIG. 23B is a perspective view of an example of a mobile phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 23B, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 23B is provided with a receiver of a TV broadcast and the like, and can display an image on the display portion 9201 by receiving the TV broadcast. In addition, the mobile phone is provided with a memory device such as a memory, and the like, and can record the TV broadcast in the memory. The mobile phone illustrated in FIG. 23B may have a function of collecting location information such as GPS.

An image display device such as a liquid crystal display panel or a light-emitting display panel using an organic light-emitting element, an inorganic light-emitting element, or the like is used as the display portion 9201. The mobile phone illustrated in FIG. 23B is compact and lightweight and the battery capacity is limited. For the above reason, a panel which can be driven with low power consumption is preferably used as a display device for the display portion 9201.

Note that although FIG. 23B illustrates the electronic device which is worn on the wrist, this embodiment is not limited thereto as long as an electronic is portable.

(Embodiment 14)

In this embodiment, as one mode of a semiconductor device, examples of display devices each including the thin film transistor described in any of Embodiments 1 to 4 will be described with reference to FIGS. 24 to 37. In this embodiment, examples of liquid crystal display devices in each of which a liquid crystal element is used as a display element will be described with reference to FIG. 24 to FIG. 37. The thin film transistor described in any of Embodiments 1 to 4 can be used as each of TFTs 628 and 629. The TFTs 628 and 629 can be manufactured through a process similar to that described in any of Embodiments 1 to 4 and have excellent electrical characteristics and high reliability. The TFT 628 and the TFT 629 include a channel protection layer 608 and a channel protection layer 611, respectively, and are inverted staggered thin film transistors in each of which a channel formation region is formed in an oxide semiconductor layer.

First, a vertical alignment (VA) liquid crystal display device is described. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Liquid crystal display devices of the multi-domain design are described below.

Figure 24:
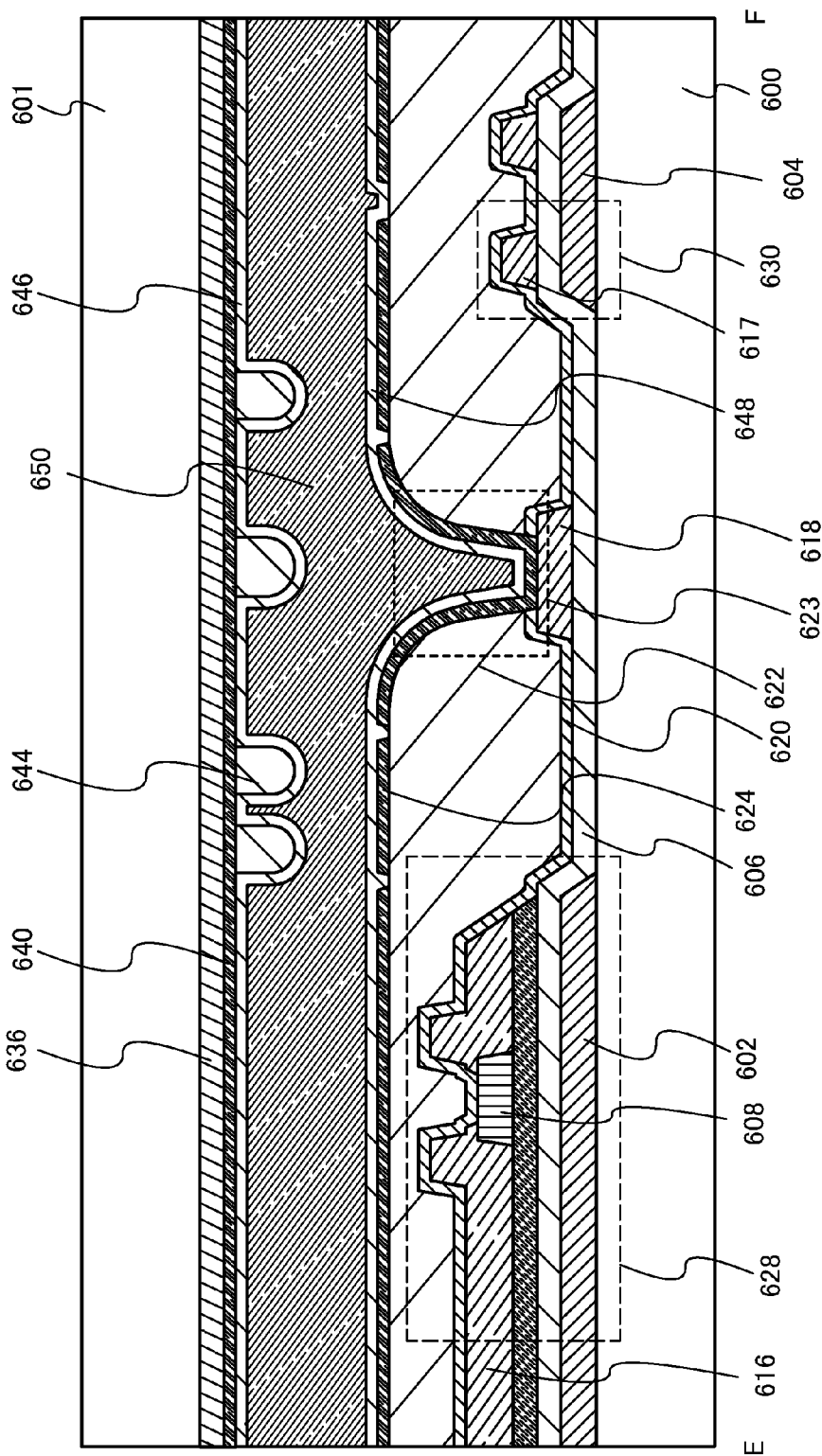
FIG. 24 is a view illustrating a semiconductor device.
Figure 25:
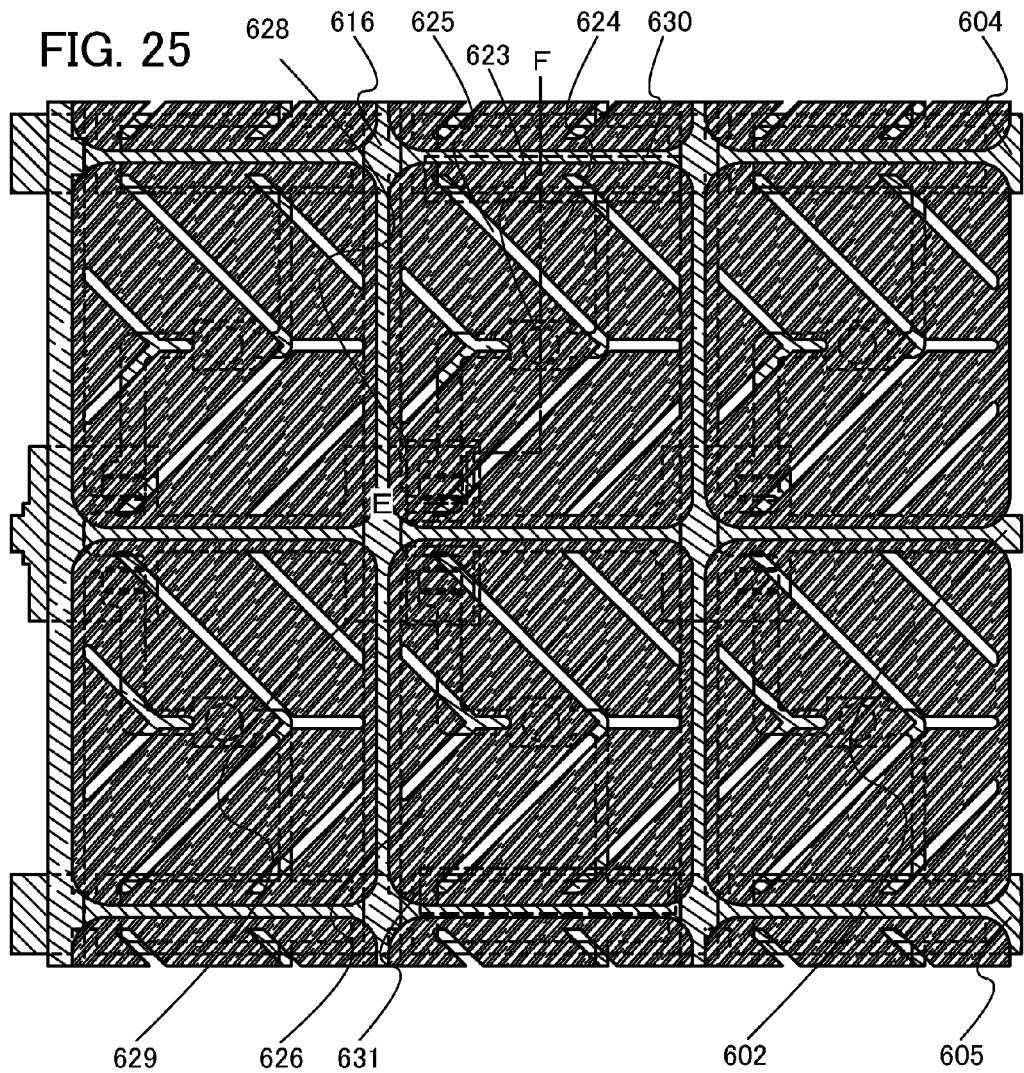
FIG. 25 is a view illustrating a semiconductor device.
Figure 26:
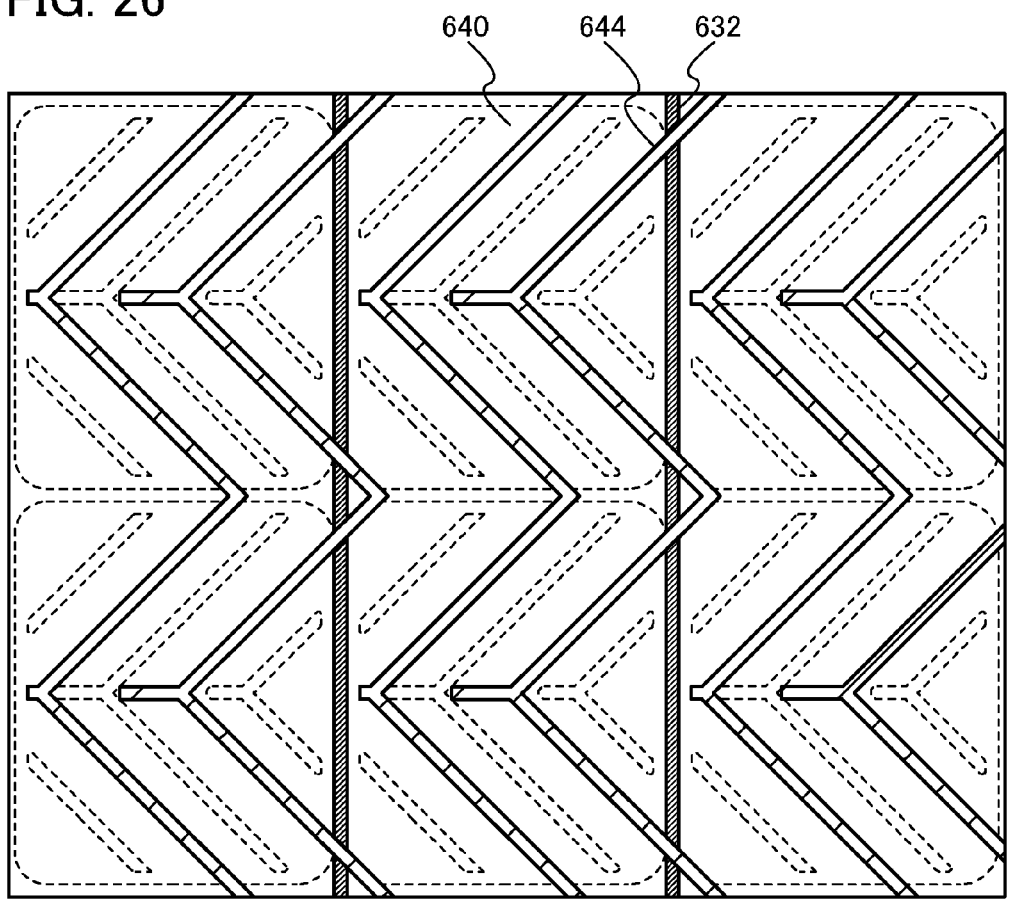
FIG. 26 is a view illustrating a semiconductor device.

FIG. 25 and FIG. 26 illustrate a pixel electrode and a counter electrode, respectively. FIG. 25 is a plan view showing the substrate side where the pixel electrode is formed. FIG. 24 illustrates a cross-sectional structure taken along section line E-F in FIG. 25. FIG. 26 is a plan view showing the substrate side where the counter electrode is formed. Description below is made with reference to those drawings.

In FIG. 24, a substrate 600 over which a TFT 628, a pixel electrode layer 624 connected to the TFT 628, and a storage capacitor portion 630 are formed and a counter substrate 601 provided with a counter electrode layer 640 and the like overlap with each other, and liquid crystals are injected between the substrate 600 and the counter substrate 601.

The counter substrate 601 is provided with a coloring film 636 and the counter electrode layer 640, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 which penetrates an insulating film 620 for covering the TFT 628, a wiring 616, and the storage capacitor portion 630 and also penetrates an insulating film 622 for covering the insulating film 620. The thin film transistor described in any of Embodiments 1 to 4 can be used as the TFT 628 as appropriate. Further, the storage capacitor portion 630 includes a first capacitor wiring 604 which is formed at the same time as a gate wiring 602 of the TFT 628; a gate insulating film 606; and a second capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 25 illustrates a planar structure on the substrate 600. The pixel electrode layer 624 is formed using the material described in Embodiment 1. The pixel electrode layer 624 is provided with slits 625. The slits 625 are provided for controlling the alignment of the liquid crystals.

A TFT 629, a pixel electrode layer 626 connected to the TFT 629, and a storage capacitor portion 631 which are illustrated in FIG. 25 can be formed in a similar manner to the TFT 628, the pixel electrode layer 624, and the storage capacitor portion 630, respectively. Both the TFTs 628 and 629 are connected to the wiring 616. One pixel of this liquid crystal display panel includes the pixel electrode layers 624 and 626. The pixel electrode layers 624 and 626 constitute subpixels.

FIG. 26 illustrates a planar structure of the counter substrate side. The counter electrode layer 640 is formed over a light-blocking film 632. The counter electrode layer 640 is preferably formed using a material similar to that of the pixel electrode layer 624. The protrusions 644 which control the alignment of the liquid crystals are formed on the counter electrode layer 640. Note that in FIG. 26, the pixel electrode layers 624 and 626 formed over the substrate 600 are represented by dashed lines, and the counter electrode layer 640 and the pixel electrode layers 624 and 626 overlap with each other.

Figure 27:
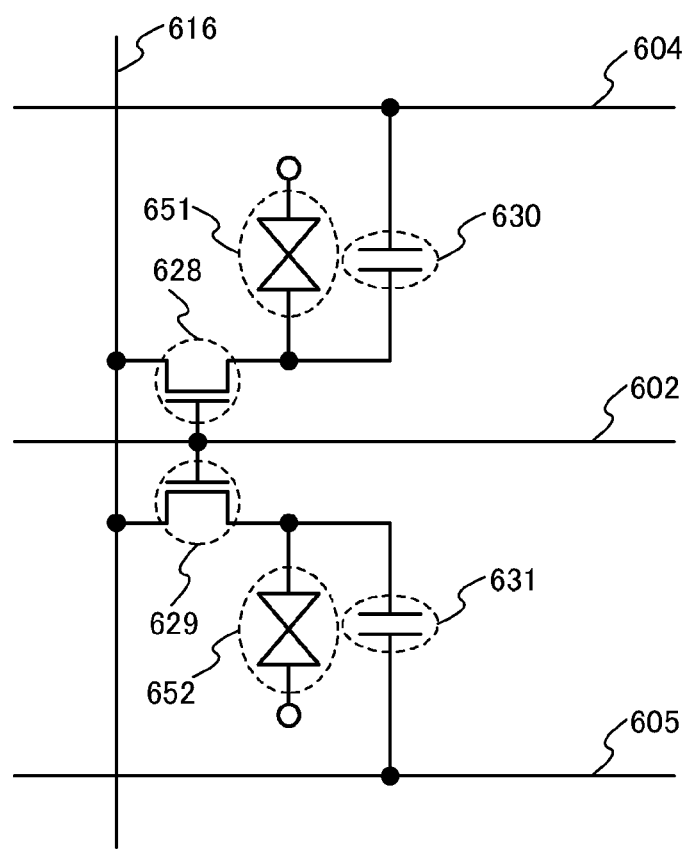
FIG. 27 is a circuit diagram of a semiconductor device.

FIG. 27 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, the alignment of the liquid crystals is precisely controlled and a viewing angle is increased by separate control of potentials of the capacitor wirings 604 and 605.

When a voltage is applied to the pixel electrode layer 624 provided with the slits 625, a distorted electric field (an oblique electric field) is generated in the vicinity of the slits 625. The protrusions 644 on the counter substrate 601 side and the slits 625 are alternately arranged so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIG. 28 to FIG. 31.

Figure 28:
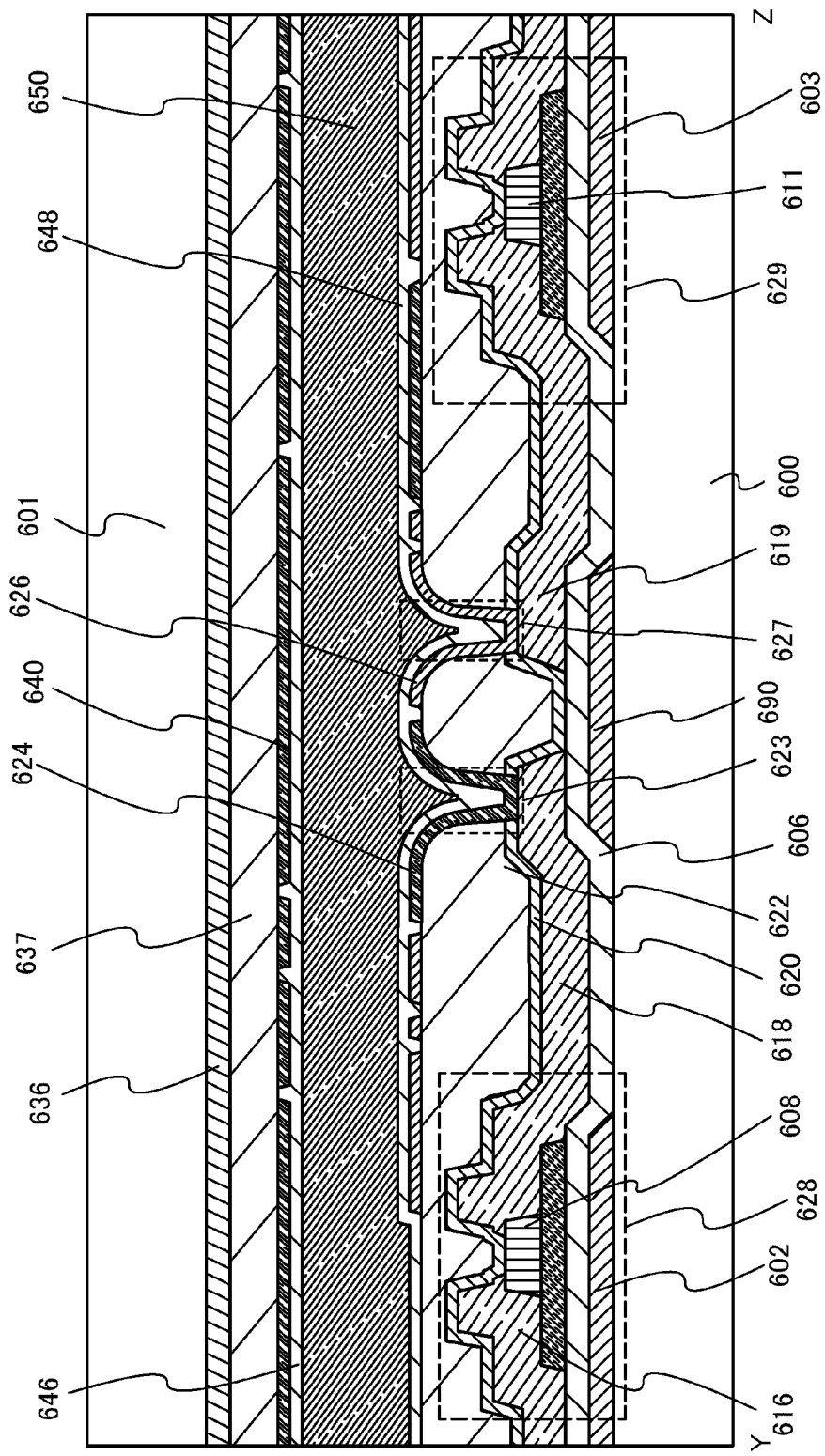
FIG. 28 is a view illustrating a semiconductor device.
Figure 29:
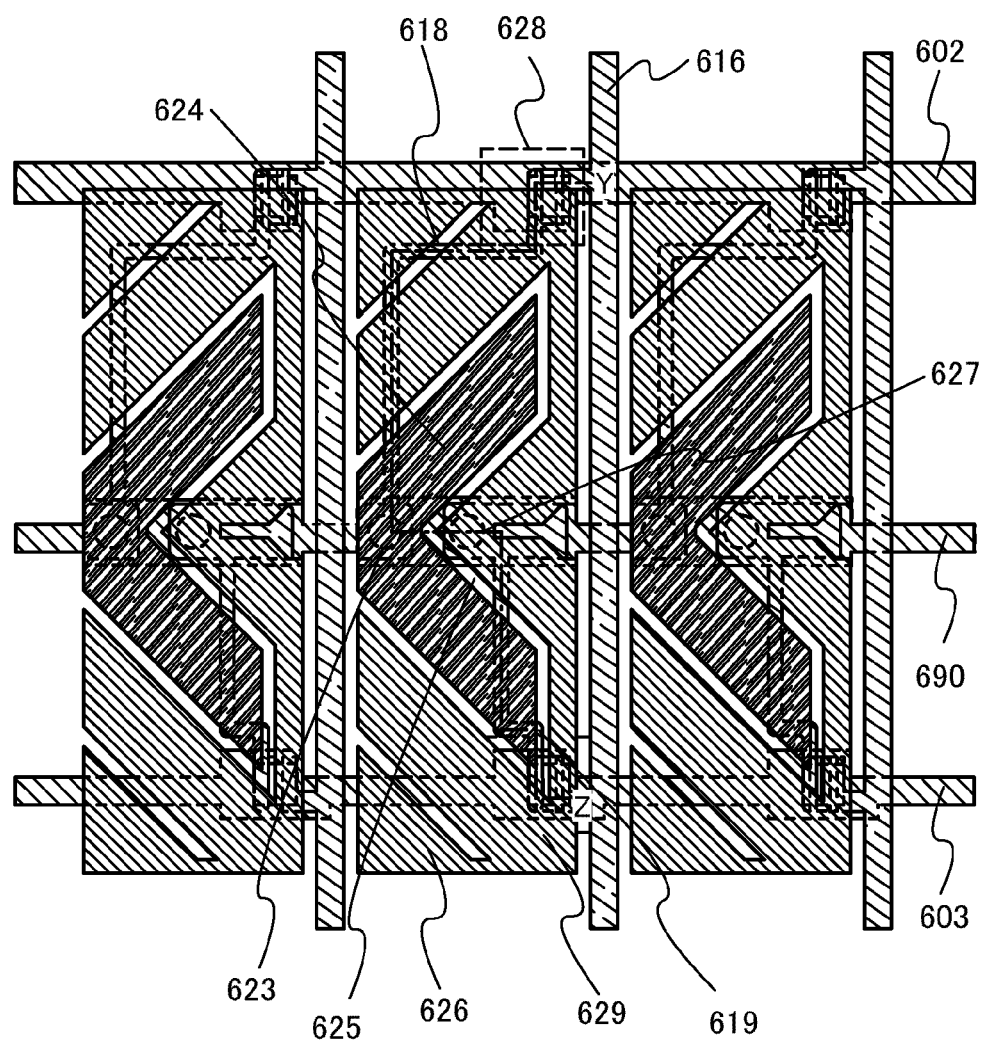
FIG. 29 is a view illustrating a semiconductor device.

FIG. 28 and FIG. 29 illustrate a pixel structure of a VA liquid crystal display panel. FIG. 29 is a plan view of the substrate 600. FIG. 28 illustrates a cross-sectional structure taken along section line Y-Z in FIG. 29.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently of each other.

A pixel electrode layer 624 is connected to a TFT 628 through a wiring 618 through a contact hole 623 penetrating insulating films 620 and 622. The pixel electrode layer 626 is connected to a TFT 629 through a wiring 619 through a contact hole 627 penetrating the insulating films 620 and 622. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistor described in any of Embodiments 1 to 4 can be used as appropriate as each of the TFTs 628 and 629. Note that a gate insulating film 606 is formed over the gate wiring 602, the gate wiring 603, and a capacitor wiring 690.

Figure 31:
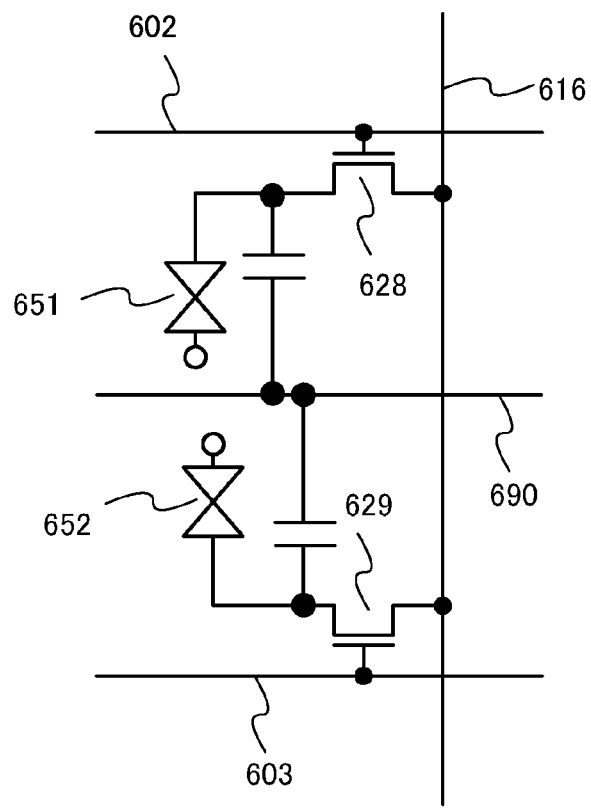
FIG. 31 is a circuit diagram of a semiconductor device.

The shape of the pixel electrode layer 624 is different from that of the pixel electrode layer 626, and the pixel electrode layer 626 is formed so as to surround the external side of the pixel electrode layer 624 which spreads into a V shape. A voltage applied to the pixel electrode layer 624 by a TFT 628 is made to be different from a voltage applied to the pixel electrode layer 626 by a TFT 629, whereby alignment of liquid crystals is controlled. FIG. 31 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of liquid crystal elements 651 and 652 can vary. In other words, the operations of the TFTs 628 and 629 are controlled separately to precisely control the alignment of the liquid crystals in the liquid crystal elements 651 and 652, which leads to a wider viewing angle.

Figure 30:
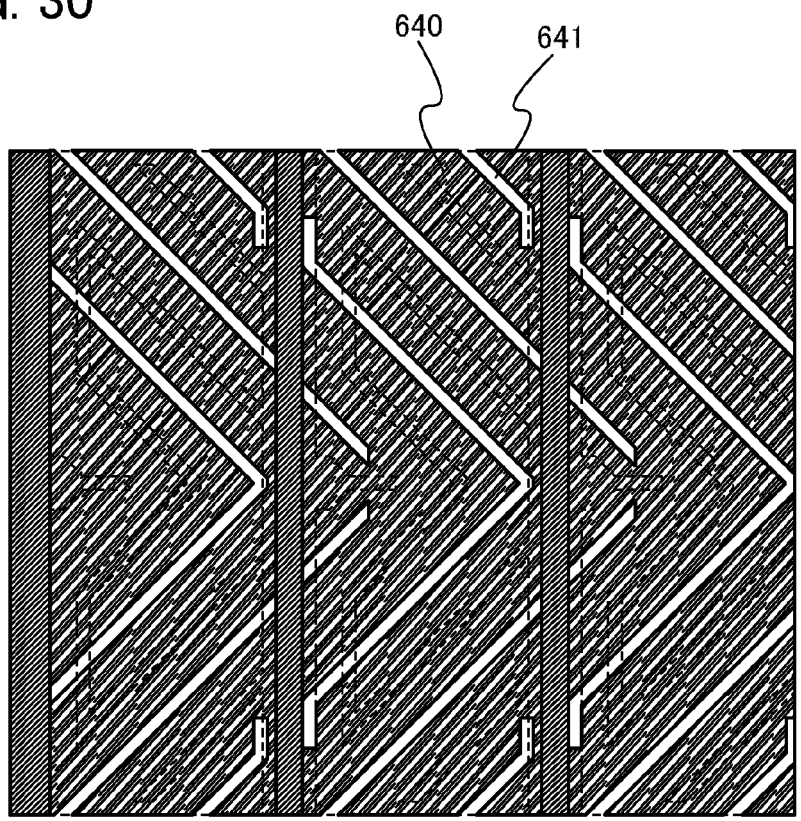
FIG. 30 is a view illustrating a semiconductor device.

A counter substrate 601 is provided with a coloring film 636 and a counter electrode layer 640. A planarization film 637 is formed between the coloring film 636 and the counter electrode layer 640 to prevent alignment disorder of the liquid crystals. FIG. 30 illustrates a planar structure of the counter substrate side. The counter electrode layer 640 is an electrode shared by different pixels and slits 641 are formed. The slits 641 and the slits 625 on the pixel electrode layer 624 and 626 sides are alternately arranged so that an oblique electric field is effectively generated, whereby the alignment of the liquid crystals can be controlled. Accordingly, the alignment of the liquid crystals can vary in different locations, which leads to a wider viewing angle. Note that in FIG. 30, the pixel electrode layers 624 and 626 formed over the substrate 600 are represented by dashed lines and the counter electrode layer 640 and the pixel electrode layers 624 and 626 overlap with each other.

An alignment film 648 is formed over the pixel electrode layer 624 and the pixel electrode layer 626, and the counter electrode layer 640 is similarly provided with an alignment film 646. A liquid crystal layer 650 is formed between the substrate 600 and a counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 28, FIG. 29, FIG. 30, and FIG. 31 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express a gray scale. This method allows a viewing angle to be increased to about 180°. A liquid crystal display device in the horizontal electric field mode is described below.

Figure 32:
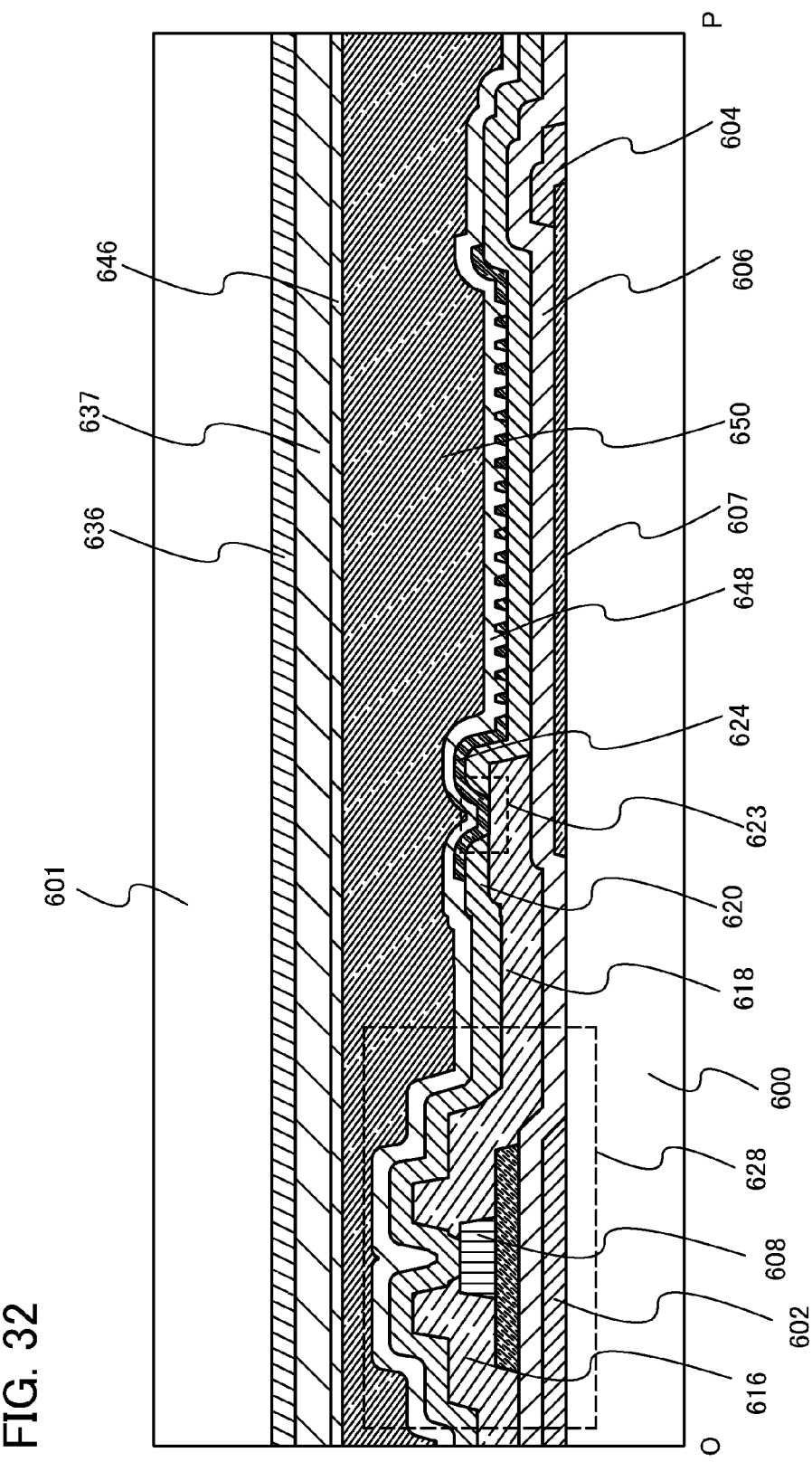
FIG. 32 is a view illustrating a semiconductor device.

In FIG. 32, a substrate 600 over which an electrode layer 607, a TFT 628, and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. In addition, a liquid crystal layer 650 is formed between the substrate 600 and the counter substrate 601 with the alignment films 646 and 648 therebetween.

The electrode layer 607 and a capacitor wiring 604 connected to the electrode layer 607, and the TFT 628 are formed over the substrate 600. The electrode layer 607 can be formed using a material similar to that of the pixel electrode layer 427 described in any of Embodiments 1 to 4. The capacitor wiring 604 can be formed at the same time as a gate wiring 602 of the TFT 628. The thin film transistor described in any of Embodiments 1 to 5 can be used as the TFT 628. The electrode layer 607 is divided almost in a pixel form. Note that a gate insulating film 606 is formed over the electrode layer 607 and the capacitor wiring 604.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 is formed over the wirings 616 and 618. Over the insulating film 620, the pixel electrode layer 624 is formed to be connected to the wiring 618 through a contact hole formed in the insulating film 620. The pixel electrode layer 624 is formed using a material similar to that of the pixel electrode layer described in Embodiment 1.

In such a manner, the TFT 628 and the pixel electrode layer 624 connected to the TFT 628 are formed over the substrate 600. Note that a storage capacitor is formed with the electrode layer 607, the gate insulating film 606, the insulating film 620, and the pixel electrode layer 624.

Figure 33:
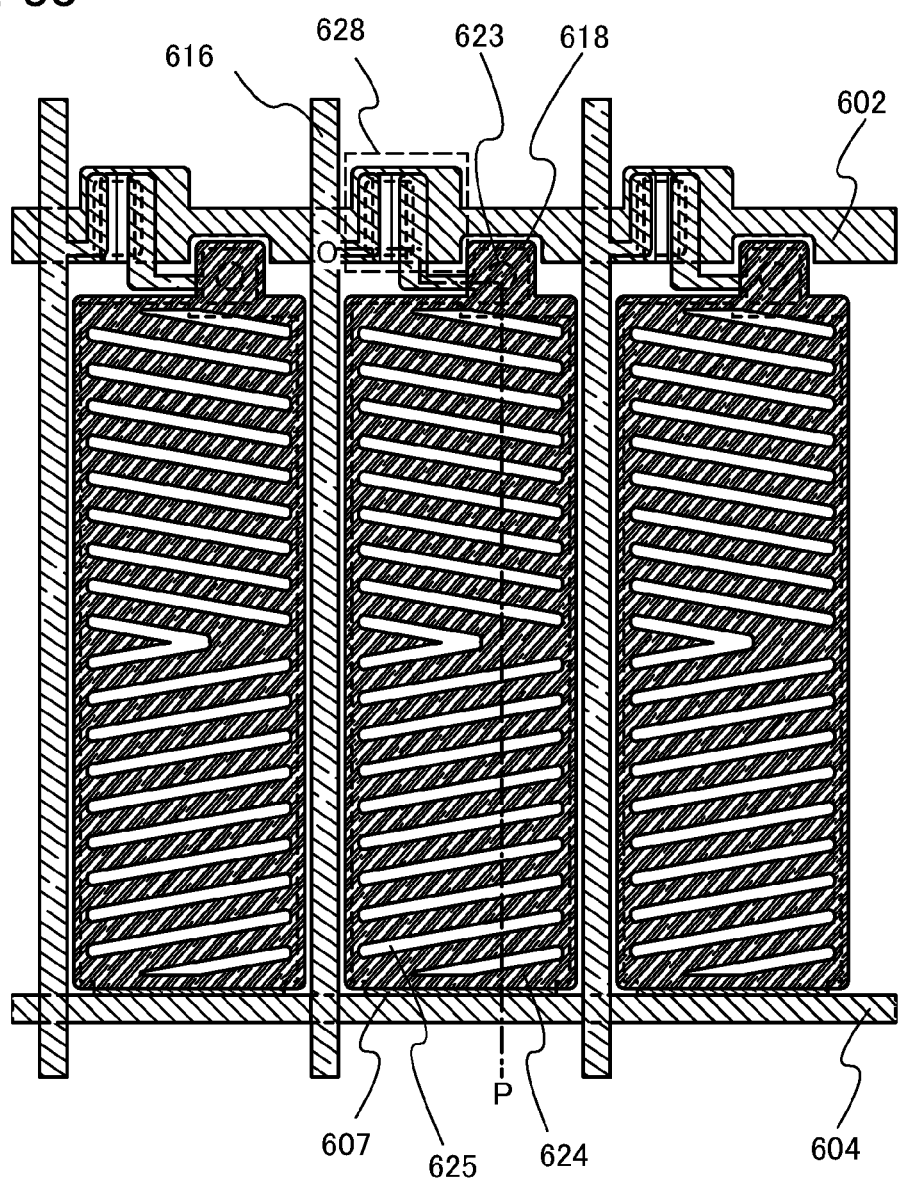
FIG. 33 is a view illustrating a semiconductor device.

FIG. 33 is a plan view illustrating a structure of the pixel electrode. FIG. 32 illustrates a cross-sectional structure taken along section line O-P in FIG. 33. The pixel electrode layer 624 is provided with slits 625. The slits 625 are provided for controlling alignment of liquid crystals. In that case, an electric field is generated between the electrode layer 607 and the pixel electrode layer 624. The thickness of the gate insulating film 606 formed between the electrode layer 607 and the pixel electrode layer 624 is 50 nm to 200 nm, which is much smaller than the thickness of the liquid crystal layer of 2 μm to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, an aperture ratio can be increased.

Next, a different example of the liquid crystal display device in the horizontal electric field mode is described.

Figure 34:
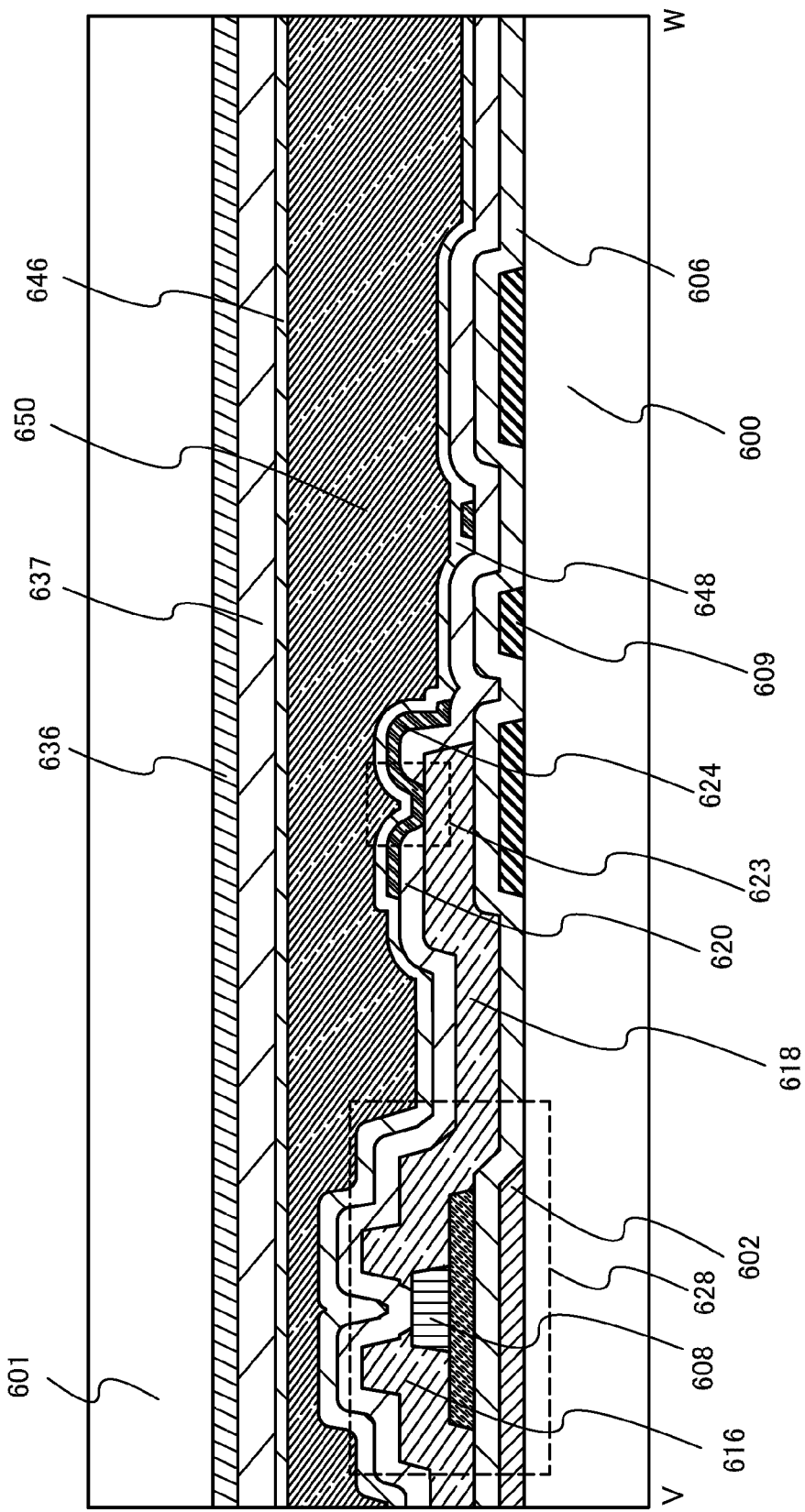
FIG. 34 is a view illustrating a semiconductor device.
Figure 35:
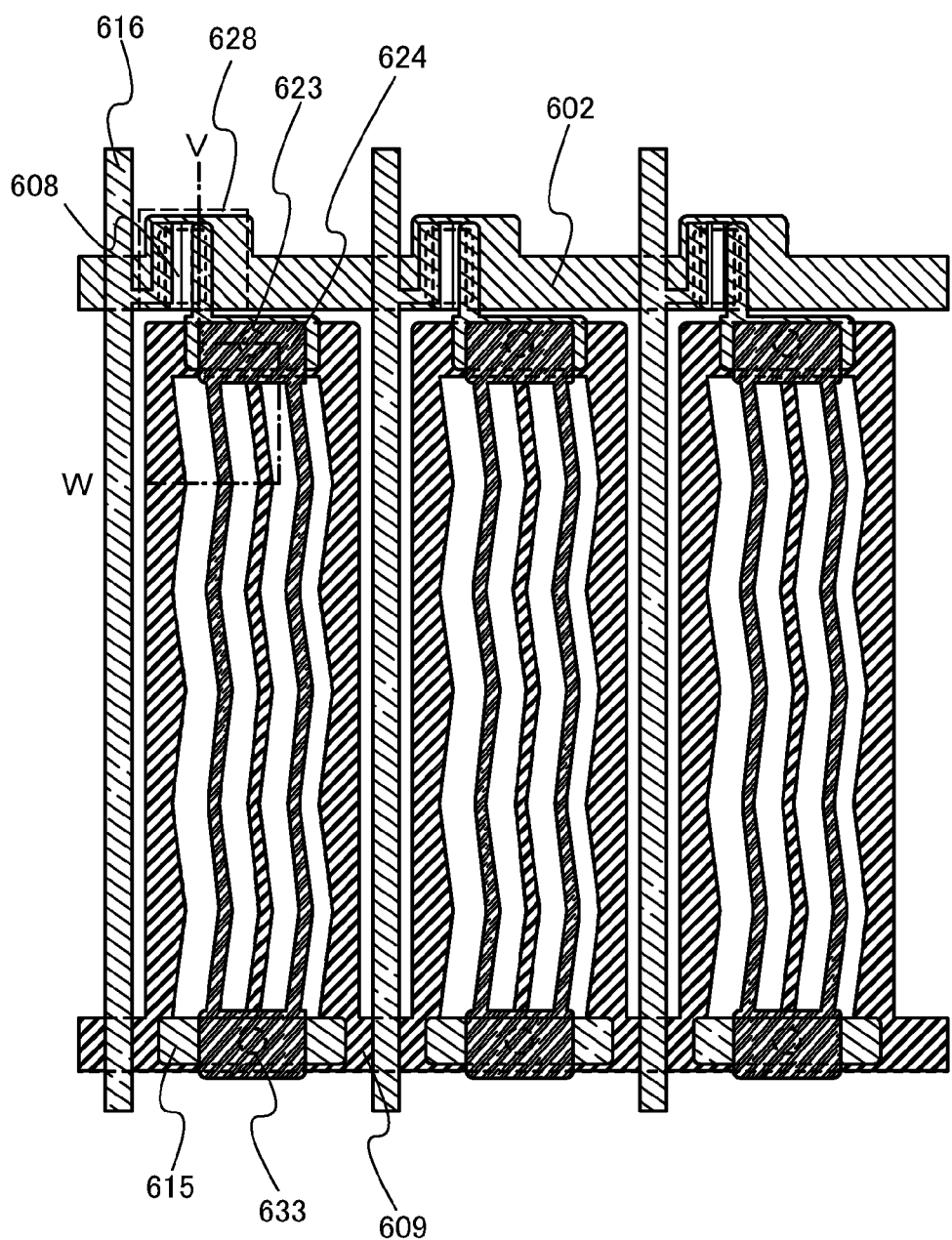
FIG. 35 is a view illustrating a semiconductor device.

FIG. 34 and FIG. 35 illustrate a pixel structure of a liquid crystal display device in an IPS mode. FIG. 35 is a plan view. FIG. 34 illustrates a cross-sectional structure taken along section line V-W in FIG. 35. Description below is given with reference to both the drawings.

In FIG. 34, a substrate 600 over which a TFT 628 and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. A liquid crystal layer 650 is formed between the substrate 600 and the counter substrate 601 with the alignment films 646 and 648 therebetween.

A common potential line 609 and the TFT 628 are formed over the substrate 600. The common potential line 609 can be formed at the same time as a gate wiring 602 of the TFT 628. The thin film transistor described in any of Embodiments 1 to 4 can be used as the TFT 628.

Wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 is formed over the wirings 616 and 618. Over the insulating film 620, the pixel electrode layer 624 is formed to be connected to the wiring 618 through a contact hole 623 formed in the insulating film 620. The pixel electrode layer 624 is formed using a material similar to that of the pixel electrode layer described in Embodiment 1. Note that, as illustrated in FIG. 35, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. A storage capacitor is formed with a gate insulating film 606, the common potential line 609, and a capacitor electrode 615. The capacitor electrode 615 and the pixel electrode layer 624 are connected to each other through a contact hole 633.

Next, a mode of a liquid crystal display device in a TN mode is described.

Figure 36:
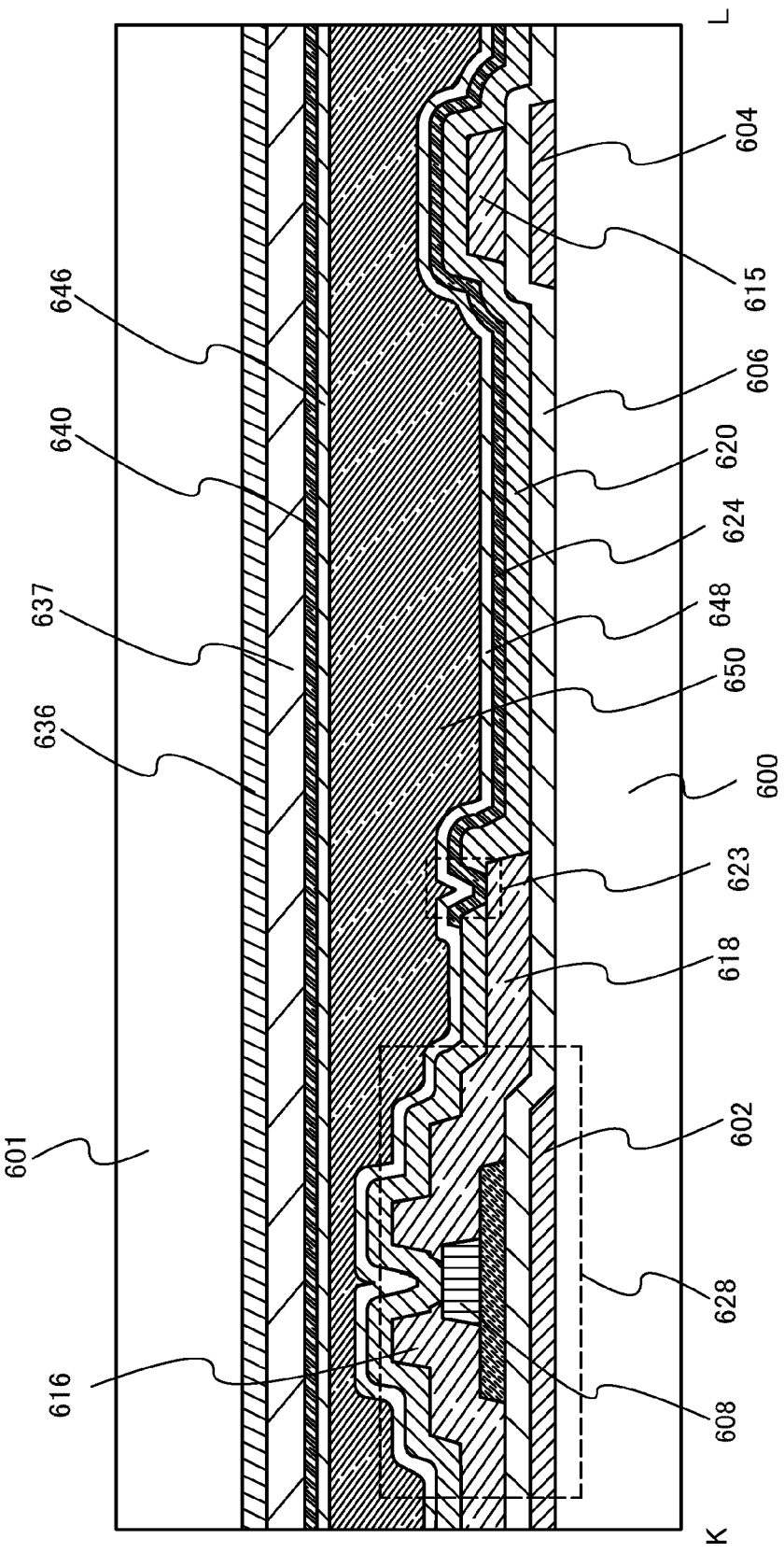
FIG. 36 is a view illustrating a semiconductor device.
Figure 37:
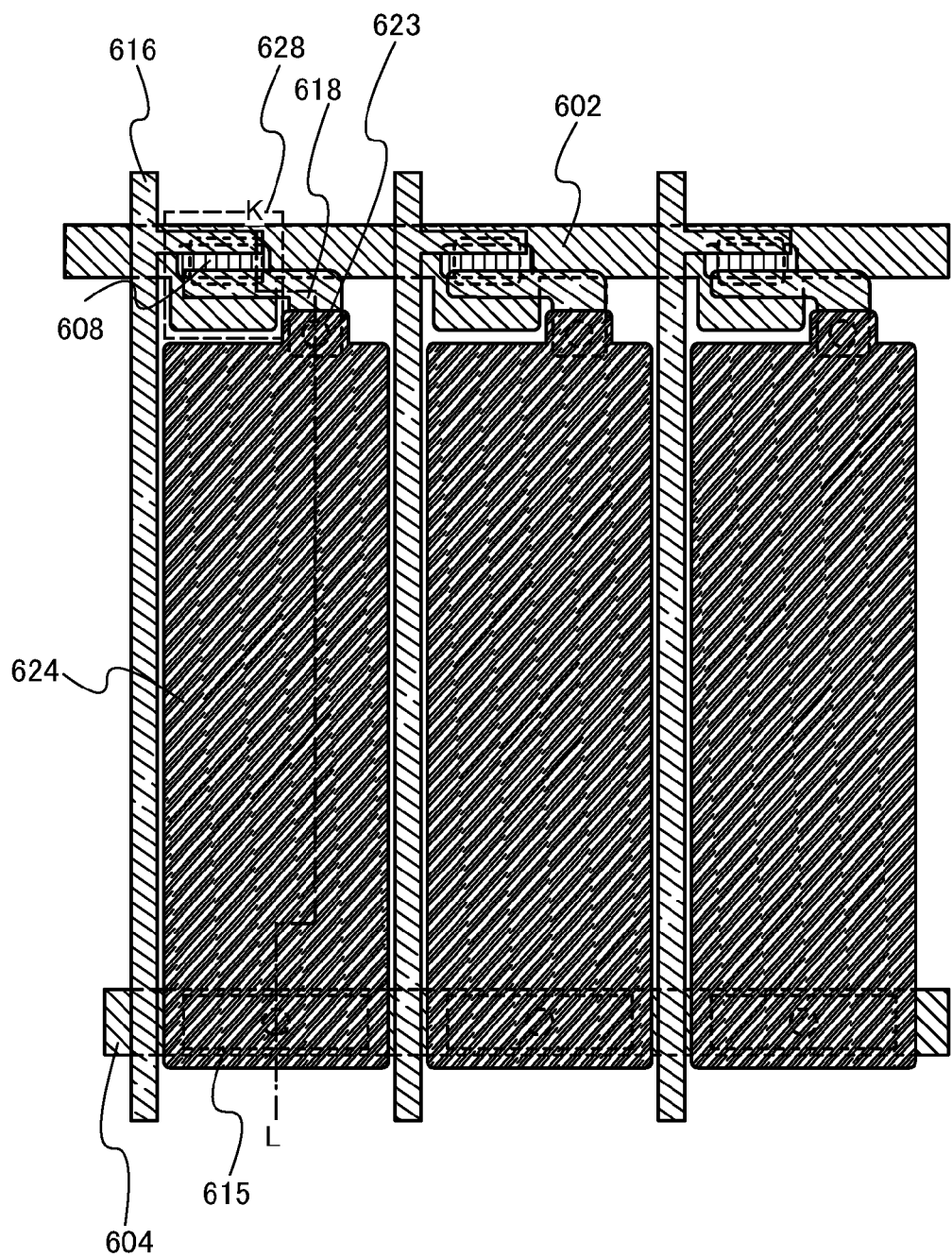
FIG. 37 is a view illustrating a semiconductor device.

FIG. 36 and FIG. 37 illustrate a pixel structure of a liquid crystal display device in a TN mode. FIG. 37 is a plan view. FIG. 36 illustrates a cross-sectional structure taken along section line K-L in FIG. 37. Description below is given with reference to both the drawings.

A pixel electrode layer 624 is connected to a TFT 628 through a wiring 618 through a contact hole 623. A wiring 616 functioning as a data line is connected to the TFT 628. The TFT described in any of Embodiments 1 to 4 can be used as the TFT 628.

The pixel electrode layer 624 is formed using the pixel electrode layer described in Embodiment 1. A capacitor wiring 604 can be formed at the same time as a gate wiring 602 of the TFT 628. A gate insulating film 606 is formed over the gate wiring 602 and the capacitor wiring 604. A storage capacitor is formed with the gate insulating film 606, the capacitor wiring 604, and a capacitor electrode 615. The capacitor electrode 615 and the pixel electrode layer 624 are connected to each other through a contact hole 623.

A counter substrate 601 is provided with a coloring film 636 and a counter electrode layer 640. A planarization film 637 is formed between the coloring film 636 and the counter electrode layer 640 to prevent alignment disorder of liquid crystals. A liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is the reverse of the surface provided with the thin film transistor, and a polarizing plate is attached to a surface of the counter substrate 601, which is the reverse of the surface provided with the counter electrode layer 640.

Through the above-described process, liquid crystal display devices can be manufactured as display devices. The liquid crystal display devices of this embodiment each have a high aperture ratio.

(Embodiment 15)

In this embodiment, an example of a process in which the numbers of steps and photomasks are smaller than those of the process described in Embodiment 1 is illustrated in FIGS. 39A to 39D. FIGS. 39A to 39D are the same as FIGS. 1A1 to 1C, FIGS. 2A to 2E, and FIGS. 3A to 3E except for part of the steps. Thus, the same portions as those in FIGS. 1A1 to 1C, FIGS. 2A to 2E, and FIGS. 3A to 3E are denoted by the same reference numerals and detailed description on the parts is omitted.

First, in accordance with Embodiment 1, a light-transmitting conductive film is formed over a substrate 400 having an insulating surface, and then gate electrode layers 411 and 421 are formed in a first photolithography step.

Then, a first gate insulating layer 402a and a second gate insulating layer 402b are stacked over the gate electrode layers 411 and 421.

Figure 39A:
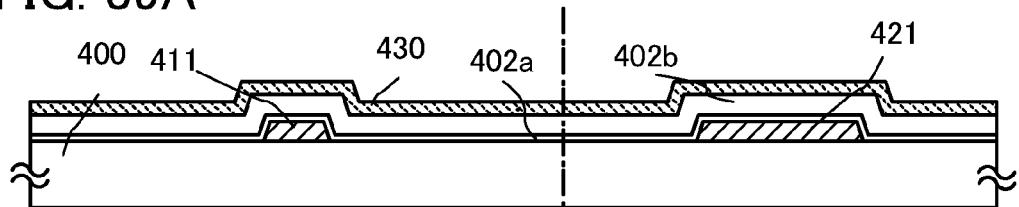
FIGS. 39A to 39D are views illustrating a method for manufacturing a semiconductor device.

Next, an oxide semiconductor film 430 is formed to a thickness of 2 nm to 200 nm inclusive over the second gate insulating layer 402b (see FIG. 39A). Note that FIG. 39A is the same as FIG. 2A.

Then, the oxide semiconductor film 430 is processed into island-shaped oxide semiconductor layers in a second photolithography step.

Figure 39B:
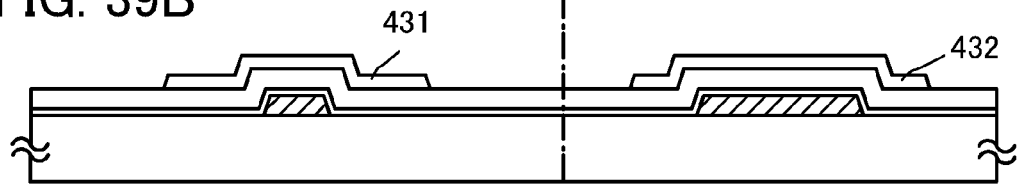

Dehydration or dehydrogenation are performed on the island-shaped oxide semiconductor layers. First heat treatment for the dehydration or dehydrogenation is performed at a temperature higher than or equal to 350° C. and lower than the strain point of the substrate, preferably higher than or equal to 400° C. Here, the substrate is put in an electric furnace that is a kind of heat treatment apparatus and heat treatment is performed on the oxide semiconductor layers in a nitrogen atmosphere, and then water and hydrogen are prevented from being mixed into the oxide semiconductor layer with the oxide semiconductor layer not exposed to the air. Thus, oxide semiconductor layers 431 and 432 are obtained (see FIG. 39B). Note that the steps up to here are the same as those in Embodiment 1 and the step in FIG. 39B is the same as the step in FIG. 2B.

Next, a metal conductive film is formed over the second gate insulating layer 402b and the oxide semiconductor layers 431 and 432. After that, resist masks 445a and 445b are formed in a third photolithography step, and the metal conductive film is selectively etched to form a source electrode layer 415a and a drain electrode layer 415b. When the resist masks 445a and 445b are used, the resist masks 433a and 433b in Embodiment 1 can be omitted.

Figure 39C:
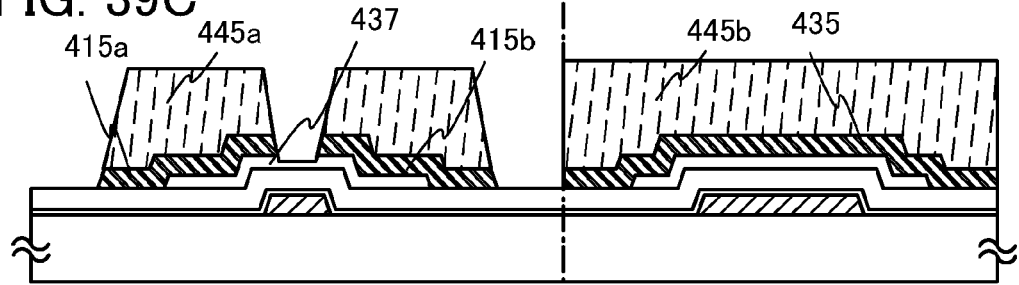

Then, part of the oxide semiconductor layer is thinned with the use of the resist masks 445a and 445b, whereby an oxide semiconductor layer 437 having a groove (a depressed portion) is formed (see FIG. 39C). Note that this etching does not need to be performed in the case where a thin film transistor functions as a switching element without the formation of the groove (the depressed portion) in the oxide semiconductor layer.

Figure 39D:
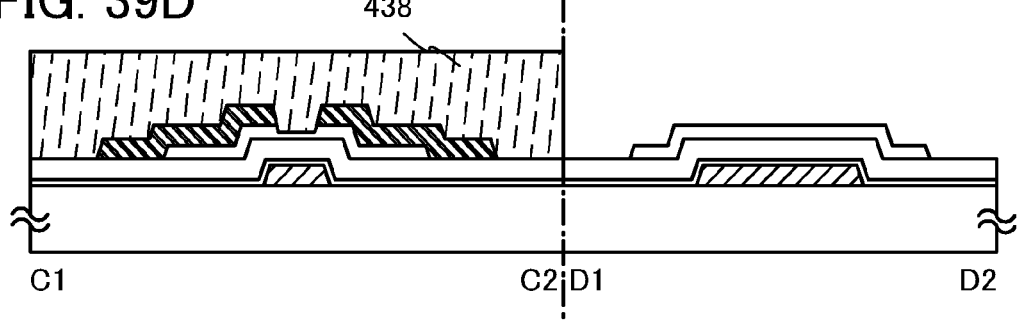

Next, the resist masks 445a and 445b are removed, a resist mask 438 for covering the oxide semiconductor layer 437 is formed in a fourth photolithography step, and a metal electrode layer 435 over the oxide semiconductor layer 432 is removed (see FIG. 39D). The use of an alkaline etchant for selective etching makes it possible to obtain the state illustrated in FIG. 39D. As a material of the metal conductive film, there are an element selected from Al, Cr, Cu, Ta, Ti, Mo, and W, an alloy containing any of these elements as a component, an alloy containing these elements in combination, and the like. In this embodiment, a Ti film is used as the metal conductive film, an In—Ga—Zn—O based oxide semiconductor film is used as the oxide semiconductor layers 431 and 432, and an ammonia hydrogen peroxide solution (a mixture of ammonia, water, and a hydrogen peroxide solution) is used as an etchant.

The thickness of the oxide semiconductor layer is preferably smaller than or equal to 50 nm in order to maintain an amorphous state. In particular, in a channel-etched thin film transistor, the thickness of a region with a small thickness after further etching, that is, the thickness of a channel formation region is 30 nm or smaller, and the thickness of the region with a small thickness in a thin film transistor completed is 5 nm to 20 nm inclusive.

Further, the channel width of the thin film transistor completed is preferably 0.5 µm and 10 µm inclusive.

Subsequently, the steps illustrated in FIGS. 3A to 3E are performed as in Embodiment 1; a thin film transistor 410 and a thin film transistor 420 are formed and a protection insulating layer 403 and a planarization insulating layer 404 are formed, and then a contact hole reaching a drain electrode layer 425b is formed, and a pixel electrode layer 427 and a conductive layer 417 are formed.

Through the above-described steps, with the use of eight masks, the thin film transistor 410 and the thin film transistor 420 can be manufactured separately over one substrate for a pixel circuit and a pixel portion, respectively. Thus, without an increase in the number of steps, a variety of circuits can be formed over one substrate by appropriate allocation of transistors having different structures.

This embodiment can be freely combined with any of the other embodiments.

(Embodiment 16)

Figure 40A:
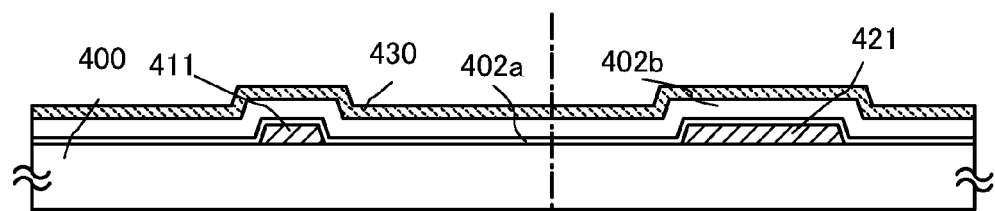
FIGS. 40A to 40C are views illustrating a method for manufacturing a semiconductor device.
Figure 40B:
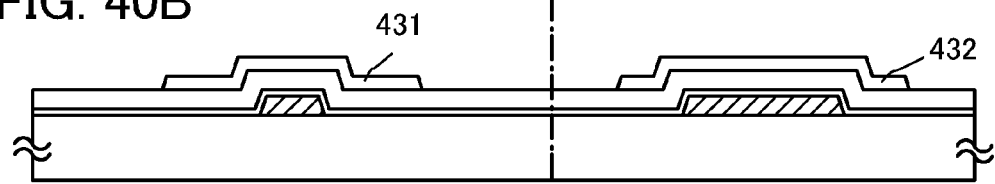
Figure 40C:
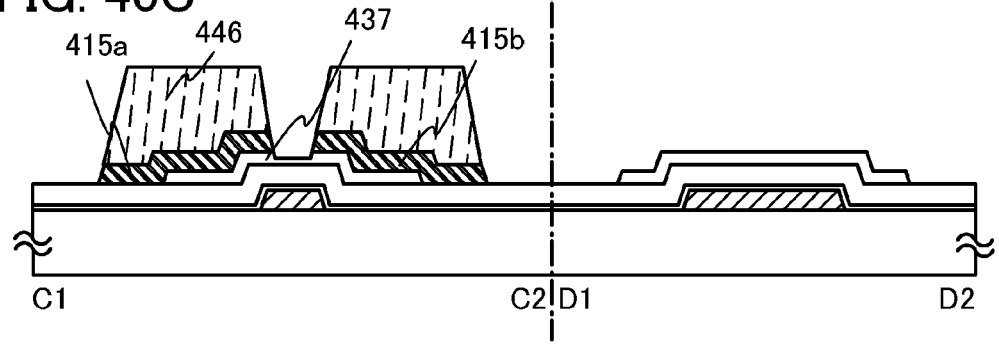

In this embodiment, an example of a process in which the numbers of steps and photomasks are smaller than those of the processes described in Embodiments 1 and 15 is illustrated in FIGS. 40A to 40C. FIGS. 40A to 40C are the same as FIGS. 1A1 to 1C, FIGS. 2A to 2E, and FIGS. 3A to 3E except for part of the steps. Thus, the same portions as those in FIGS. 1A1 to 1C, FIGS. 2A to 2E, and FIGS. 3A to 3E are denoted by the same reference numerals and detailed description on the parts is omitted.

First, in accordance with Embodiment 1, a light-transmitting conductive film is formed over a substrate 400 having an insulating surface, and then gate electrode layers 411 and 421 are formed in a first photolithography step.

Then, a first gate insulating layer 402a and a second gate insulating layer 402b are stacked over the gate electrode layers 411 and 421.

Next, an oxide semiconductor film 430 is formed to a thickness of 2 nm to 200 nm inclusive over the second gate insulating layer 402b (see FIG. 40A). Note that the step in FIG. 40A is the same as the step in FIG. 2A.

Then, the oxide semiconductor film 430 is processed into island-shaped oxide semiconductor layers in a second photolithography step.

Dehydration or dehydrogenation are performed on the island-shaped oxide semiconductor layers. First heat treatment for the dehydration or dehydrogenation is performed at a temperature higher than or equal to 350° C. and lower than the strain point of the substrate, preferably higher than or equal to 400° C. Here, the substrate is put in an electric furnace that is a kind of heat treatment apparatus and heat treatment is performed on the oxide semiconductor layers in a nitrogen atmosphere, and then water and hydrogen are prevented from being mixed into the oxide semiconductor layer with the oxide semiconductor layer not exposed to the air, and oxide semiconductor layers 431 and 432 are obtained (see FIG. 40B). Note that the steps up to here are the same as those in Embodiment 1 and the step in FIG. 40B is the same as the step in FIG. 2B.

Next, a metal conductive film is formed over the second gate insulating layer 402b and the oxide semiconductor layers 431 and 432. After that, resist masks 446a and 446b are formed in a third photolithography step, and the metal conductive film is selectively etched to form a source electrode layer 415a and a drain electrode layer 415b, and the metal oxide film over the oxide semiconductor layer 432 is removed (see FIG. 40C). When the resist masks 45a and 445b are used, the resist masks 433a and 433b in Embodiment 1 can be omitted.

In the case where the etching selectivity ratio of the metal conductive film to the oxide semiconductor layers 431 and 432 is high, the oxide semiconductor layers 431 and 432 can be prevented from being reduced in thickness in an etching step of the metal conductive film.

The use of an alkaline etchant for selective etching makes it possible to obtain the state illustrated in FIG. 40C can be obtained. As a material of the metal conductive film, there are an element selected from Al, Cr, Cu, Ta, Ti, Mo, and W, an alloy containing any of these elements as a component, an alloy containing these elements in combination, and the like. In this embodiment, a Ti film is used as the metal conductive film, an In—Ga—Zn—O based oxide semiconductor film is used as the oxide semiconductor layers 431 and 432, and an ammonia hydrogen peroxide solution (a mixture of ammonia, water, and a hydrogen peroxide solution) as an etchant.

Subsequently, the steps illustrated in FIGS. 3A to 3E are performed as in Embodiment 1; a thin film transistor 410 and a thin film transistor 420 are manufactured and a protection insulating layer 403 and a planarization insulating layer 404 are formed, and then a contact hole reaching a drain electrode layer 425b is formed, and a pixel electrode layer 427 and a conductive layer 417 are formed.

Through the above-described steps, with the use of seven masks, the thin film transistor 410 and the thin film transistor 420 can be manufactured separately over one substrate for a pixel circuit and a pixel portion, respectively. Thus, without an increase in the number of steps, a variety of circuits can be formed over one substrate by appropriate allocation of transistors having different structures.

This embodiment can be freely combined with any of the other embodiments.

(Embodiment 17)

Figure 38:
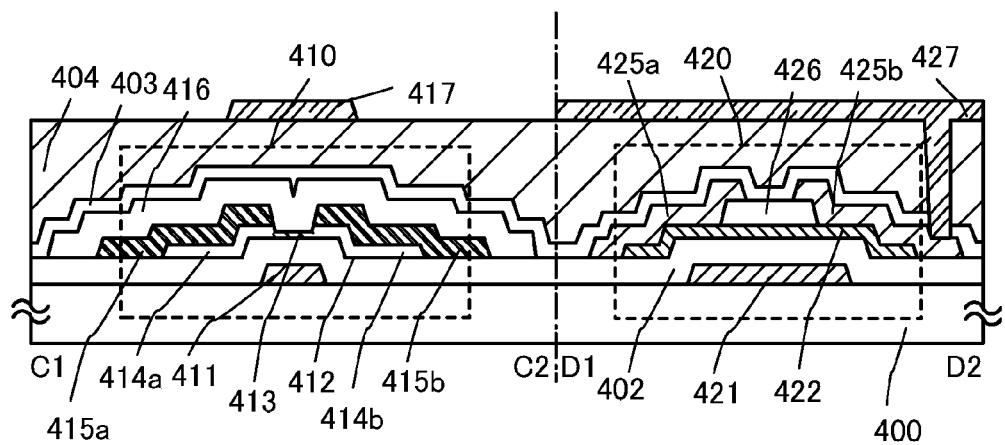
FIG. 38 is a view illustrating a semiconductor device.

In this embodiment, FIG. 38 illustrates an example in which an oxide semiconductor layer is surrounded by nitride insulating films when seen in cross section. FIG. 38 is the same as FIGS. 1A1 to 1C except for the shape of the oxide insulating layer 416 seen from the above, the positions of edge portions of the oxide insulating layer 416, and the structure of the gate insulating layer. Thus, the same portions as those in FIGS. 1A1 to 1C are denoted by the same reference numerals and detailed description on the same portions is omitted.

The thin film transistor 410 in a driver circuit is a channel-etched thin film transistor and includes, over the substrate 400 having an insulating surface, the gate electrode layer 411, a gate insulating layer 402 formed of a nitride insulating film, an oxide semiconductor layer including at least the channel formation region 413, the first high-resistance drain region 414a, and the second high-resistance drain region 414b, the source electrode layer 415a, and the drain electrode layer 415b. In addition, the oxide insulating layer 416 is formed so as to cover the thin film transistor 410 to be in contact with the channel formation region 413.

The oxide insulating layer 416 is processed so that part of the gate insulating layer 402, which is outside the thin film transistor 410, is exposed when an oxide insulating layer 426 functioning as a channel protection layer of a thin film transistor 420 in a pixel portion is formed in a photolithography step. It is preferable that at least the area of the top surface of the oxide insulating layer 416 be larger than that of the top surface of the oxide semiconductor layer and that the oxide insulating layer 416 cover the thin film transistor 410.

Further, the protection insulating layer 403 formed of a nitride insulating film is formed so as to cover the top surface and side surfaces of the oxide insulating layer 416.

The first high-resistance drain region 414a is formed in a self-aligned manner so as to be in contact with the bottom surface of the source electrode layer 415a. The second high-resistance drain region 414b is formed in a self-aligned manner so as to be in contact with the bottom surface of the source electrode layer 415b. The channel formation region 413 is in contact with the oxide insulating layer 416, has a small thickness, and is a region having higher resistance than the first high-resistance drain region 414a and the second high-resistance drain region 414b (an I-type region).

The gate insulating layer 402 formed of a nitride insulating film is formed in contact with the bottom surfaces of the channel formation region 413, the first high-resistance drain region 414a, and the second high-resistance drain region 414b.

For the protection insulating layer 403 formed of a nitride insulating film, an inorganic insulating film which does not contain impurities such as water, an hydrogen ion, an oxygen ion, and OH⁻ and blocks entry of them from the outside is used: for example, a silicon nitride film, a silicon oxynitride film, an aluminum nitride film, or an aluminum oxynitride film which obtained by a sputtering method is used.

In this embodiment, as the protection insulating layer 403 formed of a nitride insulating film, a silicon nitride film with a thickness of 100 nm is provided by an RF sputtering method so as to cover the top surface and side surface of the oxide semiconductor layer 412. In addition, the protection insulating layer 403 is in contact with the gate insulating layer 402 formed of a nitride insulating film.

The structure illustrated in FIG. 38 makes it possible to prevent entry of water from the outside in a manufacturing process after the formation of the protection insulating layer 403 formed of a nitride insulating film. In addition, it is possible to prevent entry of water from the outside in the long term even after a device is completed as a semiconductor device, for example, as a liquid crystal display device; thus, the long-term reliability of the device can be achieved.

Further, similarly to the thin film transistor 410, in the thin film transistor 420, as the protection insulating layer 403 formed of a nitride insulating film, a silicon nitride film with a thickness of 100 nm formed by an RF sputtering method so as to cover the top surface and side surface of the oxide semiconductor layer 422 is used. In addition, the protection insulating layer 403 is in contact with the gate insulating layer 402 formed of a nitride insulating film.

The structure in which one thin film transistor is surrounded by the nitride insulating films is described in this embodiment; however, an embodiment of the present invention is not particularly limited to the structure. A plurality of thin film transistors may be covered with a nitride insulating film or a plurality of thin film transistors in a pixel portion may be collectively covered with a nitride insulating film. A region where the protection insulating layer 403 and the gate insulating layer 402 are in contact with each other may be provided so that at least the pixel portion of an active matrix substrate is surrounded.

This embodiment can be freely combined with any of the other embodiments.

This application is based on Japanese Patent Application serial no. 2009-169594 filed with Japan Patent Office on Jul. 17, 2009, the entire contents of which are hereby incorporated by reference.

Reference Numeral

10: pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 200: substrate, 202a: first gate insulating layer, 202b: second gate insulating layer, 203: protection insulating layer, 204: planarization insulating layer, 210: thin film transistor, 216: oxide insulating layer, 217: conductive layer, 220: thin film transistor, 227: pixel electrode layer, 230: capacitor wiring layer, 231: capacitor electrode, 232: gate wiring, 234: source wiring, 235: terminal electrode, 236: metal wiring layer, 237: metal wiring layer, 238: gate wiring layer, 240: thin film transistor, 241: metal wiring layer, 242: metal wiring layer, 250: capacitor wiring layer, 251: oxide semiconductor layer, 400: substrate, 402: gate insulating layer, 402a: first gate insulating layer, 402b: second gate insulating layer, 403: protection insulating layer, 404: planarization insulating layer, 407: oxide insulating film, 410: thin film transistor, 411: gate electrode layer, 412: oxide semiconductor layer, 413: channel formation region, 414a: high-resistance drain region, 414b: high-resistance drain region, 415a: source electrode layer, 415b: drain electrode layer, 416: oxide insulating layer, 417: conductive layer, 420: thin film transistor, 421: gate electrode layer, 422: oxide semiconductor layer, 423: channel formation region, 424a: high-resistance drain region, 424b: high-resistance drain region, 425a: source electrode layer, 425b: drain electrode layer, 426: oxide insulating layer, 427: pixel electrode layer, 430: oxide semiconductor film, 431: oxide semiconductor layer, 432: oxide semiconductor layer, 433a: resist mask, 433b: resist mask, 434: metal electrode layer, 435: metal electrode layer, 436a: resist mask, 436b: resist mask, 437: oxide semiconductor layer, 438: resist mask, 439: oxide insulating film, 440a: resist mask, 440b: resist mask, 441:

contact hole, 442: oxide semiconductor layer, 443: oxide semiconductor layer, 444: oxide semiconductor layer, 445*a*: resist mask, 445*b*: resist mask, 446*a*: resist mask, 446*b*: resist mask, 448: thin film transistor, 449: thin film transistor, 475*a*: source electrode layer, 475*b*: drain electrode layer, 476: oxide insulating layer, 580: substrate, 581: thin film transistor, 583: insulating film, 585: insulating layer, 587: first electrode layer, 588: second electrode layer, 589: spherical particle, 590*a*: black region, 590*b*: white region, 594: cavity, 595: filler, 596: substrate, 600: substrate, 601: counter substrate, 602: gate wiring, 603: gate wiring, 604: capacitor wiring, 605: capacitor wiring, 606: gate insulating film, 607: electrode layer, 608: channel protection layer, 609: common potential line, 611: channel protection layer, 615: capacitor electrode, 616: wiring, 617: capacitor wiring, 618: wiring, 619: wiring, 620: insulating film, 622: insulating film, 623: contact hole, 624: pixel electrode layer, 625: slit, 626: pixel electrode layer, 627: contact hole, 628: TFT, 629: TFT, 630: storage capacitor portion, 631: storage capacitor portion, 632: light-blocking film, 633: contact hole, 636: coloring film, 637: planarization film, 640: counter electrode layer, 641: slit, 644: protrusion, 646: alignment film, 648: alignment film, 650: liquid crystal layer, 651: liquid crystal element, 652: liquid crystal element, 690: capacitor wiring, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflection plate, 2612: circuit substrate, 2613: diffusion plate, 2700: electronic book, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4035: spacer, 4040: conductive layer, 4041: insulating layer, 4042: insulating layer, 4501: substrate, 4502: pixel portion, 4503*a*: signal line driver circuit, 4503*b*: signal line driver circuit, 4504*a*: scan line driver circuit, 4504*b*: scan line driver circuit, 4505: sealant, 4506: substrate, 4507: filler, 4509: thin film transistor, 4510: thin film transistor, 4511: light-emitting element, 4512: electroluminescent layer, 4513: second electrode layer, 4515: connection terminal electrode, 4516: terminal electrode, 4517: first electrode layer, 4518*a*: FPC, 4518*b*: FPC, 4519: anisotropic conductive film, 4520: partition, 4540: conductive layer, 4541: insulating layer, 4542: insulating layer, 4543: insulating layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: driving transistor, 6403: capacitor, 6404: light-emitting element, 6405: signal line, 6406: scan line, 6407: power supply line, 6408: common electrode, 7001: driving TFT, 7002: light-emitting element, 7003: cathode, 7004: light-emitting layer, 7005: anode, 7008: cathode, 7009: partition, 7011: driving TFT, 7012: light-emitting element, 7013: cathode, 7014: light-emitting layer, 7015: anode, 7016: light-blocking film, 7017: conductive film, 7018: conductive film, 7019: partition, 7021: driving TFT, 7022: light-emitting element, 7023: cathode, 7024: light-emitting layer, 7025: anode, 7027: conductive film, 7028: conductive film, 7029: partition, 9201: display portion, 9202: display button, 9203: operation switch, 9204: band portion, 9205: adjusting portion, 9206: camera portion, 9207: speaker, 9208: microphone, 9301: top housing, 9302: bottom housing, 9302: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: joint portion, 9900: slot machine, 9901: housing, and 9903: display portion.

The invention claimed is:

1. A semiconductor device comprising:

a pixel portion formed over a substrate, the pixel portion including a first transistor; and a driver circuit portion formed over the substrate, the driver circuit portion including a second transistor, wherein the first transistor includes:

a first gate electrode layer over the substrate;

a gate insulating layer over the first gate electrode layer;

a first oxide semiconductor layer over the gate insulating layer;

a first oxide insulating layer over the first gate electrode layer and the first oxide semiconductor layer, and in contact with a part of the first oxide semiconductor layer;

a first source electrode layer and a first drain electrode layer over the first oxide insulating layer and the first oxide semiconductor layer; and a pixel electrode layer over the first oxide insulating layer, wherein the second transistor includes:

a second gate electrode layer over the substrate;

the gate insulating layer over the second gate electrode layer;

a second oxide semiconductor layer over the gate insulating layer;

a second source electrode layer and a second drain electrode layer over the second oxide semiconductor layer; and a second oxide insulating layer over the second oxide semiconductor layer, the second source electrode layer, and the second drain electrode layer, the second oxide insulating layer being in contact with the oxide semiconductor layer, wherein each of the first gate electrode layer, the gate insulating layer, the first oxide semiconductor layer, the first source electrode layer, the first drain electrode layer, the first oxide insulating layer, and the pixel electrode layer has light-transmitting properties, wherein a material of the second source electrode layer and the second drain electrode layer is different from a material of the first source electrode layer and the first drain electrode layer, and wherein the material of the second source electrode layer and the second drain electrode layer is a conductive material having lower resistance than the material of the first source electrode layer and the first drain electrode layer.

2. The semiconductor device according to claim 1, wherein the second oxide semiconductor layer includes a region having a smaller thickness than a region overlapping with the second source electrode layer or the second drain electrode layer.

3. The semiconductor device according to claim 2, wherein the second oxide semiconductor layer has a channel formation region which is thinner than a region overlapping with the second source electrode layer or the second drain electrode layer.

4. The semiconductor device according to claim 3, further comprising:
a conductive layer over the channel formation region with the second oxide insulating layer therebetween.

5. The semiconductor device according to claim 1, wherein the first oxide insulating layer and the second oxide insulating layer are formed using the same insulating material having light-transmitting properties.

6. The semiconductor device according to claim 1, wherein the second source electrode layer and the second drain electrode layer comprises a metal film containing an element selected from the group consisting of Al, Cr, Cu, Ta, Ti, Mo, and W.

7. The semiconductor device according claim 1, wherein the first source electrode layer, the first drain electrode layer, and the pixel electrode layer are formed using any of indium oxide, an alloy of indium oxide and tin oxide, an alloy of indium oxide and zinc oxide, or zinc oxide.

8. The semiconductor device according to claim 1, wherein the second oxide semiconductor layer includes a high-resistance drain region overlapping with the second source electrode layer or the second drain electrode layer.

9. The semiconductor device according to claim 1, further comprising:
a capacitor portion in the pixel portion in the pixel portion, wherein the capacitor portion includes a capacitor wiring and a capacitor electrode overlapping with the capacitor wiring, and
wherein each of the capacitor wiring and the capacitor electrode has light-transmitting properties.

10. The semiconductor device according to claim 9, wherein a material of the capacitor wiring is the same as a material of the first gate electrode layer, and
wherein a material of the capacitor electrode is the same as the material of the first source electrode layer and the first drain electrode layer.

11. A semiconductor device comprising:
a pixel portion formed over a substrate, the pixel portion including a first transistor; and
a driver circuit portion formed over the substrate, the driver circuit portion including a second transistor,
wherein the first transistor includes:
a first gate electrode layer over the substrate;
a gate insulating layer over the first gate electrode layer;
a first oxide semiconductor layer over the gate insulating layer;
a first oxide insulating layer over the first gate electrode layer and the first oxide semiconductor layer, and in contact with a part of the first oxide semiconductor layer;
a first source electrode layer and a first drain electrode layer over the first oxide insulating layer and the first oxide semiconductor layer; and
a pixel electrode layer over the first oxide insulating layer,
wherein the second transistor includes:
a second gate electrode layer over the substrate;
the gate insulating layer over the second gate electrode layer;
a second oxide semiconductor layer over the gate insulating layer;
a second source electrode layer and a second drain electrode layer over the second oxide semiconductor layer; and
a second oxide insulating layer over the second oxide semiconductor layer, the second source electrode layer, and the second drain electrode layer, the second oxide insulating layer being in contact with the oxide semiconductor layer,
wherein each of the first gate electrode layer, the gate insulating layer, the first oxide semiconductor layer, the first source electrode layer, the first drain electrode layer, the first oxide insulating layer, and the pixel electrode layer has light-transmitting properties,
wherein a material of the second source electrode layer and the second drain electrode layer is different from a material of the first source electrode layer and the first drain electrode layer,
wherein the material of the second source electrode layer and the second drain electrode layer is a conductive material having lower resistance than the material of the first source electrode layer and the first drain electrode layer, and
wherein the second gate electrode layer comprises a first metal wiring layer.

12. The semiconductor device according to claim 11, further comprising:
a second metal wiring layer over and in contact with the first metal wiring layer.

13. The semiconductor device according to claim 12, wherein a material of the second metal wiring layer is a metal nitride.

14. The semiconductor device according to claim 11, wherein the second oxide semiconductor layer includes a region having a smaller thickness than a region overlapping with the second source electrode layer or the second drain electrode layer.

15. The semiconductor device according to claim 14, wherein the second oxide semiconductor layer has a channel formation region which is thinner than a region overlapping with the second source electrode layer or the second drain electrode layer.

16. The semiconductor device according to claim 15, further comprising:
a conductive layer over the channel formation region with the second oxide insulating layer therebetween.

17. The semiconductor device according to claim 11, wherein the first oxide insulating layer and the second oxide insulating layer are formed using the same insulating material having light-transmitting properties.

18. The semiconductor device according to claim 11, wherein the second source electrode layer and the second drain electrode layer comprises a metal film containing an element selected from the group consisting of Al, Cr, Cu, Ta, Ti, Mo, and W.

19. The semiconductor device according claim 11, wherein the first source electrode layer, the first drain electrode layer, and the pixel electrode layer are formed using any of indium oxide, an alloy of indium oxide and tin oxide, an alloy of indium oxide and zinc oxide, or zinc oxide.

20. The semiconductor device according to claim 11, wherein the second oxide semiconductor layer includes a high-resistance drain region overlapping with the second source electrode layer or the second drain electrode layer.

21. The semiconductor device according to claim 11, further comprising:
a capacitor portion in the pixel portion in the pixel portion,
wherein the capacitor portion includes a capacitor wiring and a capacitor electrode overlapping with the capacitor wiring, and
wherein each of the capacitor wiring and the capacitor electrode has light-transmitting properties.

22. The semiconductor device according to claim 21,
wherein a material of the capacitor wiring is the same as a material of the first gate electrode layer, and
wherein a material of the capacitor electrode is the same as the material of the first source electrode layer and the first drain electrode layer.

23. A method for manufacturing a semiconductor device, comprising the steps of:
forming a first gate electrode layer and a second gate electrode layer in a pixel portion and a driver circuit portion, respectively, which are located over a substrate,
forming a gate insulating layer over the first gate electrode layer and the second gate electrode layer;
forming a first oxide semiconductor layer to overlap with the first gate electrode layer, and a second oxide semiconductor layer to overlap with the second gate electrode layer over the gate insulating layer;
performing dehydration or dehydrogenation on the first oxide semiconductor layer and the second oxide semiconductor layer by heating in a gas selected from the group consisting of a nitrogen gas and a inert gas;
cooling the first oxide semiconductor layer and the second oxide semiconductor layer with the first oxide semiconductor and the second oxide semiconductor layer not exposed to the air;
forming a second source electrode layer and a second drain electrode layer over the second oxide semiconductor layer;
forming a second oxide insulating layer to be in contact with a part of the second oxide semiconductor layer, and a first oxide insulating layer in a region where the first oxide semiconductor layer overlaps with the first gate electrode layer;
forming a first source electrode layer and a first drain electrode layer over the first oxide semiconductor layer and the first oxide insulating layer; and
forming a protection insulating layer over the first oxide insulating layer, the first source electrode layer, the first drain electrode layer, and the second oxide insulating layer;
forming a pixel electrode layer to be electrically connected to the first drain electrode layer or the first source electrode layer,
wherein each of the first gate electrode layer, the gate insulating layer, the first oxide semiconductor layer, the first source electrode layer, the first drain electrode layer, the first oxide insulating layer, and the pixel electrode layer has light-transmitting properties,
wherein a material of the second source electrode layer and the second drain electrode layer is different from a material of the first source electrode layer and the first drain electrode layer, and
wherein the material of the second source electrode layer and the second drain electrode layer is a conductive material having lower resistance than the material of the first source electrode layer and the first drain electrode layer.

24. The method for manufacturing a semiconductor device according to claim 23, wherein the second oxide semiconductor layer includes a region having a smaller thickness than a region overlapping with the second source electrode layer or the second drain electrode layer.

25. The method for manufacturing a semiconductor device according to claim 24, wherein the second oxide semiconductor layer has a channel formation region which is thinner than a region overlapping with the second source electrode layer or the second drain electrode layer.

26. The method for manufacturing a semiconductor device according to claim 23, further comprising a step of forming a conductive layer over the channel formation region with the second oxide insulating layer therebetween.

27. The method for manufacturing a semiconductor device according to claim 23, wherein the first oxide insulating layer and the second oxide insulating layer are formed using the same insulating material having light-transmitting properties.

28. The method for manufacturing a semiconductor device according to claim 23, wherein the second source electrode layer and the second drain electrode layer are formed of a film containing an element selected from the group consisting of Al, Cr, Cu, Ta, Ti, Mo, and W.

29. The method for manufacturing a semiconductor device according to claim 23, wherein the first source electrode layer, the first drain electrode layer, and the pixel electrode layer are any of indium oxide, an alloy of indium oxide and tin oxide, an alloy of indium oxide and zinc oxide, or zinc oxide.

30. The method for manufacturing a semiconductor device according to claim 23, wherein the second oxide semiconductor layer includes a high-resistance drain region overlapping with the second source electrode layer or the second drain electrode layer.

31. The method for manufacturing a semiconductor device according to claim 23, further comprising the steps of:
forming a capacitor portion in the pixel portion in the pixel portion,
wherein the capacitor portion includes a capacitor wiring and a capacitor electrode overlapping with the capacitor wiring, and
wherein each of the capacitor wiring and the capacitor electrode has light-transmitting properties.

32. The method for manufacturing a semiconductor device according to claim 31,
wherein a material of the capacitor wiring is the same as a material of the first gate electrode layer, and
wherein a material of the capacitor electrode is the same as the material of the first source electrode layer and the first drain electrode layer.

33. A method for manufacturing a semiconductor device, comprising the steps of:
forming a first gate electrode layer and a second gate electrode layer in a pixel portion and a driver circuit portion, respectively, which are located over a substrate,
forming a gate insulating layer over the first gate electrode layer and the second gate electrode layer;
forming a first oxide semiconductor layer to overlap with the first gate electrode layer, and a second oxide semiconductor layer to overlap with the second gate electrode layer over the gate insulating layer;
performing dehydration or dehydrogenation on the first oxide semiconductor layer and the second oxide semiconductor layer by heating in a gas selected from the group consisting of a nitrogen gas and a inert gas;

cooling the first oxide semiconductor layer and the second oxide semiconductor layer with the first oxide semiconductor and the second oxide semiconductor layer not exposed to the air;

forming a second source electrode layer and a second drain electrode layer over the second oxide semiconductor layer;

forming a second oxide insulating layer to be in contact with a part of the second oxide semiconductor layer, and a first oxide insulating layer in a region where the first oxide semiconductor layer overlaps with the first gate electrode layer;

forming a first source electrode layer and a first drain electrode layer over the first oxide semiconductor layer and the first oxide insulating layer; and forming a protection insulating layer over the first oxide insulating layer, the first source electrode layer, the first drain electrode layer, and the second oxide insulating layer;

forming a pixel electrode layer to be electrically connected to the first drain electrode layer or the first source electrode layer, wherein each of the first gate electrode layer, the gate insulating layer, the first oxide semiconductor layer, the first source electrode layer, the first drain electrode layer, the first oxide insulating layer, and the pixel electrode layer has light-transmitting properties, wherein a material of the second source electrode layer and the second drain electrode layer is different from a material of the first source electrode layer and the first drain electrode layer, wherein the material of the second source electrode layer and the second drain electrode layer is a conductive material having lower resistance than the material of the first source electrode layer and the first drain electrode layer, and wherein the second gate electrode layer comprises a first metal wiring layer.

34. The semiconductor device according to claim 33, further comprising a step of forming a second metal wiring layer over and in contact with the first metal wiring layer.

35. The semiconductor device according to claim 34, wherein a material of the second metal wiring layer is a metal nitride.

36. The semiconductor device according to claim 33, wherein the second oxide semiconductor layer includes a region having a smaller thickness than a region overlapping with the second source electrode layer or the second drain electrode layer.

37. The semiconductor device according to claim 36, wherein the second oxide semiconductor layer has a channel formation region which is thinner than a region overlapping with the second source electrode layer or the second drain electrode layer.

38. The semiconductor device according to claim 37, further comprising a step of forming a conductive layer over the channel formation region with the second oxide insulating layer therebetween.

39. The semiconductor device according to claim 33, wherein the first oxide insulating layer and the second oxide insulating layer are formed using the same insulating material having light-transmitting properties.

40. The semiconductor device according to claim 33, wherein the second source electrode layer and the second drain electrode layer comprises a metal film containing an element selected from the group consisting of Al, Cr, Cu, Ta, Ti, Mo, and W.

41. The semiconductor device according claim 33, wherein the first source electrode layer, the first drain electrode layer, and the pixel electrode layer are formed using any of indium oxide, an alloy of indium oxide and tin oxide, an alloy of indium oxide and zinc oxide, or zinc oxide.

42. The semiconductor device according to claim 33, wherein the second oxide semiconductor layer includes a high-resistance drain region overlapping with the second source electrode layer or the second drain electrode layer.

43. The semiconductor device according to claim 33, further comprising the steps of:

forming a capacitor portion in the pixel portion in the pixel portion, wherein the capacitor portion includes a capacitor wiring and a capacitor electrode overlapping with the capacitor wiring, and wherein each of the capacitor wiring and the capacitor electrode has light-transmitting properties.

44. The semiconductor device according to claim 43, wherein a material of the capacitor wiring is the same as a material of the first gate electrode layer, and wherein a material of the capacitor electrode is the same as the material of the first source electrode layer and the first drain electrode layer.

* * * * *